(12) United States Patent
Imanaka et al.

(10) Patent No.: US 7,579,251 B2
(45) Date of Patent: Aug. 25, 2009

(54) AEROSOL DEPOSITION PROCESS

(75) Inventors: Yoshihiko Imanaka, Kawasaki (JP); Jun Akedo, Tsukuba (JP); Maxim Lebedev, Tsukuba (JP)

(73) Assignees: Fujitsu Limited, Kawasaki (JP); National Institute of Advanced Industrial Science And Technology, Tokyo (JP)

( * ) Notice: Subject to any disclaimer, the term of this patent is extended or adjusted under 35 U.S.C. 154(b) by 69 days.

(21) Appl. No.: 10/820,114

(22) Filed: Apr. 8, 2004

(65) Prior Publication Data

US 2004/0227227 A1 Nov. 18, 2004

(30) Foreign Application Priority Data

| May 15, 2003 | (JP) | .............................. | 2003-137398 |
| May 15, 2003 | (JP) | .............................. | 2003-137399 |
| Jun. 16, 2003 | (JP) | .............................. | 2003-170475 |

(51) Int. Cl.
*H01L 21/8222* (2006.01)
(52) U.S. Cl. ................. 438/329; 438/330; 257/E21.004
(58) Field of Classification Search ................. 438/329, 438/629; 257/E21.004
See application file for complete search history.

(56) References Cited

U.S. PATENT DOCUMENTS

| 5,759,923 | A | * | 6/1998 | McMillan et al. | ............ | 438/788 |
| 5,880,018 | A | * | 3/1999 | Boeck et al. | ................ | 438/619 |
| 6,504,227 | B1 | * | 1/2003 | Matsuo et al. | ............... | 257/531 |
| 6,717,218 | B2 | * | 4/2004 | Hasegawa et al. | ........... | 257/350 |
| 6,827,634 | B2 | | 12/2004 | Akedo | | |
| 7,153,567 | B1 | | 12/2006 | Akedo et al. | | |
| 7,175,921 | B2 | * | 2/2007 | Hatono et al. | ................ | 428/689 |
| 7,255,934 | B2 | | 8/2007 | Hatono et al. | | |
| 2001/0030122 | A1 | * | 10/2001 | Hara et al. | ............. | 204/192.14 |
| 2002/0056946 | A1 | * | 5/2002 | Sugimoto et al. | ........... | 264/434 |
| 2003/0048314 | A1 | * | 3/2003 | Renn | .............................. | 347/6 |
| 2006/0099336 | A1 | | 5/2006 | Hatono et al. | | |
| 2006/0201419 | A1 | | 9/2006 | Akedo et al. | | |
| 2006/0222862 | A1 | | 10/2006 | Akedo et al. | | |

FOREIGN PATENT DOCUMENTS

| JP | 59-080361 | A | 5/1984 |
| JP | 60-184686 | A | 9/1985 |
| JP | 01-272185 | | 10/1989 |
| JP | 3-272198 | A | 12/1991 |
| JP | 04-188503 | A | 7/1992 |
| JP | 5048235 | A | 2/1993 |
| JP | 6-291380 | A | 10/1994 |

(Continued)

OTHER PUBLICATIONS

Japanese Office Action dated Jan. 29, 2008 (mailing date), issued in corresponding Japanese Patent Application No. 2003-170475.

(Continued)

*Primary Examiner*—Trung Dang
(74) *Attorney, Agent, or Firm*—Westerman, Hattori, Daniels & Adrian, LLP.

(57) ABSTRACT

A circuit substrate includes a passive element and an interconnection pattern, wherein any of the passive element and the interconnection pattern is formed by an aerosol deposition process that uses aerosol of a fine particle material.

11 Claims, 34 Drawing Sheets

FOREIGN PATENT DOCUMENTS

| | | |
|---|---|---|
| JP | 08-046331 | 2/1996 |
| JP | 8279669 A | 10/1996 |
| JP | 11-329803 | 11/1999 |
| JP | 2000-305303 A | 11/2000 |
| JP | 2000-323845 | 11/2000 |
| JP | 2000-328223 | 11/2000 |
| JP | 2001-38274 A | 2/2001 |
| JP | 2001-156351 | 6/2001 |
| JP | 2001-181859 A | 7/2001 |
| JP | 2001-250885 | 9/2001 |
| WO | WO 02/34966 A1 | 5/2002 |

OTHER PUBLICATIONS

Japanese Office Action dated Aug. 7, 2007 (mailing date), issued in corresponding Japanese Patent Application No. 2003-137399.

Japanese Office Action issued in JP 2003-170475, mailed May 13, 2008.

Japanese Office Action dated Oct. 7, 2008 (mailing date), issued in corresponding Japanese Patent Application No. 2003-137398.

Japanese Office Action dated May 12, 2009, issued in corresponding Japanese Patent Application No. 2003-137398.

* cited by examiner

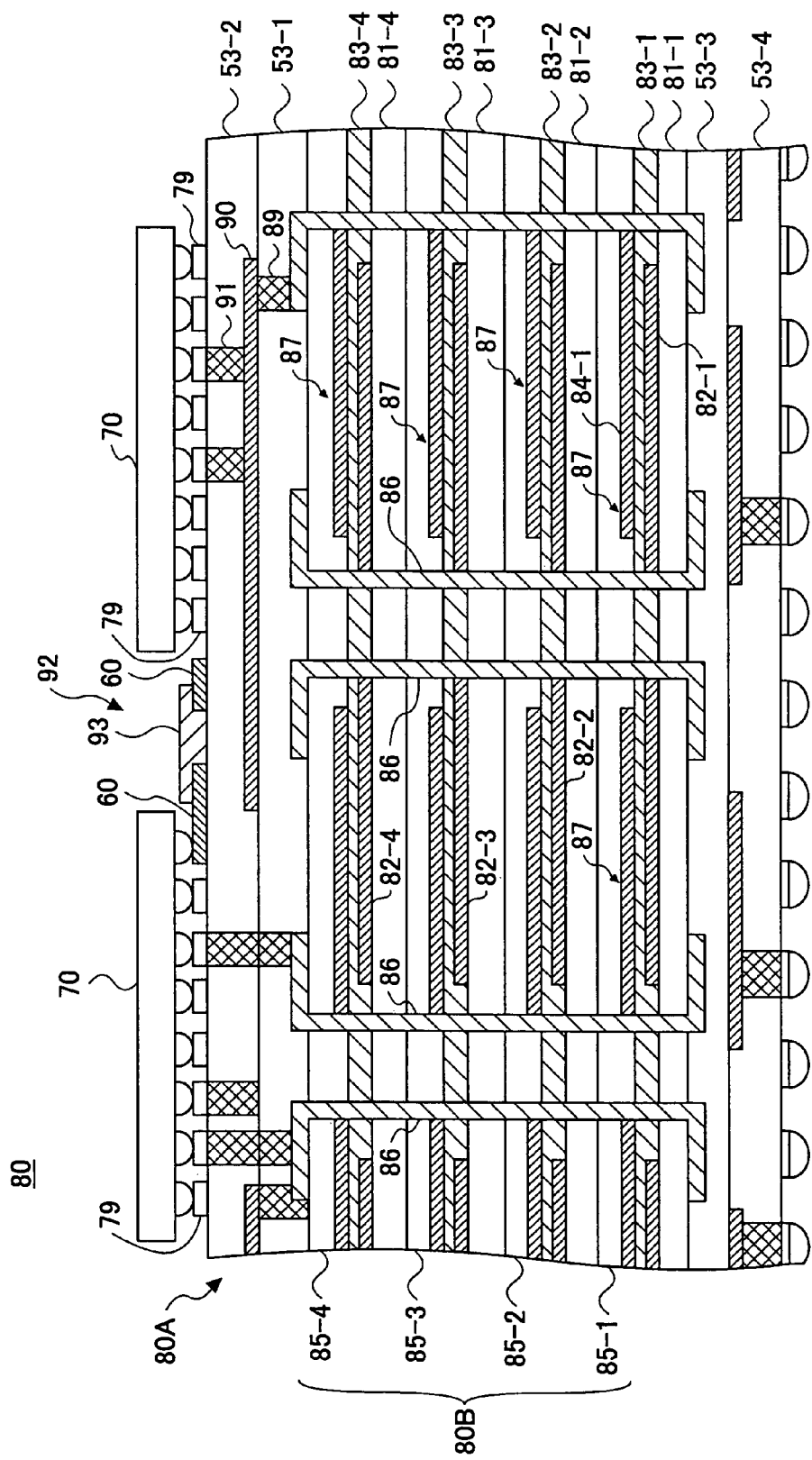

FIG.16

| EXAMPLE | SUBSTRATE | INSULATOR | DIELECTRIC FINE PARTICLE | ALUMINA COAT | Ave. DIAMETER (μm) | THICKNESS (μm) | K (1GHz) | CAP. DENSITY (nF/cm2) |
|---|---|---|---|---|---|---|---|---|
| 1 | FR-4 | EPOXY | TiO2 | YES | 0.3 | 10 | 100 | 80 |
| 2 | FR-4 | EPOXY | BaTiO3 | YES | 0.1 | 10 | 1500 | 1300 |
| 3 | FR-4 | EPOXY | Al2O3 | NO | 0.2 | 10 | 10 | 24 |
| 4 | FR-4 | EPOXY | TiO2 | NO | 0.3 | 10 | 80 | 65 |
| 5 | FR-4 | EPOXY | BaTiO3 | YES | 0.3 | 10 | 1500 | 2600 |
| 6 | POLYIMIDE | POLYIMIDE | BaSrTiO3 | YES | 0.1 | 10 | 2000 | 1800 |
| 7 | POLYIMIDE | POLYIMIDE | Ba2Ti9O20 | YES | 0.3 | 10 | 20 | 35 |
| 8 | Si | POLYIMIDE | Ba2Ti4O9 | YES | 0.1 | 10 | 25 | 40 |
| 9 | Si | POLYIMIDE | BaSrTiO3 | YES | 0.1 | 10 | 1500 | 1300 |
| 10 | Si | POLYIMIDE | BaSrTiO3 & PbZrTiO3 MIX | NO | 0.1 | 10 | 3000 | 5300 |
| 11 | RESIN CASE | EPOXY | | YES | 0.3 | 10 | 80 | 50 |
| COMP1 | FR-4 | POLYIMIDE | BaSrTiO3 SPUTTER | — | — | 5 | 10 | 8 |
| COMP2 | FR-4 | EPOXY | BaTiO3 & EPOXY MIX | — | 0.1 | 100 | 30 | 0.3 |

FIG.17

| EXAMPLE | RESISTANCE FINE PARTICLE | Ave. DIAMETER ($\mu$m) | THICKNESS | $\rho$ ($\mu\Omega\cdot$cm) |
|---|---|---|---|---|
| 1 | RuO$_2$ | 0.01 | 10 | 16 |
| 6 | SrRuO$_3$ | 0.01 | 10 | 20 |
| 8 | BiRuO$_3$ | 0.01 | 10 | 30 |
| 11 | Ta$_2$O$_5$ | 0.01 | 10 | 80 |
| 12-1 | NiCr | 0.01 | 10 | 100 |
| 12-2 | TaN | 0.01 | 10 | 200 |
| 12-3 | Ru | 0.01 | 10 | 10 |
| 12-4 | Ir | 0.01 | 10 | 8 |
| 12-5 | IrO$_2$ | 0.01 | 10 | 20 |

FIG.18

| EXAMPLE | PASSIVE COMP ON SUBSTRATE | SUBSTRATE AREA |
|---|---|---|
| 1 | 5 | 0.6 |
| 5 | 4 | 0.4 |
| 6 | 5 | 0.5 |
| 8 | 3 | 0.4 |
| 11 | 10 | 0.4 |
| COMP1 | 15 | 0.8 |
| COMP2 | 20 | 1 |

FIG.21

| | FINE PARTICLE MATERIAL | | | | BINDER | | THICKNESS (μm) | SUBSTRATE | ADHERENCE (kg/mm2) | WATER ABSORPTION (%) |
|---|---|---|---|---|---|---|---|---|---|---|
| | MATERIAL | Ave. DIAMETER (μm) | MANUFACTURER | PRODUCT NAME | COATING (MASS %) | BAKING | | | | |
| EXAMPLE 13-1 | TiO2 | 0.25 | TAYCA | JR | 5 | YES | 100 | GLASS | ≧5.0 | ≦0.1 |
| EXAMPLE 13-2 | MgO | 0.5 | KOJUNDO | — | 5 | YES | 100 | GLASS | ≧5.0 | ≦0.1 |
| EXAMPLE 13-3 | SiO2 | 0.4 | KOJUNDO | — | 5 | YES | 100 | GLASS | ≧5.0 | ≦0.1 |
| EXAMPLE 13-4 | AlN | 0.5 | TOKUYAMA | GRADE F | 5 | YES | 100 | GLASS | ≧5.0 | ≦0.1 |
| EXAMPLE 13-5 | PLZT | 0.6 | KOJUNDO | — | 5 | YES | 100 | GLASS | ≧5.0 | ≦0.1 |
| EXAMPLE 13-6 | BaTiO3 | 0.20 | SAKAI | BT | 5 | YES | 60 | FR-4 | ≧4.0 | ≦0.1 |
| EXAMPLE 13-7 | RuO2 | 0.05 | KOJUNDO | — | 5 | YES | 60 | FR-4 | ≧4.0 | ≦0.1 |
| EXAMPLE 13-8 | IrO2 | 0.1 | KOJUNDO | — | 5 | YES | 60 | FR-4 | ≧4.0 | ≦0.1 |
| EXAMPLE 13-9 | Cu | 0.8 | KOJUNDO | — | 5 | YES | 60 | FR-4 | ≧4.0 | ≦0.1 |
| EXAMPLE 13-10 | W | 0.6 | KOJUNDO | — | 5 | YES | 60 | FR-4 | ≧4.0 | ≦0.1 |
| EXAMPLE 13-11 | Al | 0.8 | KOJUNDO | — | 5 | YES | 60 | FR-4 | ≧4.0 | ≦0.1 |
| EXAMPLE 13-12 | TiC | 0.5 | KOJUNDO | — | 5 | YES | 60 | FR-4 | ≧4.0 | ≦0.1 |
| EXAMPLE 13-13 | TiO2 | 0.10 | TAYCA | — | 5 | YES | 60 | FR-4 | ≧4.0 | ≦0.1 |
| EXAMPLE 13-14 | TiO2 | 0.05 | TAYCA | — | 5 | YES | 60 | FR-4 | ≧4.0 | ≦0.1 |
| EXAMPLE 13-15 | TiO2 | 0.25 | TAYCA | — | 0.10 | YES | 60 | FR-4 | ≧4.0 | ≦0.1 |
| COMPARATIVE 1 | TiO2 | 0.08 | TAYCA | — | 0.08 | YES | 30 | FR-4 | ≦1.5 | ≧3 |
| EXAMPLE 13-16 | TiO2 | 0.25 | TAYCA | — | 5 | NO | 100 | GLASS | ≧5.0 | ≦0.1 |
| EXAMPLE 13-17 | TiO2 | 0.35 | TAYCA | JR600A | 2 | — | 100 | GLASS | ≧5.0 | ≦0.1 |

FIG.22

| | FINE PARTICLE MATERIAL | | MANUFACTURER | PRODUCT NAME | THICKNESS (μm) | SUBSTRATE | ADHERENCE (kg/mm2) | WATER ABSORPTION (%) |
|---|---|---|---|---|---|---|---|---|
| | MATERIAL | Ave. DIAMETER (μm) | | | | | | |
| EXAMPLE 14-1 | $TiO_2$ | 0.25 | TAYCA | JR | 40 | FR-4 | ≧4.0 | ≦0.1 |
| EXAMPLE 14-2 | $Ba(Mg_{1/3}Ta_{2/3})TiO_3$ | 0.20 | KOJUNDO | — | 60 | GLASS | ≧4.0 | ≦0.1 |
| EXAMPLE 14-3 | $RuO_2$ | 0.05 | KOJUNDO | — | 5 | FR-4 | ≧4.0 | ≦0.1 |

FIG.23

| | FINE PARTICLE MATERIAL | | MANUFACTURER | PRODUCT NAME | BINDER | | | THICKNESS (μm) | SUBSTRATE | ADHERENCE (kg/mm2) | WATER ABSORPTION (%) |
|---|---|---|---|---|---|---|---|---|---|---|---|
| | MATERIAL | Ave. DIAMETER (μm) | | | MATERIAL | Ave. DIAMETER (μm) | AMOUNT (MASS%) | | | | |
| EXAMPLE 15-1 | TiO2 | 0.25 | TAYCA | JR | Al2O3 | 0.10 | 10 | 120 | Ox-free Cu | ≧4.5 | ≦0.1 |
| EXAMPLE 15-2 | AlN | 0.80 | TOKUYAMA | GRADE F | PZT | 0.50 | 5 | 100 | GLASS | ≧4.0 | ≦0.1 |
| EXAMPLE 16 | TiO2 | 0.25 | TAYCA | JR | Al2O3 | 0.10 | 50 | 100 | Si | ≧5.0 | ≦0.1 |
| EXAMPLE 17 | TiO2 | 0.25 | TAYCA | JR | Al2O3 | 0.10 | 50 | 100 | Si | ≧5.0 | ≦0.1 |

FIG.32

| | INTERLAYER INSULATION FILM | | | | CONDUCTOR LAYER | | HIGH FREQ LOSS |
|---|---|---|---|---|---|---|---|
| | MATERIAL | SURFACE TREATMENT | Ave. DIAMETER (μm) | tan δ | MATERIAL | ρ (μΩ·cm) | RELATIVE VALUE |
| EXAMPLE 18 | MgO | Al2O3 COAT | 0.25 | 0.0003 | Cu PLATING | 2 | 0.6 |
| EXAMPLE 19 | MULLITE | Al2O3 COAT | 0.8 | 0.0004 | Cu PLATING | 2 | 0.6 |
| EXAMPLE 20 | Ba(Mg1/3Ta2/3)TiO3 | ALUMINUM ISOPROPOXIDE | 0.8 | 0.00025 | Cu PLATING | 2 | 0.6 |
| EXAMPLE 21 | AlN | ALUMINUM ISOPROPOXIDE | 1.0 | 0.0005 | Cu PLATING | 2 | 0.7 |
| COMPARATIVE EXAMPLE 4 | POLYIMIDE | — | — | 0.0025 | Cu PLATING | 5 | 0.8 |
| COMPARATIVE EXAMPLE 5 | GLASS EPOXY | — | — | 0.0125 | Cu PLATING | 2 | 1 |
| COMPARATIVE EXAMPLE 6 | GLASS·ALUMINA LTCC | — | — | 0.001~0.003 | CuAg THICK FILM | 8 | 0.8 |

FIG.33

| | MATERIAL | SURFACE TREATMENT | Ave. DIAMETER ($\mu m$) | K (2GHz) | tan δ |
|---|---|---|---|---|---|
| EXAMPLE 18 | $Ba(Mg_{1/3}Ta_{2/3})O_3$ | $Al_2O_3$ COAT | 0.25 | 20 | 0.00025 |
| EXAMPLE 19 | $BaTi_4O_9$ | $Al_2O_3$ COAT | 0.1 | 25 | 0.0003 |
| COMPARATIVE EXAMPLE 6 | $Ba(Mg_{1/3}Ta_{2/3})O_3$ -GLASS COMPOSITE | — | — | 15 | 0.00125 |

FIG.34

| | MATERIAL | SURFACE TREATMENT | Ave. DIAMETER (μm) | E (2GHz) | CAPACITANCE DENSITY | RELATIVE SUBSTRATE SIZE |
|---|---|---|---|---|---|---|
| EXAMPLE 18 | BaTiO₃ | Al₂O₃ COAT | 0.5 | 800 | 10 | 0.3 |
| EXAMPLE 19 | BaSrTiO₃ | Al₂O₃ COAT | 0.1 | 2000 | 20 | 0.3 |
| COMPARATIVE EXAMPLE 4 | BaSrTiO₃ -SPUTTER FILM | — | — | 300 | 5 | 0.6 |
| COMPARATIVE EXAMPLE 5 | BaTiO₃ -EPOXY COMPOSITE FILM | — | — | 50 | 1 | 1 |
| COMPARATIVE EXAMPLE 6 | CaZrO₃ -GLASS COMPOSIT | — | — | 200 | 10 | 0.8 |

AEROSOL DEPOSITION PROCESS

CROSS-REFERENCE TO RELATED APPLICATION

The present application is based on Japanese priority applications No.2003-137398 filed on May 15, 2003, No.2003-137399 filed on May 15, 2003 and No.2003-170475 filed on Jun. 16, 2003, the entire contents of which are hereby incorporated by reference.

BACKGROUND OF THE INVENTION

The present invention relates to circuit substrates having a passive element such as a capacitance element, a resistance element, an inductance element, and the like, thereon or therein, or an electron device having such a circuit substrate, or a fabrication process of such a circuit substrate. More particularly, the present invention relates to a circuit substrate having a base substrate or insulation layer formed of a resin material. Further, the present invention relates to circuit substrates, passive components, electron devices and the fabrication process of a circuit substrate suitable for use in a high frequency circuit. Particularly, the present invention relates to a circuit substrate including therein an interlayer insulation film having a low dielectric loss at high frequencies and simultaneously a conductor layer of low resistance. Furthermore, the present invention relates to film-like bodies formed by spraying a fine particle material to the substrate at high speed, the formation process thereof, and structures including such a film-like body. Particularly, the present invention relates to a strong and dense film-like body formed according to such a process.

Aiming the ubiquitous society, downsizing, miniaturization and performance improvement of electronic apparatuses are going on rapidly in the field of mobile devices, and the like, including personal computers, cellular phones, Bluetooth (trade mark) devices, and the like. To promote the miniaturization of such electronic apparatuses further, there is a need of higher density packaging technology and higher integration technology of high frequency circuits. In order to achieve this goal, various circuit substrates are proposed that incorporate therein various passive elements, such as capacitors, resistance elements, inductors, antennas, filter, and the like.

In the wireless information telecommunication technology for mobile devices such as cellular phones, Bluetooth (trade mark) devices, and the like, there is a demand of transmitting large amount of signals such as voice signals, image signals, data, and the like, with very higher speed, and thus, adaptation of the electron components to the operation at such high frequency region is progressing rapidly in the art of mobile devices, in addition to the downsizing and expansion of function of the mobile device itself. Under this situation, there comes up a desire to realize a substrate including therein passive elements integrated with high frequency circuits in the form of a module, for achieving the device downsizing and simultaneously the adaptation to high frequency applications In the packaging substrates and packages, or in the memory semiconductor devices or logic semiconductor devices, or in the discrete electronic components for packaging for use in the information processing-related electronic apparatuses such as personal computers, business computers, cellular phones, PDAs, and the like, or in the communication-related electronic apparatuses or the control apparatuses such as the one used for semiconductor production, various dielectric ceramics are used in the form of film or a bulk material for implementing various active functions such as memory or computational functions or passive functions. The example of such a passive element includes antennas, filters, capacitors, and the like. These devices or components are generally not formed of a single ceramic material but usually forms a composite body, a multilayer body, or integrated body of various materials such as inorganic materials (metal or semiconductor) or organic materials.

The circuit substrates that incorporate therein the passive elements developed until today can be classified generally into three types: (1) the substrates in which the passive elements are formed by a thin film process by using a silicon substrate, and the like; (2) the substrates in which the passive elements are formed by using a ceramic substrate; and (3) the substrates formed by using a resin-base printed circuit board.

In the case the passive element is formed by a thin film process technology according to the type (1), a multilayer structure is obtained by repeatedly depositing, on a flat surface of a silicon substrate or an alloy substrate, interconnection layers by a sputtering process and insulation layers by a coating process of a resin layer such as polyimide. In this case, the passive element such as the dielectric film of a capacitor or a resistance pattern of a resistance element is formed by a thin oxide film. For the dielectric film, oxide ceramic materials such as BT ($BaTiO_3$), BST ($BaSrTiO_3$), and the like, formed by a sputtering process, sol gel process or a CVD process, are commonly used. For example, reference should be made to Japanese Laid-Open Patent Application 2001-250885 official gazette.

In the case of forming the passive element by using a ceramic substrate according to the type (2) noted above, a multilayer structure is formed on a ceramic substrate by repeatedly printing, drying and baking a paste of a conductor film, a dielectric film, a resistance film, or an insulation film. Because the baking process is carried out at the temperature of 1000° C. or more, the dielectric film of this type can more or less realize the ideal dielectric characteristic of a bulk material.

In the case of forming the passive element by using a resin printed circuit board according to the type (3), on the other hand, FR4 (a glass epoxy material) is used for the base substrate and a Cu film formed by a plating process is used for the electric conduction layer. Further, for the insulation layer, an epoxy resin sheet or an epoxy resin varnish (heat resistant temperature: 250° C.) is used.

Thereby, via-holes are formed in the insulation layer by a laser drilling process, and the via-holes thus formed are filled by a metal plating process or by a powder material to form via-plugs. The dielectric film of the capacitor is incorporated into the circuit substrate, by forming a dielectric material by mixing a ceramic powder having dielectricity with a binder resin and by forming a sheet or pattern of the dielectric material from the mixture.

In another case of using the resin printed circuit board according to the type (3), a passive component is mounted on the insulation layer provided on the base substrate and the structure thus formed is covered with an insulation sheet such that the passive element is incorporated in the component level.

However, in the circuit substrate that uses the thin film process of the above type (1), there is a need of conducting a substrate heating process or post annealing process at the temperature of 400° C. in the lowest, in any of the cases in which the dielectric film is formed by the sputtering process or sol gel process or CVD process. In the case of using polyimide as the insulation layer, on the other hand, it is necessary to reduce the temperature of the substrate heating down to 350° C. or lower for securing the reliability of the circuit substrate in view of the fact that the heat resistant temperature of polyimide is only about 400° C. However, in the case that the substrate heating process or post annealing process is conducted below the temperature of 350° C., crystallization of the dielectric film does not proceed sufficiently and there arises a problem in that the dielectric characteristics of the dielectric film is substantially inferior as compared to the case of a bulk material.

For example, while a BT film has a specific dielectric constant of 1500-3000 in the bulk state, the forgoing approach provides the dielectric constant of only about 200. Thereby, there arises a problem in that the electrostatic capacitance of the capacitor is reduced.

Further, there is proposed an approach of using a highly refractory alloy substrate or a ceramic substrate for the base substrate and provide the dielectric film only once on such a base substrate, followed by applying a heat treatment at the high temperature, and then laminate an insulation layer of a resin material. However, such an approach can form only one layer of the dielectric film, and there arises a problem in that the electrostatic capacitance formed in the circuit substrate is limited.

With regard to the circuit substrate that forms the passive elements by using a ceramic substrates according to the type (2), there arise the problem of high cost due to the need of using high temperature over 1000° C. at the time of the baking process. Further, there arises the problem of poor yield caused by possible short circuit, electrical disconnection, deformation, and the like, which in turn may be caused at the time of the baking process as a result of large difference of thermal expansion coefficients between the insulation film, the electric conduction film and the passive components.

In the case of forming the passive element by using the resin printed circuit board the type (3), on the other hand, there arises a problem, associated with the fact that the dielectric constant of the dielectric film is lower than about 100, in that the electrostatic capacitance capable to be realized in the circuit substrate is limited.

Further, with regard to the alternative approach of the type (3) of forming the passive elements by using a resin printed circuit board, there arise the problems in that there is a need of forming a cavity for introducing the passive element and mounting the passive element into such a cavity, while such a process is complex and it is difficult to secure high reliability for the connections between the passive elements and the wiring. In addition, there arises a problem in that repairing, such as replacement of defective passive elements, is difficult. Further, there arise additional problems in that: the structure becomes complex in view of the necessity of forming a cavity in the insulation film; it is difficult to secure planarization of the layer in the upper part of the circuit substrate; and that the layer number of lamination is limited.

Meanwhile, in a high frequency circuit, the loss is represented by a sum of conductor loss and dielectric loss (dielectric tangent), and the effect of the dielectric loss increases with increase of the frequency. Thus, the dielectric material for use in a high frequency circuit is required to have a low dielectric loss.

However, because of the fact that the interlayer insulation films of the above types (1) and (3) are formed of a resin material having a large dielectric loss, there arises a problem in that the loss increases sharply at high frequencies. For example, a polyimide resin has a dielectric loss of 0.004 at 2 GHz while an epoxy resin has a dielectric loss of 0.0125 at 2 GHz.

On the other hand, the interlayer insulation film of the type (2) is formed of a low dielectric ceramic material, and thus, the use thereof is thought promising for high frequency applications.

At present, a method that uses a LTCC process (low temperature baking ceramics process) is used for the production of ceramic substrates for high frequency applications. In the LTCC process, a ceramic material of low baking temperature containing a glass as a baking additive and a conductor paste containing a metal powder of low electrical resistance are printed respectively as the interlayer insulation film and the conductor pattern, and the interlayer insulation film and the conductor thus printed are baked simultaneously. For the metal powder of the conductor paste, Ag, Cu, Au, and the like, of low electrical resistance are used commonly.

SUMMARY OF THE INVENTION

Accordingly, it is a general object of the present invention to provide a novel and useful circuit substrate and fabrication process thereof wherein the foregoing problems are eliminated.

Another and more specific object of the present invention is to provide a circuit substrate incorporating therein a passive element and capable of increasing the integration density and achieving further downsizing while maintaining excellent performance for the passive element.

Another object of the present invention is to provide a low-cost and easy-to-implement fabrication process of a circuit substrate.

In a first aspect of the present invention, there is provided a circuit substrate having a passive element and a wiring structure thereon or therein, wherein said passive element or wiring structure is formed by an aerosol deposition process.

In the present invention, an aerosol deposition process is defined as a process of depositing a fine particle material on a base material by forming aerosol from the fine particle material by using a carrier gas, and spraying the aerosol thus formed to a substrate by ejecting the aerosol from a nozzle at high speed.

According to the present invention, only the outermost surface of the fine particles undergoes activation when impact is caused at the time of deposition of the fine particle material on the substrate as a result of mutual collision of the fine particles, and a structure is obtained such that the fine particles are connected with each other. Thereby, the properties of the fine particle material under the normal temperature environment, such as dielectric characteristics, conductive characteristics, and the like, are effectively preserved, and it is possible to form a passive element or a wiring structure having excellent characteristics. Further, because there is caused no damages in the underlying layer of the passive element or in the wiring structure, the circuit substrate of the present invention maintains high reliability.

Further, because it becomes possible to form the passive element in the ordinary temperature environment in the present invention, the formation of a multilayer structure is facilitated substantially, and thus, it becomes possible to form a large number of passive elements in the circuit substrate. As a result, the circuit substrate of the present invention can reduce the number of the passive elements provided on the substrate surface, and the active elements can be disposed with reduced mutual separation. Thereby, it becomes possible to downsize the electronic apparatus that uses such a circuit substrate. In the present invention, "ordinary temperature" means a temperature of 300° C. or less.

In the present invention, it should be noted that the circuit substrate is formed of a base substrate and an insulation layer is laminated on the base substrate. Further, at least one of the base substrate and the insulation layer is formed of a resin material. Because the aerosol deposition process used in the present invention does not need a high temperature process, it becomes possible to use a resin material for the base substrate of the circuit substrate or for the insulation layer. Thus, a multilayer structure is formed easily and it becomes possible to arrange the passive elements with reduced separation.

It should be noted that the fine particle material used in the present invention may be added with or covered by an aluminum compound or a lead compound. In the case of using such a fine particle material thus added with the aluminum or lead compound, it is possible to obtain a thick and dense film-like body easily. It is believed that the aluminum compound or the lead compound thus introduced functions as a binder of the fine particle material.

In another aspect of the present invention, there is provided an electron device including any of the foregoing circuit substrates and an electronic component.

According to the present invention, the circuit substrate can accommodate therein the passive elements with high density, and it becomes possible to mount the electronic components such as LSI, and the like, on the surface of the circuit substrate with large integration density. Because the distance between the electronic components can be reduced in the electron device of the present invention, it is possible to reduce the transmission time of signals, while this leads to high-speed operation of the electron device.

In another aspect of the present invention, there is provided a fabrication process of a circuit substrate including a passive element or a wiring structure, said passive element or wiring structure having at least a dielectric film, a resistance film and a conductor film on or in a circuit substrate, wherein the fabrication process includes a film formation step of forming at least one of the dielectric film, resistance film and the conductor film by spraying aerosol of a fine particle material at a predetermined speed together with a carrier gas.

According to the present invention, it is possible to form any of the dielectric film, resistance film, and the conductor film without degrading the characteristics of the fine particle material, by using the dielectric material, resistance material or conductor material in the form of the foregoing fine particle material and by spraying the aerosol of the fine particle material to the base body at the predetermined speed. Because the film formation process is carried out at the ordinary temperature, the process of the present invention is easily carried out with low cost as compared with the conventional film. formation process that requires a high temperature process.

Because there occurs no melting or softening in the base body even when the fine particle material collides to the base body, there arises no problem such as thermal deformation in the base body. Thereby, the design of the circuit substrate or the elements built therein becomes substantially easier.

Another object of the present invention is to provide a circuit substrate, a passive component and an electron device suitable for use in high frequency circuits and having a low specific resistance for the conductor and simultaneously low dielectric loss. for the dielectric film in the high frequency region, as well as the fabrication process of such a circuit substrate.

According to an aspect of the present invention, there is provided a circuit substrate in which an interlayer insulation film and a conductor layer are laminated, wherein the interlayer insulation film is deposited by spraying aerosol of a fine particle material, and wherein the conductor layer is a continuous film of a metal or an alloy.

According to the present invention, the interlayer insulation film of a circuit substrate such as a multilayer substrate can be formed at ordinary temperature by using the aerosol deposition process of a fine particle material. As a result, the properties such as the dielectric characteristics of the fine particle material are maintained in the circuit substrate. Because the high baking temperature is not needed in the aerosol deposition process, contrary to the LTCC process, it is possible in the present invention to form the conductor layer in the form of continuation film by any of non-electrolytic plating process, electrolytic plating process, sputtering process, and the like. Thereby, the specific resistance of the conductor layer is reduced, and the loss in the interconnection layer of the circuit substrate is reduced as a result.

The foregoing fine particle material may be a ceramic material and may be any of $Al_2O_3$, $MgO$, $SiO_2$, $CaO$, $TiO_2$, $3Al_2O_3 \cdot 2SiO_2$ (mullite), $MgO \cdot Al_2O_3$ (spinel), $2MgO \cdot SiO_2$ (forsterite), $2Al_2O_3 \cdot 2MgO \cdot 5SiO_2$ (cordierite) $CaO \cdot Al_2O_3 \cdot 2SiO_2$ (anorthite) and $AlN$. By spraying such fine particle material in the form of aerosol, it becomes possible to form an interlayer insulation film without degrading the characteristics of the fine particle material, and the dielectric loss of the interlayer insulation film at high frequency is reduced. Thereby, the loss in the high frequency region is reduced further and it becomes possible to realize a circuit substrate suitable for the high frequency circuit.

In another aspect of the present invention, there is provided a passive component in which a dielectric layer and a conductor layer are laminated, wherein the dielectric layer is formed by spraying aerosol of a fine particle material, the conductor layer is formed of a continuous film of metal or alloy, and wherein the fine particle material includes at least one of the group of $Al_2O_3$, $MgO$, $SiO_2$, $CaO$, $TiO_2$, $3Al_2O_3 \cdot 2SiO_2$, $MgO \cdot Al_2O_3$, $2MgO \cdot SiO_2$, $2Al_2O_3 \cdot 2MgO \cdot 5SiO_2$, $CaO \cdot Al_2O_3 \cdot 2SiO_2$, $BaTiO_3$, $BaSrTiO_3$, $BaTiZrO_3$, $BaTi_4O_9$, $Ba_2Ti_9O_{20}$, $Ba(Mg_{1/3}Ta_{2/3})O_3$, $Ba(Zn_{1/3}Ta_{2/3})O_3$, $Ba(Zn_{1/3}Nb_{2/3})O_3$, $ZrSnTiO_4$, $PbZrTiO_3$, $Pb(Mg_{1/3}Nb_{2/3})O_3$, and $Pb(Ni_{1/3}Nb_{2/3})O_3$.

According to the present invention, it becomes possible to reduce the specific resistance of the conductor layer by forming the conductor layer as a continuous film of metal or alloy. Further, by forming the dielectric layer by spraying the aerosol of the fine particle material, it becomes possible to form the dielectric layer without degrading the properties of the fine particle material. As a result, it becomes possible to reduce the loss of the passive component in the high frequency range. Here, it should be noted that the passive component includes a laminated ceramic capacitor, a thin film coil, a laminated coil, or a filter that uses the same, or a filter that uses a strip line.

In another aspect of the present invention, there is provided an electron device including any of the circuit substrates and/or passive component noted above and an electronic component. According to the present invention, the circuit substrate or the passive component has a low loss characteristic in the high frequency region, and because of this, it becomes possible to realize an electron device of low electric power consumption capable of performing at high-speed.

In another aspect of the present invention, there is provided a fabrication process of a circuit substrate in which an interlayer insulation film and a conductor layer are laminated, including the steps of: forming the.interlayer insulation film by spraying aerosol of a fine particle material together with a carrier gas at a predetermined velocity; and forming the conductor layer by depositing or growing a metal or alloy material.

According to the present invention, it becomes possible to form an interlayer insulation film without degrading the properties such as a dielectric characteristic of the fine particle material, by spraying the fine particle material on a part on which the interlayer insulation film is formed in the form of aerosol. Because it is possible to conduct the film formation process at a room temperature in the present invention, it becomes possible to form the conductor layer by depositing or growing the metal or alloy by using a non-electrolytic plating process, electrolytic plating process, sputtering process, vacuum evaporation deposition process, chemical vapor deposition process, and the like, the use of which has been difficult in the conventional LTCC process that requires a high temperature process. Associated with this, it is possible to eliminate the baking process in the present invention, and the process for forming the conductor layer is facilitated and the yield of production is improved. Further, the conductor layer is formed in the form of a continuous film, leading to decrease of the specific resistance. Thereby, it becomes possible to realize a circuit substrate of low loss.

Another object of the present invention is to provide a structure and a formation method thereof, the structure including a film-like body, wherein the film-like body has a dense and strong film quality and excellent adherence with regard to a base body.

According to an aspect of the present invention, there is provided a structure including a film-like body formed by spraying a fine particle material on a substrate by an aerosol deposition process, wherein the film-like body has the feature of including a binder of the fine particle material.

According to the present invention, it becomes possible to form a dense and strong film-like body by an aerosol deposition process, by using a fine particle material that including therein a binder of the fine particles.

Preferably, the binder of the fine particles is an aluminum compound or a lead compound. By using the aluminum compound or lead compound for the binder of the fine particles, it becomes possible to form a thick film hitherto not possible to form, particularly a film-like body having a film thickness of 5 μm or more.

Because the structure including the film-like body of the present invention can use various materials, such as a resin material or a metal plate, for the substrate, the present invention is useful for various applications. As noted before, the aerosol deposition process used in the present invention is a process of depositing fine particles of metal, half metal, ceramics, and the like, on a base material by forming aerosol by a carrier gas and spraying on a substrate by ejecting from a nozzle and at high speed.

In another aspect of the present invention, there is provided a method of forming a structure including a film-like body by an aerosol deposition process, comprising the step of spraying a fine particle material and a binder of the fine particles to a substrate.

According to the present invention, it becomes possible to form a dense and strong film-like body from the fine particle material by the existence of the binder between the fine particles in the film-like body, as a result of spraying the fine particle material and the binder of the fine particles to the substrate.

By using an aluminum alkoxide represented by a general formula $(Al(OR)_3)$ (R representing an alkyl group) for the binder of the fine particles, and by conducting a surface treatment of the fine particle material by the aluminum alkoxide before the spraying step, it becomes possible to form a thick film easily.

Further, it is possible to use an aluminum oxide film for the binder of the fine particles and may provide the step of forming the aluminum oxide film on the surface of the fine particles by a chemistry vapor growth process before the spraying step. Alternatively, the binder of the fine particles may be a particulate material and a step of mixing the fine particle material and the particulate binder before the spraying step may be provided. Further, it is possible to spray the fine particles and the particulate binder from different nozzles in the spraying step.

Other objects and further features of the present invention will become apparent from the following detailed description when read in conjunction with the attached drawings.

BRIEF DESCRIPTION OF THE DRAWINGS

FIG. 9 is a cross-sectional diagram. of an electron device having a circuit substrate according to Example 5 of the present invention;

FIG. 16 is a diagram summarizing the characteristic of various dielectric films formed on the circuit substrates according various examples and comparative examples for the first through third embodiments;

FIG. 17 is a diagram summarizing the characteristic of a resistance film formed on the circuit substrates according to various examples and comparative examples for the first through third embodiments;

FIG. 18 is a diagram summarizing the examples of packaging a passive component;

FIG. 21 is a diagram summarizing the conditions and evaluation results for various examples and comparative examples of the fourth embodiment of the present invention;

FIG. 22 is a diagram summarizing the conditions and evaluation results different examples of the fourth embodiment;

FIG. 23 is a diagram summarizing the conditions and evaluation results for further examples of the fourth embodiment of the present invention;

FIG. 32 is a diagram summarizing the characteristics of an interlayer insulation film and a conductor film formed on various circuit substrates according to examples and comparative examples of the fifth embodiment;

FIG. 33 is a diagram summarizing the characteristics of various dielectric layers formed for a filter on various circuit substrates according to examples and comparative examples of the fifth embodiment of the present invention;

FIG. 34 is a diagram summarizing the characteristics of various dielectric layers formed for a capacitor on various circuit substrates according to examples and comparative examples of the fifth embodiment of the present invention.

DETAILED DESCRIPTION OF THE INVENTION

Figure 1:
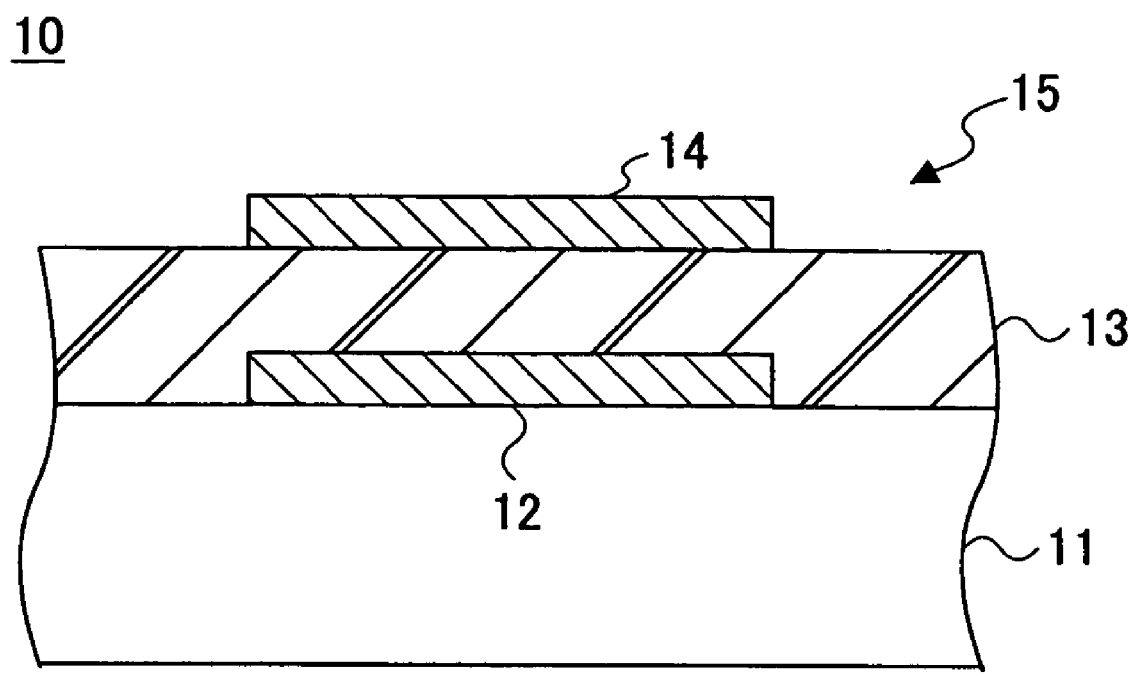
FIG. 1 is a cross-sectional diagram showing a circuit substrate according to a first embodiment of the present invention.

While it is true that the interlayer insulation film used in the LTCC process does have a relatively low dielectric loss as compared with the resin materials mentioned above, the dielectric loss still has the value of about 0.002 at 2 GHz. It should be noted that this value is larger than the dielectric loss of the high frequency microwave ceramics, and thus, there remains the problem that further reduction of the dielectric loss is difficult.

Also, it should be noted that the electric conductor layer used in the LTCC process is the one formed by baking a conductor paste mentioned above. Because the binder contained in the conductor paste undergoes decomposition or carbonization with the baking process, the metal powder does not form a complete continuous body, and there arises a problem in that it is not possible to realize a low specific resistance, which is the property pertinent to the material that constitutes the metal powder. Further, depending on the baking condition or diameter distribution of the metal powder, there can be caused variation of specific resistance within a circuit substrate or between different circuit substrates. Thereby, there arises a problem in that the desired characteristics are not readily achieved.

Further, there arise problems in the LTCC process, in view of the fact that the dielectric layer of the capacitor used in the LTCC process includes a large amount of glass in the ceramic material constituting the dielectric layer, in that the dielectric constant of the dielectric layer is small as compared with the ceramic material baked at high temperatures, and it is difficult to form a capacitor of low-dielectric loss and large capacitance. Thus, there exits a limitation in the improvement of dielectric constant of the dielectric film as far as such an approach is used.

Meanwhile, in the devices or components that use different materials in the form of composite material, it is important to harmonize the process temperature or process ambient for each of the materials used therein and to provide the temperature hierarchy in the process steps. Among various materials, a ceramics material in particular requires a high process temperature at the time of the sintering process, and thus, it has been difficult to achieve harmonization of process with other materials. Because of this, it has been also difficult to incorporate the ceramic materials in the electron devices and there has been a limitation in the use of ceramic materials in electron devices.

Meanwhile, there is an aerosol deposition process that enables formation of a ceramic film in the vicinity of ordinary temperature, wherein the aerosol deposition process is the technology that causes impact-solidification of ceramic fine particles.

In the conventional aerosol deposition process, it is possible to form an aluminum oxide protective film having excellent wear resistance on a stainless steel substrate without conducting a baking process, by depositing the film on the substrate with the thickness 10 μm while using aluminum oxide fine particles having an average diameter of 0.5 μm. Reference should be made to Japanese Laid-Open Patent Application 2002-348677 official gazette.

However, as a result of various investigation made by the inventor of the present invention on this technology, it became apparent that a limitation is imposed for the fine particle material when this technology is used for forming a thick film having a thickness of several ten microns with reliability, and the applicability of the aerosol deposition technology has been rather limited.

Hereinafter, embodiments of the present invention will be described together with a deposition apparatus designed for an aerosol deposition process (referred to hereinafter as "AD process").

FIRST EMBODIMENT

FIG. 1 is a cross-sectional diagram of a circuit substrate according to an embodiment of the present invention.

Referring to FIG. 1, the circuit substrate 10 of the present invention is formed of a base substrate 11, a first electrode layer 12 formed selectively on a surface of the base substrate 11, a dielectric film 13 covering the base substrate 11 and the first electrode layer 12, a second electrode layer 14 formed on the dielectric film 13 so as to oppose the first electrode layer, and thus, there is formed a capacitor 15 by the first electrode layer 12 and the second electrode layer 14 sandwiching the dielectric film 13.

For the base substrate 11, it is possible to use a resin material such as epoxy resin, polyimide, polyester resin, fluorine copolymer, a fiber glass, Teflon (trade mark), and the like. Of course, it is possible to use a metallic material of an alloy containing Fe, Ni, Mo, W, Al, Cu, Ag, Au, and the like, for the base substrate 11 by providing an insulation layer between the base substrate 11 and the first electrode layer 12. Further, the base substrate 11 may be a ceramics substrate.

Also, in the present embodiment, it is possible to use an insulation layer in place of the base substrate 11. In this case, it is possible to use organic or inorganic insulation layer such as an epoxy insulation layer, a polyimide insulation layer, and the like.

One feature of the present embodiment is to form the dielectric film 13 by using an AD process. By using such an AD process, it become possible to deposit a film of $Al_2O_3$, $TiO_2$, and the like, for the dielectric film 13, and it becomes possible to realize excellent dielectric characteristics for the oxide ceramic materials having a perovskite structure and thus needing heat treatment at high temperatures, without conducting such a heat treatment or without degrading the excellent dielectric characteristics.

Thus, the present invention is applicable to the circuit substrates having the base substrate 11 or an insulation layer formed of a resin material, and thus, the present invention expands the possibility of selection of the material for the circuit substrate having a built-up capacitor 15 therein and expands the applicability of the circuit substrate significantly. The present invention can meet for the acute demand of downsizing in the portable terminals such as cellular phones.

Figure 2:
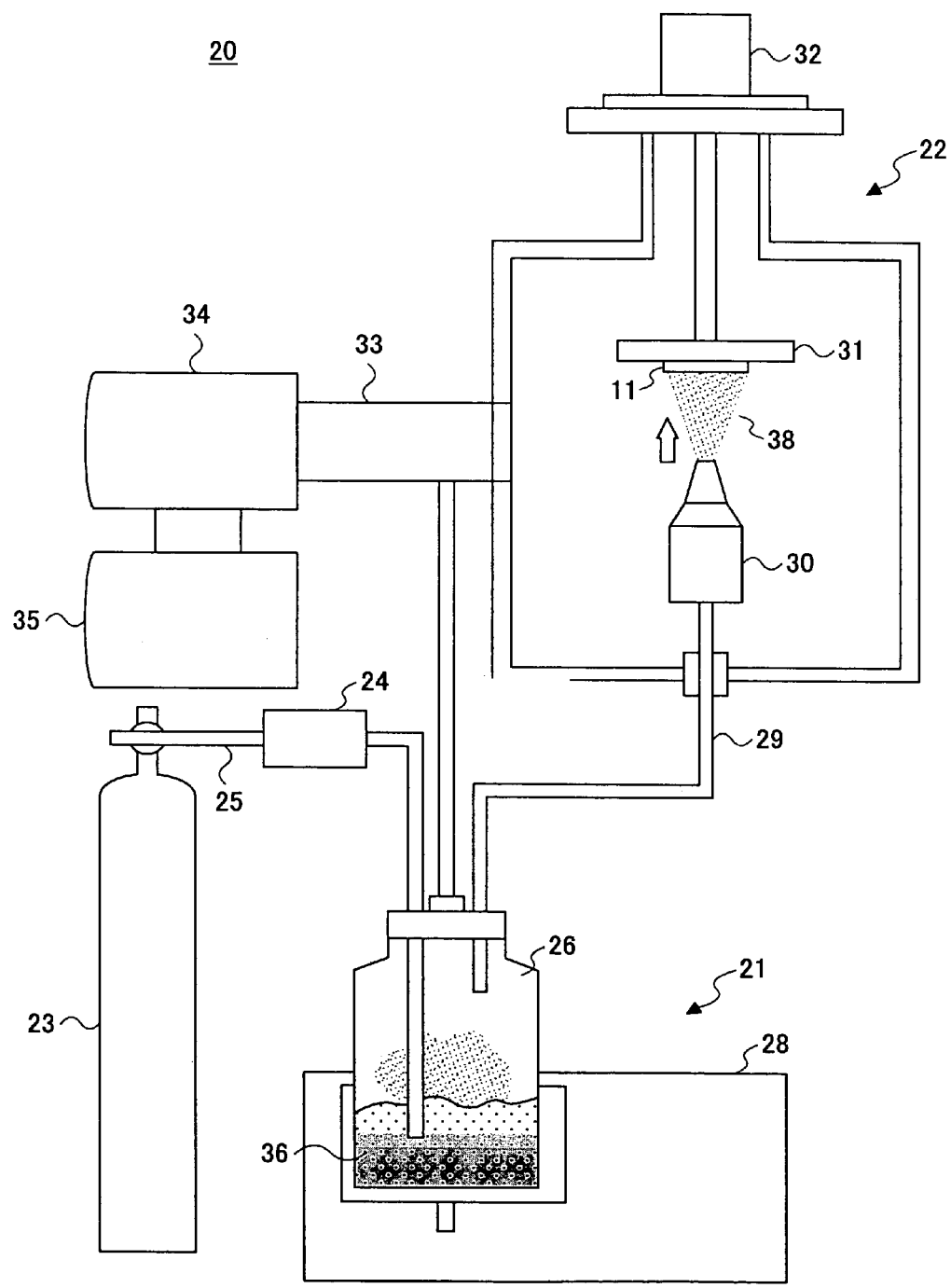
FIG. 2 is a schematic diagram showing a deposition apparatus for conducting an AD process.

FIG. 2 is a schematic diagram showing the construction of a deposition apparatus 20 designed for an AD process.

Referring to FIG. 2, the AD film formation apparatus 20 is generally formed of an aerosol generator 21 used for forming the aerosol of a fine particle material and a growth chamber 22 for forming an AD film on a substrate by spraying the aerosol of the fine particle material thus formed by the aerosol generator 21.

More specifically, a gas cylinder 23 and a mass flow controller 24 are connected to the aerosol generator 21 via a gas line 25, and the supply of the carrier gas of high pressure argon filled in the gas cylinder 23 to the aerosol generator 21, is controlled by using the mass flow controller 24. With this, it becomes possible to control the dust formation of the fine particles inside a container 26 provided in the aerosol generator 21 or the amount of ejection of the aerosol of the fine particles in the growth chamber 22. For the carrier gas, it is possible to use an inert gas such as helium, neon, nitrogen in addition to the argon gas. Further, in the case of using oxide ceramics having a perovskite structure for the fine particle material, it is possible to use an oxidizing gas such as oxygen or air. Thereby, it becomes possible to compensate for the oxygen defects that tend to be formed in the oxide ceramic fine particle material at the time of the film formation.

Further, the aerosol generator 21 is provided with a vibrator 28 for forming primary particles of the fine particle material by applying thereto supersonic vibration, electromagnet vibration, mechanical vibration, and the like. By using the primary particles of the fine material, the present invention enables formation of a dense and uniform AD film.

In the growth chamber 22, there are provided a nozzle 30 connected to the aerosol generator 21 via a line 29 and a stage 31 holding the substrate 11 and provided so as to oppose the nozzle 30. Further, an XYZ stage 32 is connected to the stage 31 for controlling the position of the substrate 31. Further, a mechanical booster pump 34 and a rotary pump 35 are connected to the growth chamber 22 for reducing the pressure inside the growth chamber 22.

In operation, fine particles having an average diameter of the 10 nm-1 μm are filled in the aerosol generator 21 as the source of the film material and an argon gas of the pressure of 19.6 Pa-49 Pa (2-5 kg/cm$^2$), for example, is supplied to the growth chamber 22 from the gas cylinder 23 as a carrier gas, together with vibration caused by the vibrator 28, and with this, the aerosol of the fine particles is formed.

The aerosol of the fine particles thus formed is transported to the growth chamber 22 of which pressure is set to a pressure lower than the pressure inside the container 26 of the aerosol generator 21 via the line 29 together with the carrier gas, and the fine particles are ejected in the growth chamber 22 from nozzle 30 together with the carrier gas with a rate of 30 g/hour, for example. Thereby, the fine particles form a jet stream and cause deposition on the substrate 11 or the first electrode layer 12 shown in FIG. 1. With this, the dielectric film 13 is formed. Thereby, the ejection velocity can be controlled by the shape of the nozzle 30, the pressure of the carrier gas thus introduced and the pressure difference between the aerosol generator 21 and the growth chamber 22, and is generally set to the range of 3 m/second-400 m/second (preferably 200 m/second-400 m/second). By setting the ejection velocity to this range, it is possible to form a high dielectric film 13 having strong adherence to the substrate 11 and also to the first electrode layer 12.

Here, it should be noted that the fine particles thus collided remove the contamination layer or moisture from the surface of the resin substrate 11 or contamination layer or oxide layer from the first electrode layer 12 at the time of collision with the substrate 11 or the first electrode layer 12, and the surface to which the fine particles impinge undergoes activation. Further, the surface of the fine particles itself is activated as a result of mutual collision of the fine particles.

As a result of such activation, the fine particles cause firm bonding to the surface of substrate 11 or the first electrode layer 12. Further, the fine particles are connected firmly with each other, and a dense film having a strong adherence is obtained for the dielectric film 13. Furthermore, it should be noted that, when the ejection velocity has exceeded 400 m/second, there is a risk that substrate 11 is damaged. When the ejection velocity is smaller than the 3 m/second, on the other hand, no sufficient adhesion is achieved.

Further, the dielectric film needs not to be heated at the time of, or after the film formation, when the deposition is made by such an AD process. It is believed that, in the AD process, only the outermost surface of the fine particle material undergoes impact activation caused by collision when the fine particle material is deposited on the substrate, while no influence reaches the interior of the fine particles. In other words, it is believed that the crystallinity of the fine particles is maintained also in the dielectric film thus deposited by the AD process.

For the fine particle material capable of forming the dielectric film 13 by the AD process, the oxide ceramics such as $TiO_2$, MgO, $SiO_2$, AlN, $Al_2O_3$, and the like, can be used. Further, it is possible to use the oxide ceramics having a perovskite structure such as PZT represented by the general formula $PbTiO_3$, $PbZrO_3$, $Pb(Zr_{1-x}Ti_x)O_3$ ($0 \leq x \leq 1$), or PLZT represented by a general formula $(Pb_{1-y}La_y)(Zr_{1-x}Ti_x)$ $O_3$ ($0 \leq x$, $y \leq 1$) or other Pb-containing perovskite such as $Pb(Mg_{1/3}Nb_{2/3})O_3$, $Pb(Ni_{1/3}Nb_{2/3})O_3$, $Pb(Zn_{1/3}Nb_{2/3})O_3$, the oxide ceramics of the Ba-containing system such as $BaTiO_3$, $BaTi_4O_9$, $Ba_2Ti_9O_{20}$, $Ba(Zn_{1/3}Ta_{2/3})O_3$, $Ba(Zn_{1/3}Nb_{2/3})O3$, $Ba(Mg_{1/3}Ta_{2/3})O_3$, $Ba(Mg_{1/3}Ta_{2/3})O_3$, $Ba(Co_{1/3}Ta_{2/3})O_3$, $Ba(Co_{1/3}Nb_{2/3})O_3$, $Ba(Ni_{1/3}Ta_{2/3})O_3$, $Ba(Zr_{1-x}Ti_x)O_3$, $(Ba_{1-x}Sr_x)TiO_3$, and the like. In addition, it is possible to use $ZrSnTiO_4$, $CaTiO_3$, $MgTiO_3$, $SrTiO_3$, and the like.

Further, it is possible to add a binder of an aluminum compound or lead compound to the fine particles forming the fine particle material. Alternatively, the binder may be provided so as to coat the fine particles. According to the investigation of the inventor, it is confirmed a dense and thick dielectric film 13 is obtained particularly in the range of the film thickness of 5 μm-1 mm, by using the binder at the time of formation of the dielectric film 13 by the fine particle material noted before. The amount of the binder added to the fine particles or coated on the fine particles is preferably set, with reference to the total weight (100 mass %) of the dielectric material, which becomes the primary component, and the binder, to 0.1-50 mass %, more preferably to 0.1-20 mass %.

For the aluminum compound, $Al_2O_3$, $LiAlO_2$, $MgAl_2O_4$, $CaAl_2O_4$, $SrAl_2O_4$, $BaAl_2O_4$, $Y_3Al_5O_{12}$, AlN, $Al_2O_3 \cdot nH_2O$, boehmite (γ-AlOOH), aluminum hydroxide ($Al(OH)_3$), aluminum alkoxide ($Al(OR)_3$ (R: the alkyl group)), mullite ($3Al_2O_3 \cdot 2SiO_2$), spinel ($MgO \cdot Al_2O_3$), cordierite ($2Al_2O_3 \cdot 2MgO \cdot 5SiO_2$), anorthite ($CaO \cdot Al_2O_3 \cdot 2SiO_2$) gehlenite ($2CaO \cdot Al_2O_3 \cdot SiO_2$), and the like, can be used. Among these aluminum compounds, the use of $Al_2O_3$, boehmite (γ-AlOOH), aluminum hydroxide ($Al(OH)_3$), aluminum alkoxide ($Al(OR)_3$ (R: alkyl group)) is particularly preferable.

For the lead compound, it is possible to use $Pb_2FeNbO_6$, $Pb_2FeTaO_6$, $Pb_2YbNbO_6$, $Pb_2YbTO_6$, $Pb_2LUNbO_6$, $Pb_2LuTaO$, $Pb_3NiNb_2O_9$, $Pb_3NiTa_2O_9$, $Pb_3ZnNb_2O_9$, $Pb_3Fe_2WO_9$, $Pb_2CdWO_6$, $PbTiO_3$, $PbZrO_3$, $PbSnO_3$, $PbHfO_3$, PbO, and the like.

It should be noted that the average diameter of the fine particles is set to the range of 10 nm-1 μm. When it is smaller than 10 nm, the dielectric film has poor adherence to the substrate, while when the average diameter is larger than 1 μm, it becomes difficult to form a continuous film, and the dielectric film becomes fragile.

Figure 3:
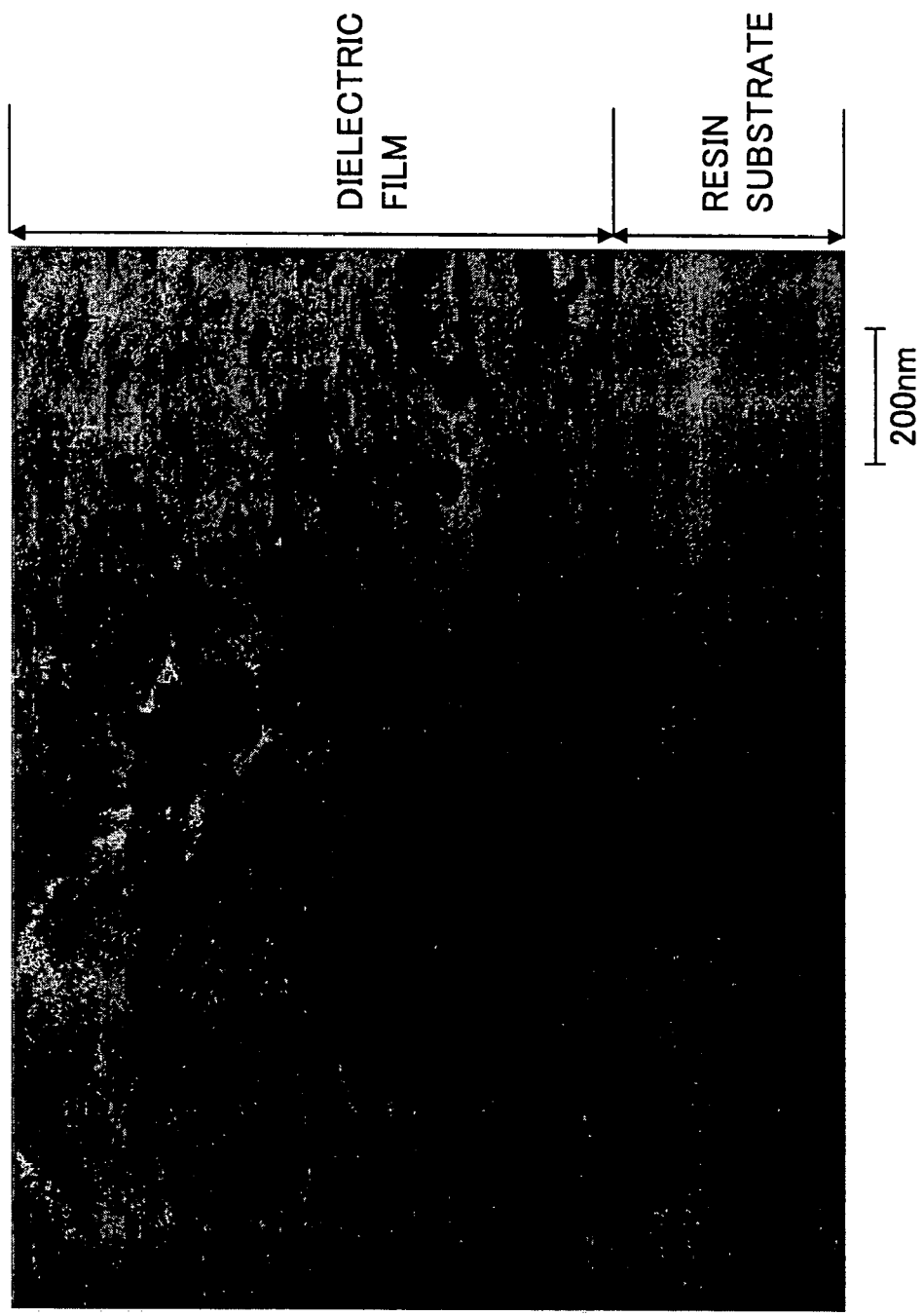
FIG. 3 is a diagram showing a cross-sectional TEM photograph of a dielectric film formed on a resin substrate by an AD process.

FIG. 3 is a cross-sectional TEM photograph of the dielectric film formed on a resin substrate by the AD process.

Referring to FIG. 3, the dielectric film is formed on a resin substrate of glass epoxy family (FR-4) by spraying the fine particles of the $TiO_2$ dielectric material covered with 2 mass % of aluminum alkoxide, with the ejection velocity of 200 m/s. It can be seen that the thickness of the boundary region formed at the interface between the resin substrate and the dielectric film is about 50 nm, and there occurs no problem such as the fine particles penetrate deeply into the resin substrate from the surface thereof and cause damaging in the resin substrate. Further, it can be seen that the undulation (peak-valley height) of the boundary interface is about 100 nm.

From this, it is seen that the fine particles do not provide excessive impact to the resin substrate and that the generation of the heat caused by the impact does not provide any substantial influence to the resin substrate surface. Further, the inventor has confirmed that the magnitude of undulation of the boundary interface is generally the same or smaller than the foregoing in the case the dielectric film is formed on a conductor film of a metallic material or ceramic material. Further, in the case of using the circuit substrate of the present embodiment for high frequency applications, it becomes possible to suppress the loss caused by the skin effect at high frequencies because of the reduced undulation of the conductor film surface.

As a result of various studies and investigations of the inventor of the present invention, it is concluded that the undulation of the boundary interface between the substrate and the dielectric film is preferably in the range of the 5 nm-1 μm, more preferably in the range of 5 nm-500 nm.

According to the present embodiment, it becomes possible to form a dielectric film on the surface of a base substrate of a resin material or an insulation layer, or on a first electrode layer formed of a conductive material by using the fine particle material of oxide ceramics at ordinary temperature, without causing damaging to the underlying layer.

SECOND EMBODIMENT

Figure 4:
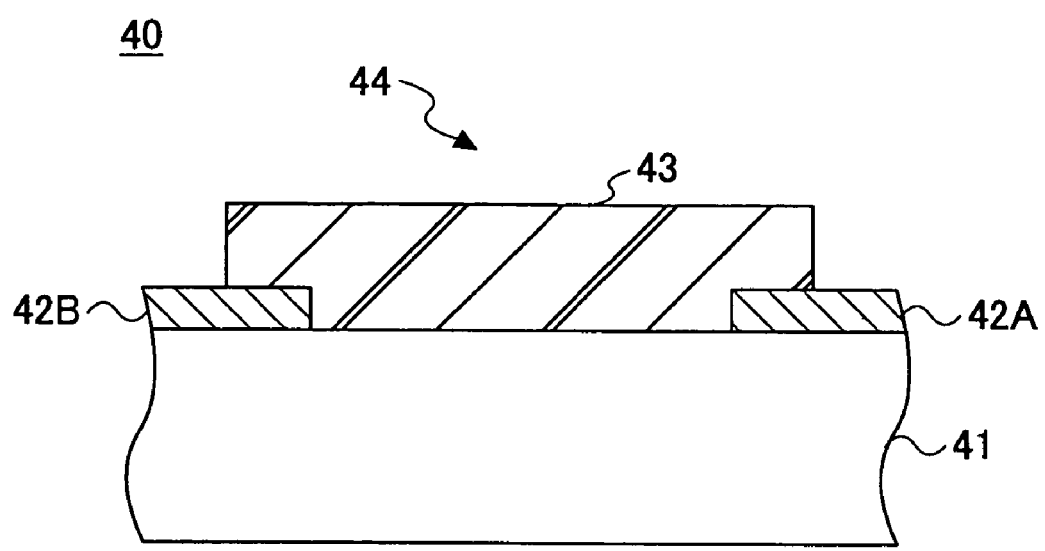
FIG. 4 is a cross-sectional diagram showing a circuit substrate according to a second embodiment of the present invention.

FIG. 4 is a cross-sectional diagram showing a part of a circuit substrate 40 according to a second embodiment of the present invention.

Referring to FIG. 4, the circuit substrate 40 of the present invention is formed of an insulation layer 41, interconnection layers 42A and 42B formed selectively on the surface of the insulation layer 41, a resistance film 43 formed between the interconnection layers 42A and 42B, and the like, wherein the resistance body film 43 forms the resistance element 44.

Here, it should be noted that the resistance film 43 is formed by an AD process.

In the present embodiment, it is possible to form a resistance film of an oxide ceramic that does not require high temperature sintering process at the temperature of 1000° C. or more, by forming the resistance film by the AD process while using the fine particle material of ruthenium oxide ($RuO_2$), and the like, which is generally used as a resistance material. Because the present invention does not require a high temperature process, it becomes possible to form the resistance element with high dimensional precision and hence with high precision of resistance value.

For the fine particle material for forming the resistance film 43 with the AD process, it is possible to use the oxide ceramics such as ruthenium oxide ($RuO_2$), rhenium oxide ($ReO_2$), iridium oxide ($IrO_2$), and the like, or oxide ceramics having the perovskite structure such as $SrVO_3$, $CaVO_3$, $LaTiO_3$, $SrMoO_3$, $CaMoO_3$, $SrCrO_3$, $CaCrO_3$, $LaVO_3$, $GdVO_3$, $SrMnO_3$, $CaMnO_3$, $NiCrO_3$, $BiCrO_3$, $LaCrO_3$, $LnCrO_3$, $SrRuO_3$, $CaRuO_3$, $SrFeO_3$, $BaRuO_3$, $LaMnO_3$, $LnMnO_3$, $LaFeO_3$, $LnFeO_3$, $LaCoO_3$, $LaRhO_3$, $LaNiO_3$, $PbRuO_3$, $Bi_2Ru_2O_7$, $LaTaO_3$, $BiRuO_3$, and the like, and further $LaB_6$.

Similarly to the first embodiment, it is possible to add an aluminum compound or lead compound to the fine particle material or cover the fine particle material with the aluminum compound or lead compound in the present embodiment. In the present embodiment, too, a dense resistance film is obtained in the case the resistance film has the film thickness of 5 μm-1 mm.

THIRD EMBODIMENT

Figure 5:
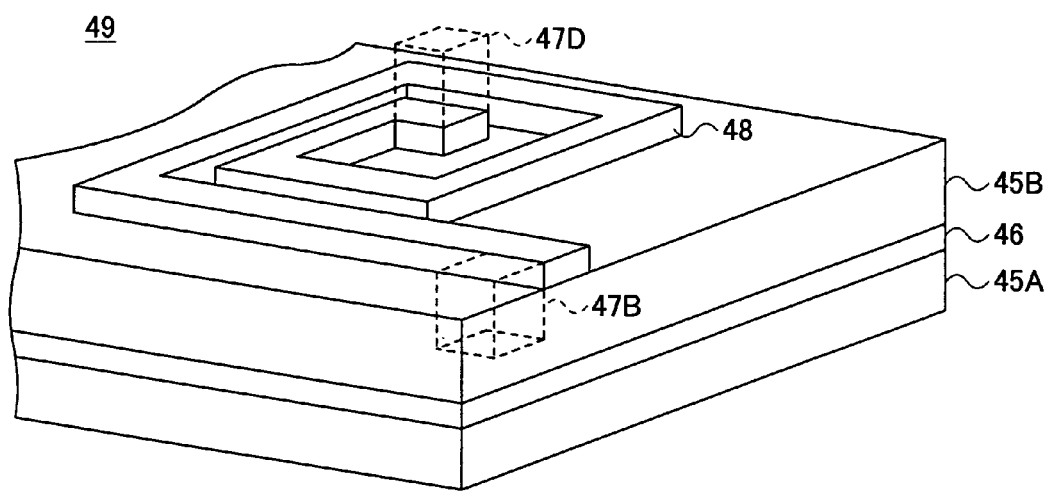
FIG. 5 is a perspective exploded diagram showing a circuit substrate according to a third embodiment of the present invention.
Figure 6:
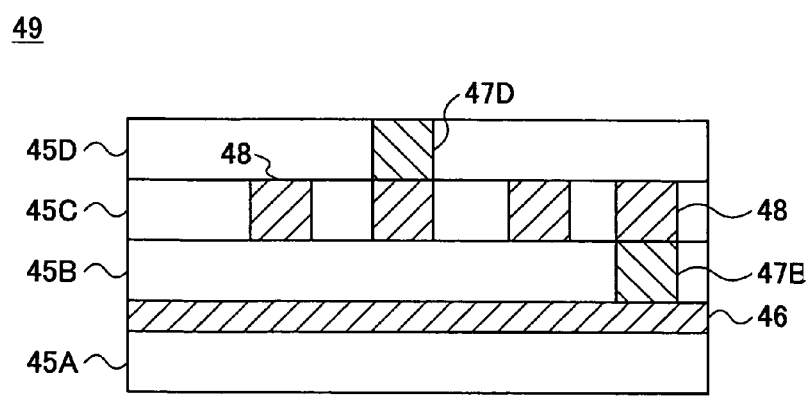
FIG. 6 is a cross-sectional view of the circuit substrate according to the third embodiment.

FIG. 5 is an exploded diagram showing a circuit substrate 44 according to a third embodiment of the present invention, while FIG. 6 is a cross-sectional diagram the circuit substrate 44.

Referring to FIGS. 5 and 6, the circuit substrate 44 of the present invention is formed of laminated insulation layers 45A-45D, a conductor film 46 formed on the insulation layer 45A, an inductor element 48 of a conductive material formed selectively on the insulation layer 45C with a the spiral pattern, and interconnection layers 47B and 47D connecting the conductor film 46 and the inductor element 48 or the inductor element 48 and other conductor films (not shown) electrically.

Similarly to the first and second embodiments, the insulation layers 45A-45D are formed of an organic or inorganic insulation layer such as epoxy resin insulation layer, polyimide insulation layer, and the like.

The inductor element 48 is formed of a conductive material of Cu having a thickness of 200 nm. More specifically, the inductor element 48 is formed by a pattern having a thickness of 50 nm-50 μm and a line width of 5-500 μm such that the inductor element 48 has an area of 40000 μm$^2$-1 mm$^2$.

One feature of the present embodiment is that the inductor element 48 and also the conductor film 46 are formed by the AD process. For the conductive material that can be used for the AD process, the metallic materials including Ag, Au, Pt, Pd, Al or an alloy of these elements are listed in addition to Cu. The fine particles of the conductive material are prepared to have an average diameter of 10 nm-1 μm, wherein the foregoing fine particle material may be added with or coated with an aluminum compound or a lead compound, similarly to the first embodiment.

In the AD process., it is possible to use an inert gas such as argon gas, helium gas, neon gas, nitrogen gas for the carrier gas. Further, it is possible to use a reducing gas such as a mixed gas of hydrogen and the inert gas. With this, the oxidation of the fine particle material is prevented and hence the increase of specific resistance of the conductor film 46 thus deposited.

The inductor element 48 is formed by patterning a resist film formed on the insulation layer 45B, followed by depositing the fine particles of the conductive material similarly to the first embodiment by the AD process and then lifting off the resist. Further, the conductor film 46 is formed selectively or such that the conductor film 46 covers the entire insulation layer.

According to the present embodiment, it becomes possible to form the inductor element 48 and the conductor film 46 easily by using the AD process, without using complicated process as in the case of the plating process, which includes a large number of steps. Particularly, in the case of forming a film with the film thickness of several microns, the process time is shorter than the case of using a sputtering process, in view of the film formation rate of 5 μm/second-50 μm/second in the case of the AD process, and it is possible to reduce the process time.

In the present embodiment, it is also possible to use, in addition to the spiral inductor element 19 having a spiral form, it is possible to use a meander inductor element, and the like. Also, it is possible that the fine particles are added with or covered with the aluminum compound or lead compound as explained in the first embodiment. With this, it is possible to increase the film thickness similarly to the case of the dielectric film.

Furthermore, it is possible to form a passive element such as filter, antenna, and the like, by using the dielectric film, the resistance film and also the conductor film explained with reference to the first through third embodiments.

Hereinafter, examples of the present invention will be explained with reference to the drawings.

EXAMPLE 1

Figure 7:
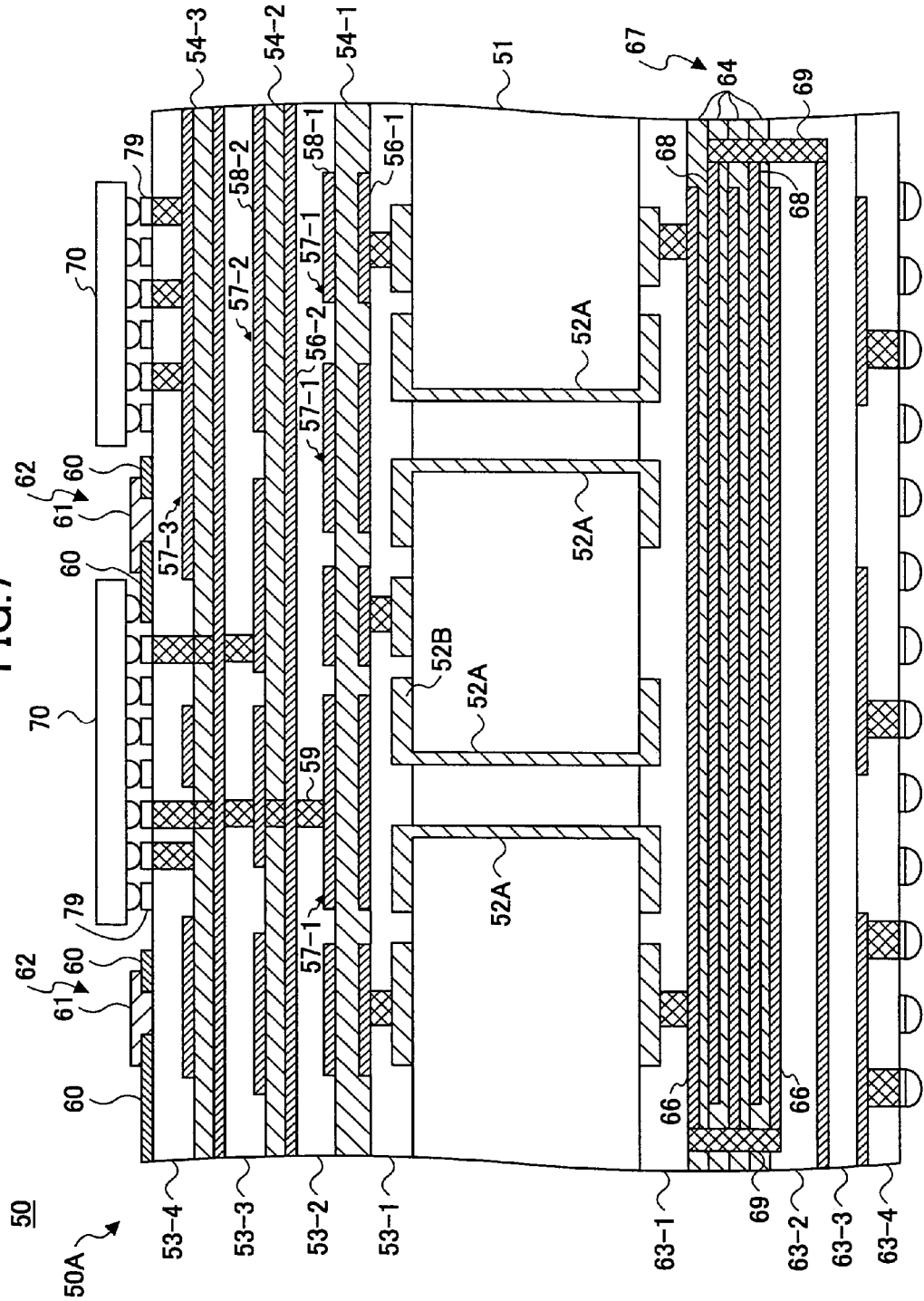
FIG. 7 is a cross-sectional diagram of an electron device having a circuit substrate according to Example 1 of the present invention.

FIG. 7 is a cross-sectional diagram showing a general construction of an electron device having a circuit substrate 50A according to Example 1.

Referring to FIG. 7, the circuit substrate 50A is formed of: a base substrate 51, which in turn is formed of a FR-4 substrate carrying thereon copper plating layers at both sides thereof and formed with through-holes 52A and a conductor layer 52B; insulation layers 53-1-53-4 formed on one of the principal surfaces of the base substrate 51; capacitors 57-1-57-3 formed by sandwiching dielectric films 54-1-54-3 disposed between the insulation layer 53-1-53-4 by any of the lower electrode layers 56-1-56-3 and any of the upper electrode layers 58-1-58-3; a capacitor 67 formed on the other principal surface of the base substrate 51 and including therein repetition of a first electrode layer 66/a dielectric film 64/a second electrode layer 68/a dielectric film 64; and a resistance element 62 having a resistance film 61 formed on the surface of the circuit substrate 50A, wherein the electron device 50 is formed of the circuit substrate 50A and a LSI 70 mounted on the surface of the circuit substrate 50A.

Here, the primary feature of the electron device 50 of Example 1 is that the dielectric films 54-1-54-3 and 64 and the resistance film 61 of the circuit substrate are formed by an AD process.

FIGS. 8A-8H are the diagrams showing the fabrication process of a circuit substrate according to Example 1.

Figure 8A:
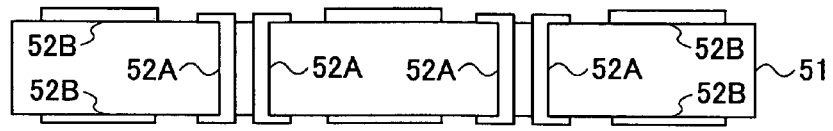
FIGS. 8A-8H are the diagrams showing the fabrication process of a circuit substrate according to Example 1.
Figure 8B:
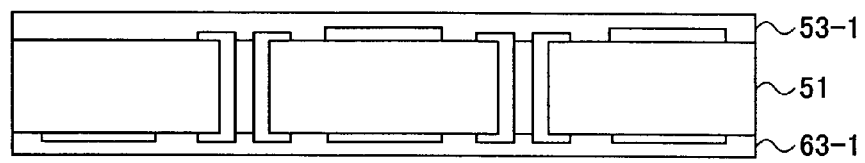

Referring to FIG. 8A, there is provided a FR-4 substrate carrying Cu plating layers at both surfaces thereof as the base substrate 51, and next, in the step of FIG. 8B, a pair of epoxy resin sheets (ABF-SH-9K provided by the Ajinomoto Co., Inc.) having a thickness of 50 μm are adhered to both sides of the base substrate 51 as the insulation layers 53-1 and 63-1.

Figure 8C:
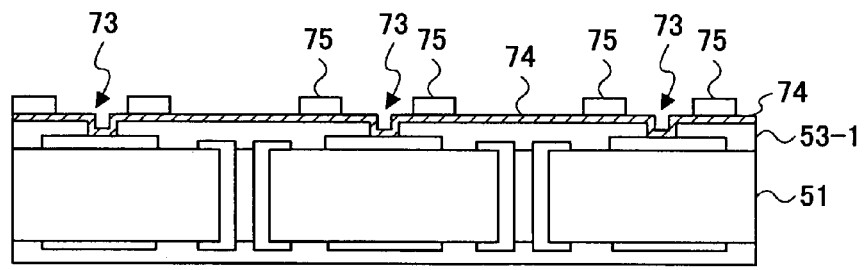

Next, in the step of FIG. 8C, a desmear protection film (NIT215 provided by Nichigo-Morton Co. Ltd.) and having a film thickness of 40 μm is laminated on the surface of the insulation layer 53-1 on one of the surfaces of the structure of FIG. 8B, with a press roll temperature of 105° C. and a line pressure of 4 kg/cm, and a desmear protection film (not shown) covering the entire surface is obtained.

Next, in the step of FIG. 8C, a laser beam is irradiated to the surface of the insulation layer 53-1 through the desmear protection film with the energy of 3 mW by using a UV-YAG laser, and a via-hole with the diameter of about 50 μm is obtained.

Next, the substrate is introduced to the oxygen plasma apparatus and processed for 5 minutes with the power of 500 W under the oxygen pressure of 0.15 mPa, followed by immersing the substrate in a TMAH solution of 5% concentration for removing the desmear protection film. After washing and drying, a substrate having via-plugs 73 is obtained.

As a result of the examination of the cross-section and the SEM observation of the surface, it was confirmed that the via-plugs 73 are free form residues at the bottom part and that the surface state of the insulation layer 53-1 does not change from the surface state at the beginning of the film formation and that there is no increase of surface irregularity.

In the step of FIG. 8C, a seed layer 74 for plating of a Cu film is formed so as to cover the surface of insulation layer 53-1 where the via-plugs 73 are formed by a non-electrolytic plating process, and a dry film resist (NIT215 provided by Nichigo-Morton Co. Ltd.) having a thickness of 40 μm is laminated on the surface of the seed layer 74 as the resist film 75 at the press roll temperature 105° C. and the line pressure of 4 kg/cm.

Next, an interconnection pattern is exposed by using a parallel ultraviolet beam of entire wavelength, followed by a developing process conducted by using a sodium carbonate aqueous solution of 1 wt % by a spraying process, and a resist film 75 patterned according to the interconnection pattern is obtained.

Figure 8D:
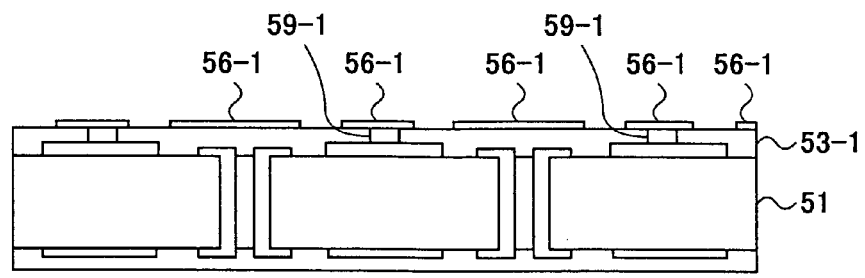

Next, in the step of FIG. 8D, the lower electrode layer 56-1 is formed by an electrolytic plating process, and after removing the resist film 75, the part of the seed layer other than the lower electrode layer 56-1 is removed by panel etching. Here, an aqueous solution of hydrogen peroxide and sulfuric acid is used for the etchant.

Figure 8E:
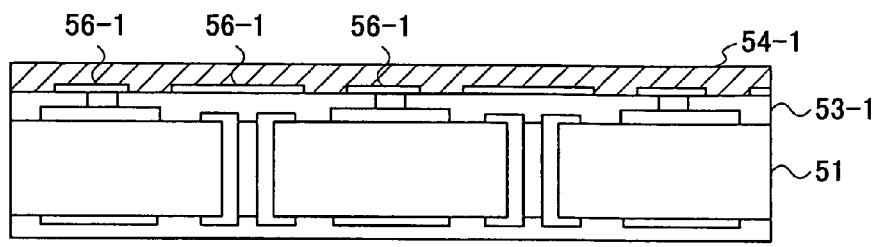

Next, in the step of FIG. 8E, the surface of the structure of FIG. 8D is processed so as to be covered by aluminum isopropoxide, which is a kind of aluminum alkoxide, followed by a film formation process conducted by an AD process for six minutes by using a $TiO_2$ fine particle material having an average diameter of 0.3 μm (provided by Tayca Corporation) and covered with an $Al_2O_3$ film baked at 1000° C. in the atmosphere (referred to hereinafter as "alumina coating treatment"). Thereby, a $TiO_2$ film 54-1 containing $Al_2O_3$ is formed with a thickness of 10 μm. Here, the ratio of the $TiO_2$ fine particle material to the $Al_2O_3$ film is set to 95:5 in terms of the mass.

Figure 8F:
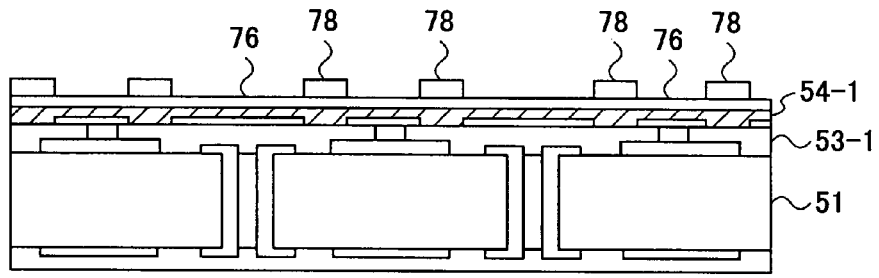

Next, in the step of FIG. 8F, a seed layer 76 is formed so as to cover the surface of the $TiO_2$ film 54-1, and a resist film 78 is formed by laminating a dry film resist (NIT215 provided by Nichigo-Morton Co. Ltd.) with the film thickness of 40 μm at the press roll temperature of 105° C. under the line pressure of 4 kg/cm.

Next, the interconnection pattern is exposed by using a parallel ultraviolet beam of all the wavelengths, followed by a developing process conducted by a spraying process that uses an aqueous solution of 1 wt % sodium carbonate. With this, a resist film 78 patterned according to the interconnection pattern is obtained.

Figure 8G:
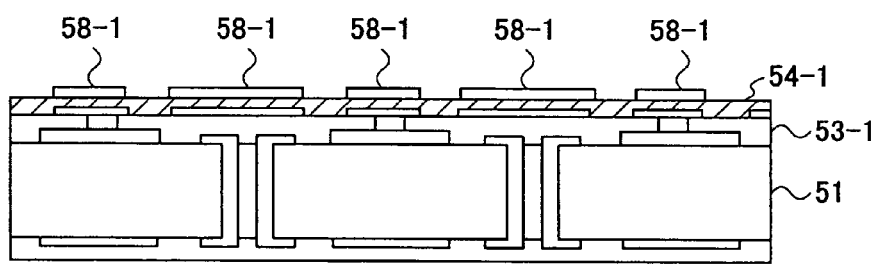

Next, in the step of FIG. 8G, the upper electrode layer 58-1 of Cu is formed by an electrolytic plating process. Next, the resist film 78 is removed, and the seed layer 76 is further removed by a panel etching process (in the drawing, illustration of the seed layer 76 underneath the upper electrode layer 58-1 is omitted).

Figure 8H:
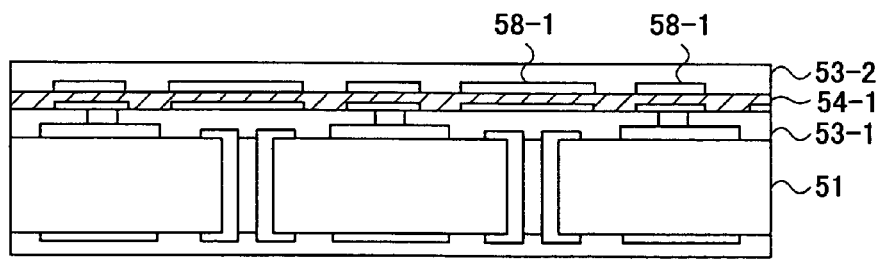

Next, in the step of FIG. 8H, an epoxy resin sheet (ABF-SH-9K provided by Ajinomoto Co., Inc.) having a thickness of 50 μm is adhered to the surface of the structure of FIG. 8G as the insulation layer 53-2.

Referring back now to FIG. 7, a same process is conducted and there is formed a multilayer structure in which the insulation layers 53-1-53-4 and dielectric films 54-11-54-3 are laminated alternately. Furthermore, wiring 59 such as the via-holes is formed between the lower electrode layer 56 and the upper electrode layer 58.

Further, there are formed a seed layer (not illustrated) and the first electrode layer 66 on the insulation layer 63-1, which is formed on the other principal surface of the base substrate 51, respectively by a non-electrolytic plating process and an electrolytic plating process.

Next, a dielectric film 64 having the film thickness of 3 μm is formed on the first electrode layer 66 by an AD process while using the fine particle material similar to one used for forming the dielectric film 54-1.

Further, the second electrode layer 68 and the dielectric film 64 are formed similarly to the first electrode layer.

Furthermore, by forming the first electrode layer 66/the dielectric film 54-1/the second electrode layer 68/the dielectric film 54-1/the first electrode layer 66, and further by forming the via-holes 69A and 69B connecting the first electrode layers 66 with each other or the second electrode layers 68 with each other, there is formed a capacitor 67 of large capacitance.

Further, after laminating a dry film resist on the surface of circuit substrate 50A as a resist film, the resistance pattern is exposed and developed, and film formation is conducted for 30 minutes by an AD process while using a $RuO_2$ powder having an average diameter of 0.01 μm (provided by Kojundo Chemical Laboratory Co., Ltd.), and a resistance film 61 is formed between the electrodes 60 with the thickness of 50 μm. Further, by removing the resist film, the resistance element 62 is formed.

Further, the electrode 79 is formed on the surface of the circuit substrate 50A, and the entire structure of the circuit substrate 50A is unified and bonded by using a vacuum lamination press. For example, the lamination process is conducted under the pressure of 60 Torr or less at the temperature of 180° C. for the duration of 70 minutes under the condition of the line pressure of 30 kg/cm.

As a result of examination of the cross-sectional surface, it was confirmed that the circuit substrate has an excellent multilayer structure. Further, by forming the surface overcoat layer by using a screen printing process and photolithographic process, and further by soldering an electronic component such as LSI 70 on the surface of the circuit substrate 50A, the circuit substrate and also the electron device shown in FIG. 7 is formed as Example 1 of the present invention.

Thus, the electron device of Example 1 can realize the desired multilayer structure easily by forming the capacitors 57-1-57-3, 67 in the insulation layers, and it becomes possible to form a capacitor of large capacitance. Thereby, it becomes possible to reduce the number of the capacitors mounted on the surface of circuit substrate 50A, while this leas to increase of the number of the active elements such as the LSI 70 that can be mounted of the circuit substrate and at the same time downsizing of the circuit substrate. Associated with the construction of arranging the active elements with reduced separation, the electron device can perform at higher operational speed.

EXAMPLE 2

In Example 2, the dielectric films 54-1-54-3, 64 of Example 1 is deposited by the AD process for 6 minutes while using a $BaTiO_3$ fine particle material having an average diameter 0.1 μm (provided by SAKAI CHEMICAL INDUSTRY CO., LTD.) as the source material, wherein the $BaTiO_3$ fine particle is treated with the alumina coat treatment. Thereby, a $BaTiO_3$ film containing $Al_2O_3$ is formed with the thickness 10 μm. Otherwise, Example 2 is conducted similarly to Example 1.

EXAMPLE 3

In Example 3, the dielectric films 54-1-54-3, 64 of the Example 1 is deposited by the AD process for 6 minutes while using the Al2O3 fine particle material having an average diameter of 0.2 μm (provided by Kojundo Chemical Laboratory Co., Ltd.) as the source material. Thereby, an $Al_2O_3$ film 54-1 having a thickness 10 μm is formed. Otherwise, Example 3 is identical to Example 1.

EXAMPLE 4

In Example 4, the dielectric films 54-1-54-3, 64 of Example 1 are deposited by the AD process for 6 minutes while using a $TiO_2$ fine particle material with an average diameter of 0.3 μm (provided by Tayca Corporation) as the source material. Thereby, the $TiO_2$ film 54-1 is formed with the thickness 10 μm. Otherwise, Example 4 is identical to Example 1.

EXAMPLE 5

The circuit substrate of Example 5 has a capacitor in the base substrate formed by laminating insulation layers of a resin material, wherein the capacitor includes a dielectric film formed by using the AD process. Further, the resistance element formed on the surface of the circuit substrate has a resistance film formed by using an AD process.

FIG. 9 is a cross-sectional diagram showing the general construction of an electron device 80 having a circuit substrate according to Example 5.

Referring to FIG. 9, the circuit substrate 80A is formed of: a base substrate 80B in which insulation layers 81-1-81-4 each including therein a built-in capacitor 87 and prepregs 85-1-85-4 are laminated alternately and in which the capacitors 87 are connected parallel by through-holes 86; insulation layers 53-1-53-4 formed on the base substrate 80B; and a resistance element 92 formed on the surface of the circuit substrate 80A. Thereby, the electron device 80 is formed of the circuit substrate 80A and a LSI 70 is mounted on the surface of the circuit substrate 80A.

It should be noted that each of the capacitors 87 is formed of: any of the lower electrode layers 82-1-82-4 formed selectively on the insulation layers 81-1-81-4; one of the dielectric films 83-1-83-4 covering one of the insulation layers 81-1-81-4 and also one of the lower electrode layers 82-1-82-4; and one of the upper electrode layers 84-1-84-4 provided on the corresponding dielectric films 83-1-83-4 so as to oppose the corresponding lower electrode layers 82-1-82-4. Further, the resistance element 92 is formed of a resistance film 93 and the electrodes 60 formed at both ends of the resistance film 93.

Hereinafter, the fabrication process of the circuit substrate 80A will be explained.

First, a FR-4 substrate carrying a copper layer at one side is prepared such that the substrate is formed with the insulation layer 81 and further with the conduction layer for the lower electrode layer 82, and the lower electrode layer 82 is formed by etching the copper film of the substrate surface.

Next, by using a $BaTiO_3$ powder having an average diameter of 0.3 μm (provided by SAKAI CHEMICAL INDUSTRY CO., LTD.) and processed with the alumina coat treatment, a $BaTiO_3$ film is deposited by an AD process for 6 minutes, and thus, the $BaTiO_3$ film 83 containing $Al_2O_3$ is formed so as to cover the insulation layer 81 and further the lower electrode layer 82 with the thickness of 10 μm.

Next, the upper electrode layer 84 opposing the lower electrode layer 82 is formed on the dielectric film 83 by the method similar to the-method explained in Example 1, and with this, the capacitors 87 are formed.

Next, four such insulation layers 81 each formed with the capacitor 87 are prepared, and the insulation layers 81 thus prepared are laminated in the state that a prepreg 85 is interposed between adjacent insulation layers 81 by applying heat at the temperature of 80° C. under the line pressure of 4 kg/cm. Further, by drilling the through-holes and conducting electroplating process, a base substrate for a build-up substrate and including build-in capacitors 87 of large capacitance is obtained.

Next, epoxy resin sheets (ABF-SH-9K provided by Ajinomoto Co., Inc.) having a thickness of 50 μm are attached to both sides of the base substrate as the insulation layers 53-1-53-4, and with this, the electrodes 79 are formed on the wiring patterns 89-91 at the surface of the circuit substrate 80A.

After this, electronic components such as the LSI 70 are soldered on the surface of the circuit substrate 80A, and the electron device 80 having the circuit substrate 80A according to Example 5 shown in FIG. 9 is obtained.

According to the present embodiment, it becomes possible for build in a capacitor of large capacitance in the base substrate 80B. Also, it becomes possible to form a capacitor also on the base substrate 80B, and thus, it becomes possible to increase the electrostatic capacitance per unit area of the circuit substrate or so-called electrostatic capacitance density as compared with Examples 1-4. Further, the degree of freedom of wiring formed on the base substrate 80B is increased as compared with Examples 1-4.

EXAMPLE 6

The circuit substrate of Example 6 relates to a flexible substrate in which insulation layers of polyimide are laminated in which the capacitor formed between the insulation layers has a dielectric film formed by an AD process and the resistance element formed on the surface of the circuit substrate includes a resistance film formed by an AD process.

Figure 10:
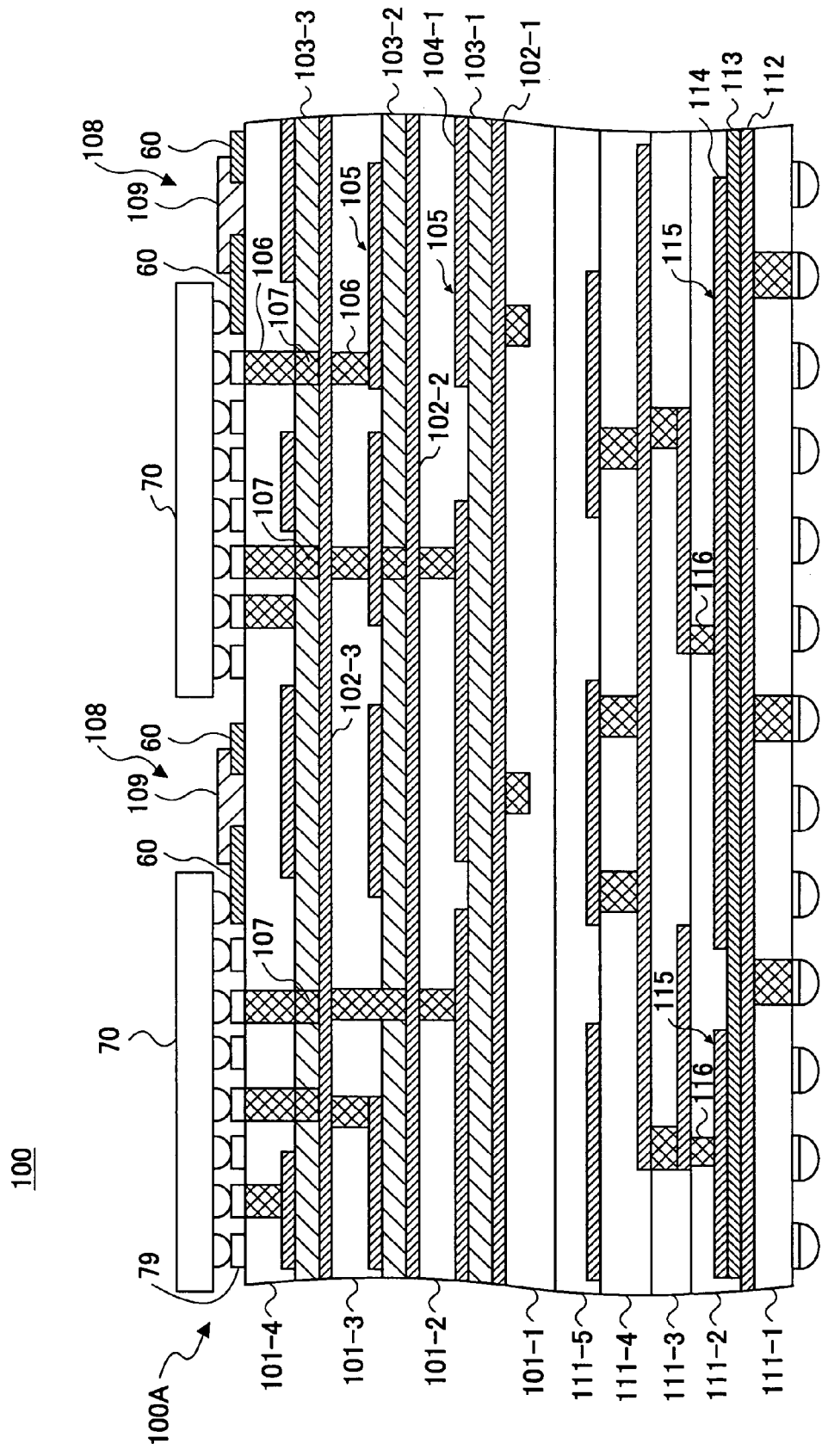
FIG. 10 is a cross-sectional diagram showing an electron device having a circuit substrate according to Example 6 of the present invention.

FIG. 10 is a cross-sectional diagram showing a general construction of an electron device 100 having a circuit substrate of Example 6.

Referring to FIG. 10, the circuit substrate 100A includes: capacitor 105 or 115 formed between any of the insulation layers 101-1-101-4 of polyimide or between any of the insulation layers 111-1-111-2 of polyimide; and a resistance element 108 formed on the surface of the circuit substrate 100A. Thereby, the electron device 100 is formed of the circuit substrate 100A and the LSI 70, and the like, mounted on the surface of the circuit substrate 100A.

It should be noted that each of the capacitors 105 is formed by: any of the lower electrode layers 102-1-102-3 formed so as to cover the corresponding insulation layers 101-1-101-3; one of the dielectric films 103-1-103-3 covering one of the insulation layers 101-1-101-3 and also one of the lower electrode layers 102-1-102-3; and one of the upper side electrode layers 104-1-104-3 formed selectively on a corresponding dielectric film, wherein the capacitors 105 are connected electrically by via-holes 106.

Further, the capacitor 115 is formed of a lower electrode layer 112 formed selectively or so as to cover an insulation layer 111-1, a dielectric film 113 covering the insulation layer 111 and the lower part electrode layer 112, and an upper electrode layer 114 formed selectively on the dielectric film 113, wherein the capacitor 115 is connected to other wiring electrically by the via-holes 116, and the like.

Further, the resistance element 108 is formed of a resistance film 109 and electrodes 60 formed at both ends of the resistance film 109.

The electron device 100 having the circuit substrate 100A of Example 6 has the primary feature in that the insulation layer is formed by polyimide and that the dielectric films 103-1-103-3 and 113, and also the resistance film 109, are made of an oxide ceramic film formed by the AD process.

Figure 11A:
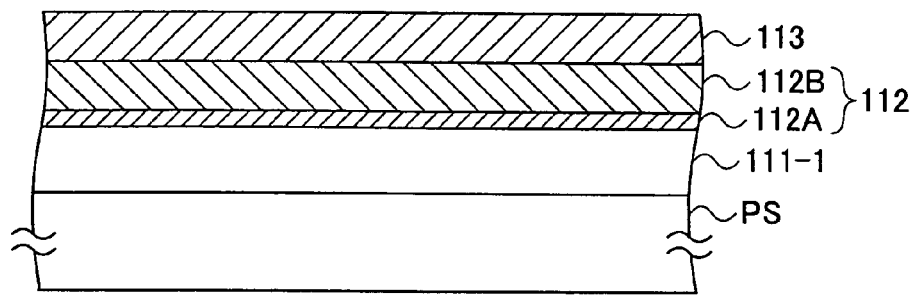
FIG. 11A-11C are the diagrams showing a part of the fabrication process of the circuit substrate of Example 6.
Figure 11B:
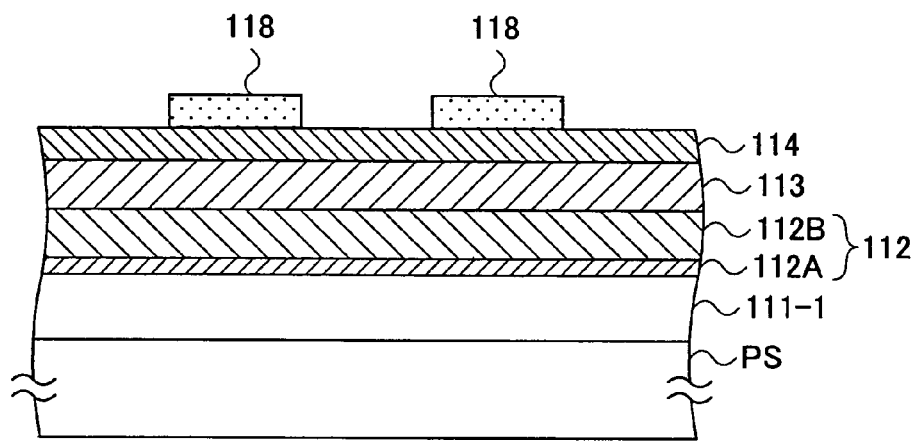
Figure 11C:
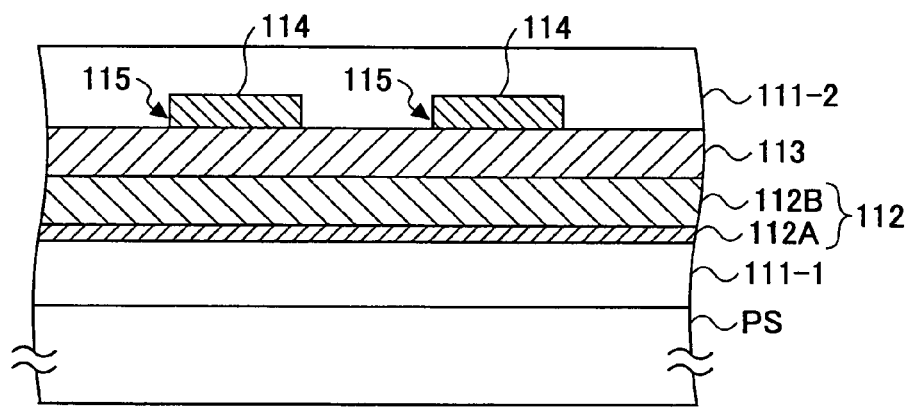

Hereinafter, the fabrication process of the circuit substrate 100A will be explained with reference to FIGS. 11A-11C, wherein FIGS. 11A-11C are the diagrams showing a part of the fabrication process of the circuit substrate of Example 6.

In the step of FIG. 11A, a process substrate PS for processing of Pyrex (trade mark) glass is used, and a non-photosensitive polyimide film 111-1 is formed on the surface of the process substrate PS with the thickness of about 10 μm by a spin coating process. Here, it should be noted that the formation of the polyimide film 111-1 may be conducted by any of screen printing process, spraying process, curtain coat process, roll coat process, dipping process, in addition to the spin coating process.

In the process of FIG. 11A, the polyimide film formed on the process substrate is dried at the temperature of 80° C. for 30 minutes and is cured by heating for 30 minutes under the condition of 350° C. With this, the insulation layer 111-1 is formed. The insulation layer 111-1 thus formed is then planarized by conducting polishing by a CMP (chemical mechanical polishing) process.

In the step of FIG. 11A, a seed layer 112A for plating process is formed further on the surface of the insulation layer 111-1. More specifically, a seed layer 112A is formed on the surface of the insulation layer 111 by a sputtering process with the thickness 200 nm.

In place of the sputtering process, it is also possible to form the seed layer by a non-electrolytic plating process after roughening the surface of the insulation layer by a permanganic acid, followed by a catalyst processing.

Next, a Cu film 112B is formed with the thickness of about 5 µm on the surface of the seed layer 112A by the electrolytic plating process, and with this, the lower electrode layer 102 is formed.

In the step of FIG. 11A, a $BaSrTiO_3$ film 113 containing $Al_2O_3$ is formed further on the lower electrode layer 112 with the thickness 10 µm by conducting an AD process for 6 minutes while using the $BaSrTiO_3$ powder having an average diameter 0.1 µm (provided by Kojundo Chemical Laboratory Co., Ltd.) after processing with the alumina coat treatment.

Next, in the step of FIG. 11B, a conductor stack formed of Cr/Cu (not shown) is deposited on the dielectric film 113 by a sputtering process, and an upper electrode layer 114 of Cu is formed thereon by an electrolytic plating process with the thickness of about 5 µm. Further, a resist film 118 is applied to the surface of the upper electrode layer 114 with the thickness of about 10 µm, and an exposure process is conducted by a mercury lamp with the dose of 400 MmJ/cm$^2$ in the state a glass mask is placed. Further, the exposed part is removed by dissolving by using an alkaline developer.

Next, in the step of FIG. 11C, the upper side electrode layer 114 is subjected to an etching process while using the resist film 118 as a mask, and as a result, the upper electrode layer 114 is patterned. With this, the capacitor 115 including the dielectric film 113 sandwiched between the lower electrode layer 112 and the upper electrode layer 114 is formed.

After this, the insulation layers 111-2-115 are formed. Further, according to a similar process, the capacitors 105 are formed such that the capacitors 105 have the dielectric films 103-1-103-3 formed by an AD process.

Further, via-plugs 107 are formed in dielectric film 103 by forming a resist film on the dielectric film 103, patterning the resist film, forming a via hole (not shown) by etching the dielectric film 103 by a hydrofluoric acid, and the like, forming a seed layer of plating process by the non-electrolytic plating process mentioned above, and growing a placing film on the seed layer by conducting an electrolytic plating process. Furthermore, it is also possible, after formation of the upper electrode layer 104 and the insulation layer 101 on the dielectric film 103, to form a via-hole penetrating these layers so as to expose the dielectric film beforehand and conduct etching of the dielectric film 104 thereafter.

With the above, the circuit substrate thus formed is detached from the Pyrex (trade mark) glass substrate in the form of a film.

Further, a resist film is patterned on the surface of the circuit substrate 10A, and the resistance film 109 is formed by an AD process.

More specifically, the AD process is conducted for 30 minutes by using $SrRuO_3$ fine particles having an the average diameter 0.01 µm (provided by Kojundo Chemical Laboratory Co., Ltd.), and an $SrRuO_3$ film is formed with the thickness 50 µm.

Further, by soldering the electronic components such as the LSI 70, and the like, the electron device 100 having the circuit substrate 100A of Example 6 shown in FIG. 10 is obtained.

According to the present embodiment, it is not only possible to form the capacitor 115 directly on the process substrate PS as in the conventional art but it becomes also possible to form the capacitors 105 between the laminated insulation layers 101-1-101-4 of polyimide. Thereby, it becomes possible to form the capacitor of larger capacitance as compared with the conventional art.

EXAMPLE 7

In Example 7, the AD process is conducted for 6 minutes by using a $Ba_2Ti_9O_{20}$ fine particle material having an average diameter of 0.3 µm (provided by Kojundo Chemical Laboratory Co., Ltd.) processed with the alumina coat treatment, and the dielectric films 103-1-103-3 and 113 of Example 6 are obtained in the form of a $Ba_2Ti_9O_{20}$ film having a thickness of 10 µm and containing $Al_2O_3$. Otherwise, Example 7 is similar to Example 6.

EXAMPLE 8

The circuit substrate of Example 8 has the feature that insulation layers of photosensitive polyimide are laminated on a Si substrate, the capacitor formed between the insulation layers have a dielectric film formed selectively by an AD process, and the resistance element formed on the surface of the circuit substrate has a resistance film formed by an AD process.

Figure 12:
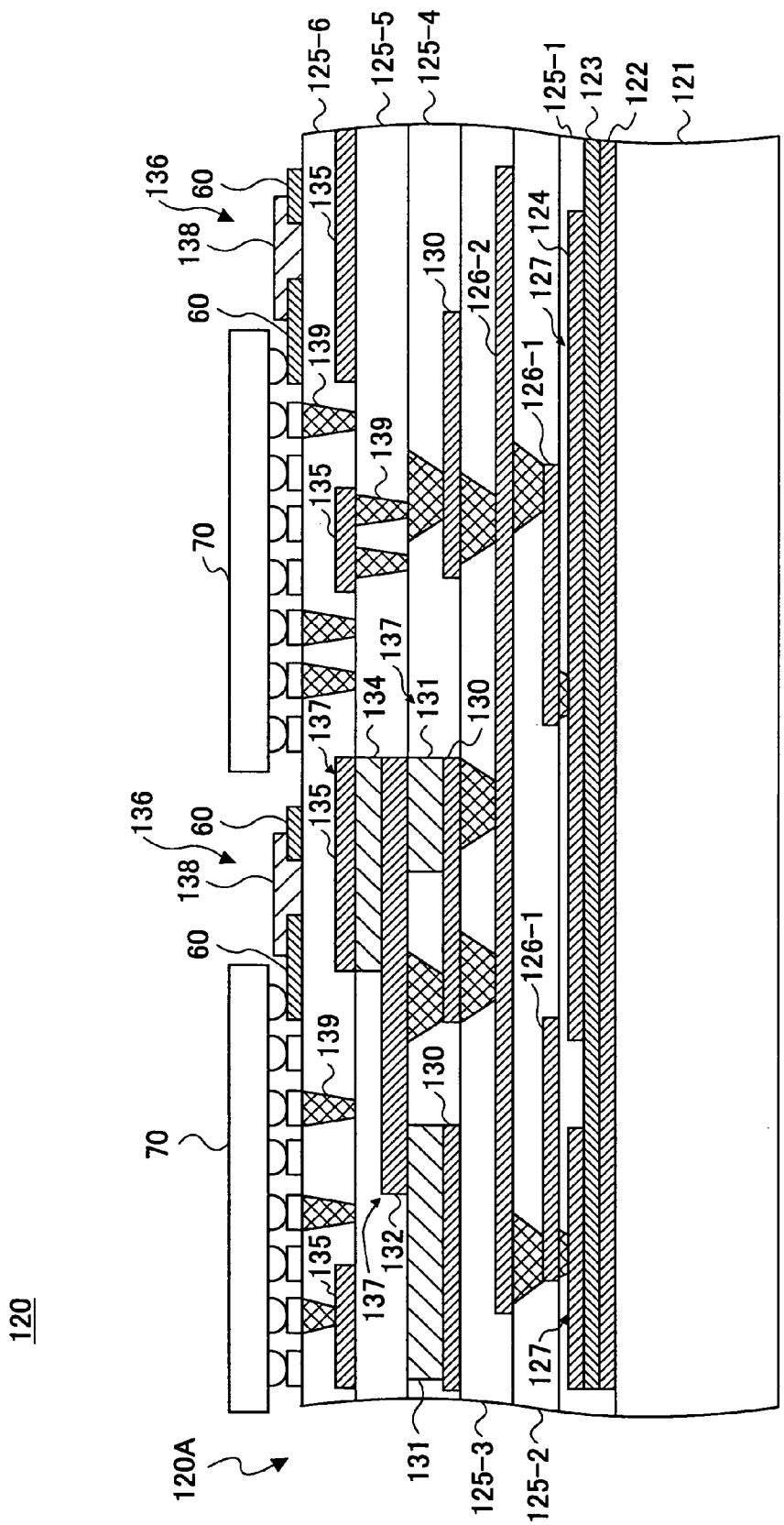
FIG. 12 is a cross-sectional diagram of an electron device having a circuit substrate according to Example 8 of the present invention.

FIG. 12 is a cross-sectional diagram showing a schematic construction of an electron device 120 having a circuit substrate according to Example 8.

Referring to FIG. 12, the circuit substrate 120A is formed of insulation layers 125-1-125-4 of photosensitive polyimide, capacitors 137 having a dielectric film 131 or 134 formed in any of the insulation layers 125-4 and 125-5 selectively, a capacitor 127 formed on a base substrate 121, resistance elements 136 formed on a surface of the circuit substrate 120A, and the like. Thereby, the electron device 120 is formed of a circuit substrate 120A, a LSI 70 mounted on the surface of circuit substrate 120A, and the like.

Each of the capacitors 137 is formed of: a conductive layer 130 formed selectively on an insulation layer 125-3; a dielectric film 131 formed on the conductive layer 130; an insulation layer 125-4 burying the dielectric film and a conductive layer 132 formed on the dielectric film; a dielectric film 134 formed selectively on the conductive layer 132; and an insulation layer 125-5 burying the dielectric film 134 and a conductive layer 135 formed selectively on the dielectric film.

Here, it should be noted that the dielectric films 131 and 134 of the capacitors 137 are formed by the AD process selectively, and thus not in the form of a continuous, non-patterned film. Such a dielectric film can be formed by using a patterned resist film as a mask at the time of film formation by the AD process. With the AD process, collision of the fine particles upon the resist film surface at the time of depositing the fine particles does not cause melting of the resist film or deformation of the mask pattern.

Hereinafter, the fabrication process of the circuit substrate 120A will be explained.

First, the capacitor 127 is formed on the Si substrate 121 according to a process similar to the one explained with reference to Example 6.

Further, the insulation layers 125-1-125-6 are formed by a photosensitive polyimide insulation film.

More specifically, an insulative photosensitive polyimide (product name VR5100 of TORAY INDUSTRIES) is applied by a spin coating process with the thickness of about 30 μm, followed by a drying process for 30 minutes at the temperature of 80° C.

In the case of forming via-plugs 139 in the insulation layer 125-5, the insulation layer 125-5 is patterned by exposure and developing process in this stage, and formation of via-holes is made.

Next, the resin layers are cured by heating at 350° C. for 30 minutes, and as a result, the insulation layers 125-1-125-3 are formed.

Further, a seed layer is formed in the via-holes by non-electrolytic plating process, and via-plugs 139 are formed by filling the via-holes with a Cu film by way of electrolytic plating process.

Further, the dielectric films 131 and 137 are formed by a $BaTi_4O_9$ film containing $Al_2O_3$ and having a thickness of 10 μm by an AD process for 6 minutes while using a patterned resist film as a mask. In the AD process, a $BaTi_4O_9$ fine particle material having an average diameter of 0.1 μm (provided by Kojundo Chemical Laboratory Co., Ltd.) is used with alumina coat treatment.

Further, a dry film resist is laminated on the surface of circuit substrate 120A as a resist film, and the dry resist film is patterned according to the resistance pattern to be formed, by conducting exposure and developing process. Further, an AD process is conducted for 30 minutes by using $BiRuO_3$ particles having an average diameter of 0.01 μm (provided by Kojundo Chemical Laboratory Co., Ltd.) as the source material, and a resistance film 138 is formed between electrodes 60 with the thickness 50 μm.

Thereafter, the resist film is removed and the resistance element 136 is obtained.

According to Example 8, it becomes possible to form the dielectric films 131 and 134 and also the resistance film 138 in or on the insulation layers 125-1-125-4 of photosensitive polyimide, by using the AD process.

EXAMPLE 9

Example 9 is similar to Example 8 except that the dielectric films 123, 131 and 134 of Example 8 are formed by a $BaSrTiO_3$ film having a thickness of 10 μm by conducting an AD process for 6 minutes while using a fine particle material of $BaSrTiO_3$ having an average diameter of 0.1 μm (provided by Kojundo Chemical Laboratory Co., Ltd.) after processing by the alumina coat treatment.

EXAMPLE 10

Example 10 is similar to Example 8 except that the dielectric films 123, 131 and 134 of Example 8 are formed as a mixture film of $BaSrTiO_3$ and $PbZrTiO_3$ with the thickness of 10 μm by conducting an AD process for 6 minutes while using a mixture of a $BaSrTiO_3$ fine particle material and a $PbZrTiO_3$ fine particle material having an average diameter of 0.1 μm (both provided by Kojundo Chemical Laboratory Co., Ltd.) with a proportion of 93:7 ($BaSrTiO_3$:$PbZrTiO_3$=93:7).

EXAMPLE 11

In Example 11, there is provided a circuit substrate that uses the casing of an electron device as a base substrate. In Example 11, a casing formed of magnesium coated with an epoxy resin is used.

Figure 13:
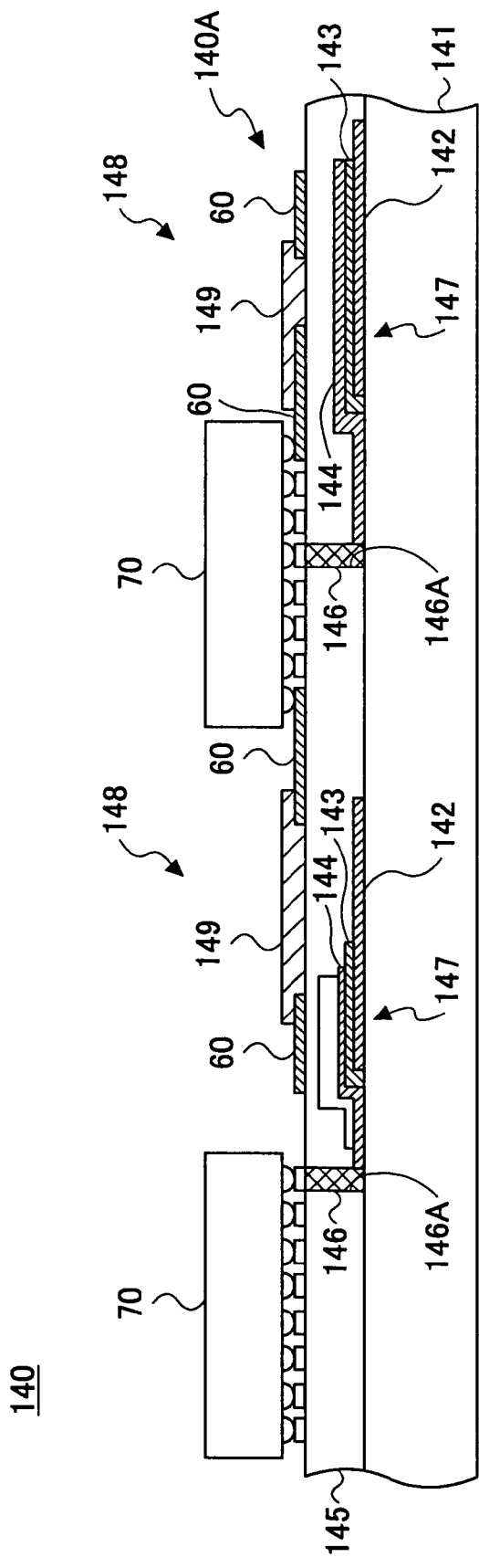
FIG. 13 is a cross-sectional diagram of an electron device having a circuit substrate according to Example 11 of the present invention.

FIG. 13 is a cross-sectional diagram showing the general construction of the electron device having a circuit substrate according to Example 11.

Referring to FIG. 13, the circuit substrate 140A is formed of a base substrate 141 constituting the casing of the electron device, a capacitor 147 formed on the base substrate 141, an insulation layer 145 covering the base substrate 141 and the capacitor 147, a resistance element 148 formed on the surface of the circuit substrate 140A, and the like. Thereby, the electron device 140 is formed of the circuit substrate 140A, an LSI 70 mounted on the surface of the circuit substrate 140A, and the like.

Hereinafter, the method of fabricating the circuit substrate 140A will be explained.

First a patterned metal mask is provided on the base substrate and a Cr/Cu film (not shown) is formed as a seed layer of plating process by using a sputtering process. Further, a Cu film is grown on the seed layer by an electrolytic plating process, and with this, the lower electrode layer 142 is formed.

Next, a resist film is formed on the base substrate 141 and the lower electrode layer 142, and a resist pattern is formed by patterning the resist film thus formed.

Further, by using this resist pattern as a mask, the dielectric film 143 is deposited by an AD process for 6 minutes while using a $TiO_2$ fine particle material having an average diameter of 0.3 μm after processing with the alumina coat treatment, and there is formed a $TiO_2$ film containing $Al_2O_3$ with the thickness 10 μm.

Further, the upper electrode layer 144 is formed by an electrolytic plating process, and the like, and an epoxy resin sheet (ABF-SH-9K provided made by Ajinomoto Co., Inc.) having the thickness of 50 μm is attached as the insulation layer 145.

Next, via holes 146A are formed by a laser drilling process, and via-plugs 146 are formed by filling the via-holes by non-electrolytic copper plating process.

Further, a Cr/Cu pattern is formed on the surface of the circuit substrate 140A by a sputtering process while using a metal mask, and a copper interconnection pattern is formed on the Cr/Cu pattern by using a non-electrolytic plating process.

Further, a metal mask is provided on the circuit s 140A and a $Ta_2O_5$ fine particle material having an average diameter of 0.01 μm substrate (provided by Kojundo Chemical Laboratory Co., Ltd.) is deposited by an AD process in a mask opening for 30 minutes. With this, a resistance film 149 having a thickness of 50 μm is formed between the electrodes 60. By removing the resist film, the resistance element 148 is obtained.

According to Example 11, the dielectric film 143 thus formed by the AD process does not cause damages in the base substrate 141, which is provided by the casing of the electron device. Further, the dielectric film 143 has high adhesion strength, and thus, it becomes possible to form a circuit of high reliability according to Example 11 of the present invention. Because the electron device 140 has the circuit substrate 140A and the electronic components provided on the casing, Example 11 enables further downsizing of the electron device.

Meanwhile, it should be noted that the resistance film 149 can be formed on the base substrate 141, in place of forming the same on the surface of the circuit substrate 140A. Thereby, further downsizing and further increase of integration density is achieved.

EXAMPLE 12

In Example 12, the resistance film 149 of Example 11 is formed as a resistance film of 10 μm thickness by conducting the AD process for 6 minutes while using a NiCr fine particle material (Example 12-1), a TaN particle material (Example 12-2), a Ru fine particle material (Example 12-3), an Ir fine particle material (Example 12-4), an IrO2 fine particle material (Example 12-5) all provided by Kojundo Chemical Laboratory Co., Ltd. and having an average diameter of 0.1 μm.

COMPARATIVE EXAMPLE 1

Figure 14:
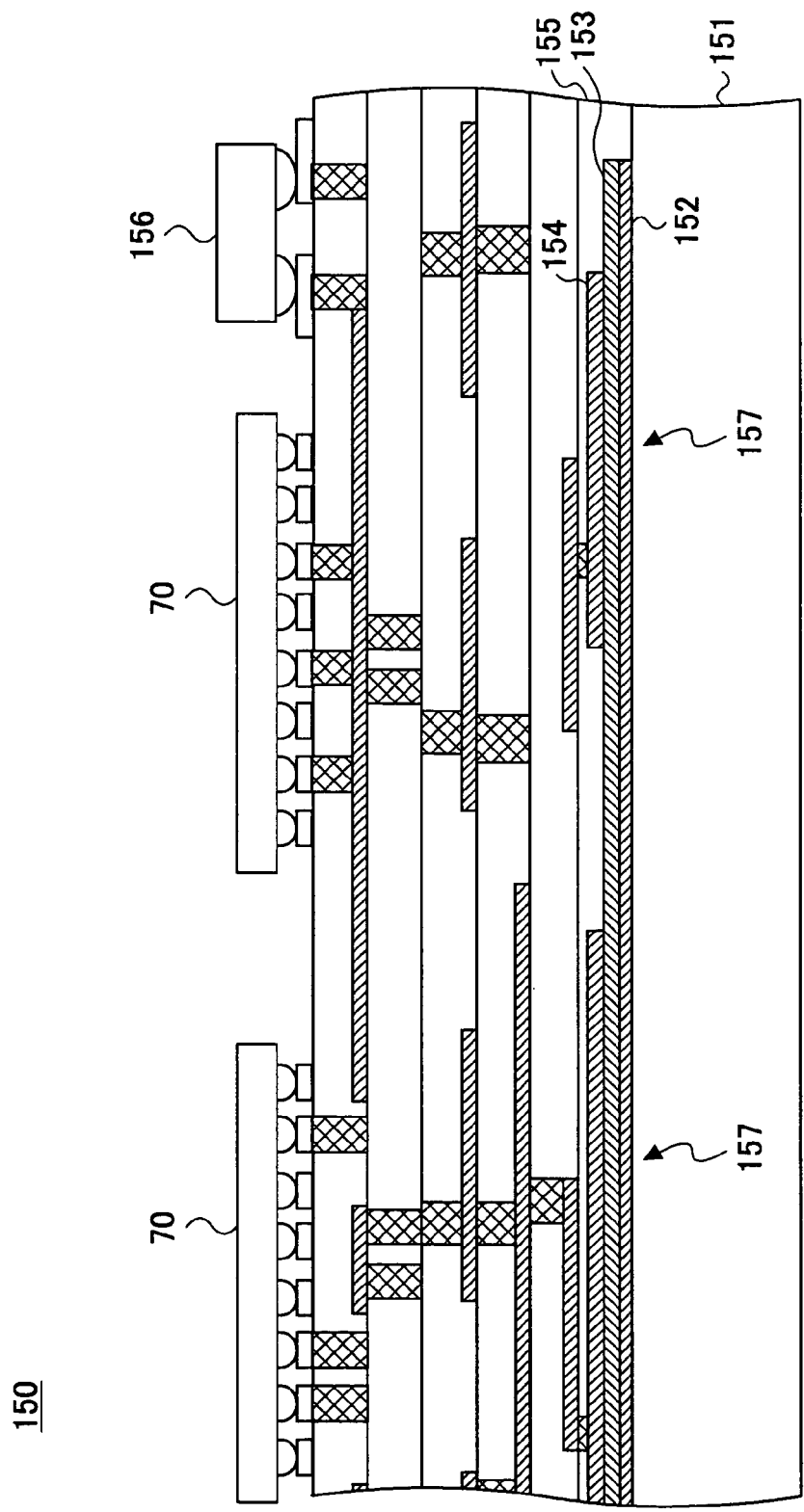
FIG. 14 is a cross-sectional diagram showing an electron device having a circuit substrate according to Comparative Example 1.

FIG. 14 is a cross-sectional diagram showing the general construction of an electron device having a circuit substrate 150A according to Comparative Example 1.

Referring to FIG. 14, the circuit substrate 150A includes a capacitor 157 formed on a Si substrate 151, and a chip capacitor 156 is formed further on the surface of the circuit substrate 150A.

It should be noted that the capacitor 157 includes a lower electrode layer 152 formed on a FR-4 substrate 151, a dielectric film 153 formed on the lower electrode layer 152, and an upper electrode layer formed on the dielectric film, wherein a BST (($Ba_{1-x}Sr_x$)$TiO_3$) film having a film thickness of 5 μm is formed as the dielectric film by a sputtering process.

For the insulation layer 155, an insulation layer of non-photosensitive polyimide is formed with a thickness of about 10 μm by using a spin coating process. After drying at the temperature of 80° C. for 30 minutes, the resin is cured by heating at 350° C. for 30 minutes. The polyimide layer is then subjected to a drying process at the temperature of 80° C. for 30 minutes, followed by a curing process conducted at 350° C. for 30 minutes.

Further, a chip capacitor 156, which is a SMD capacitor, is formed on the surface of the circuit substrate 150A in Comparative Example 1, and the LSI 70 is mounted further on the circuit substrate 150A thus formed.

COMPARATIVE EXAMPLE 2

Figure 15:
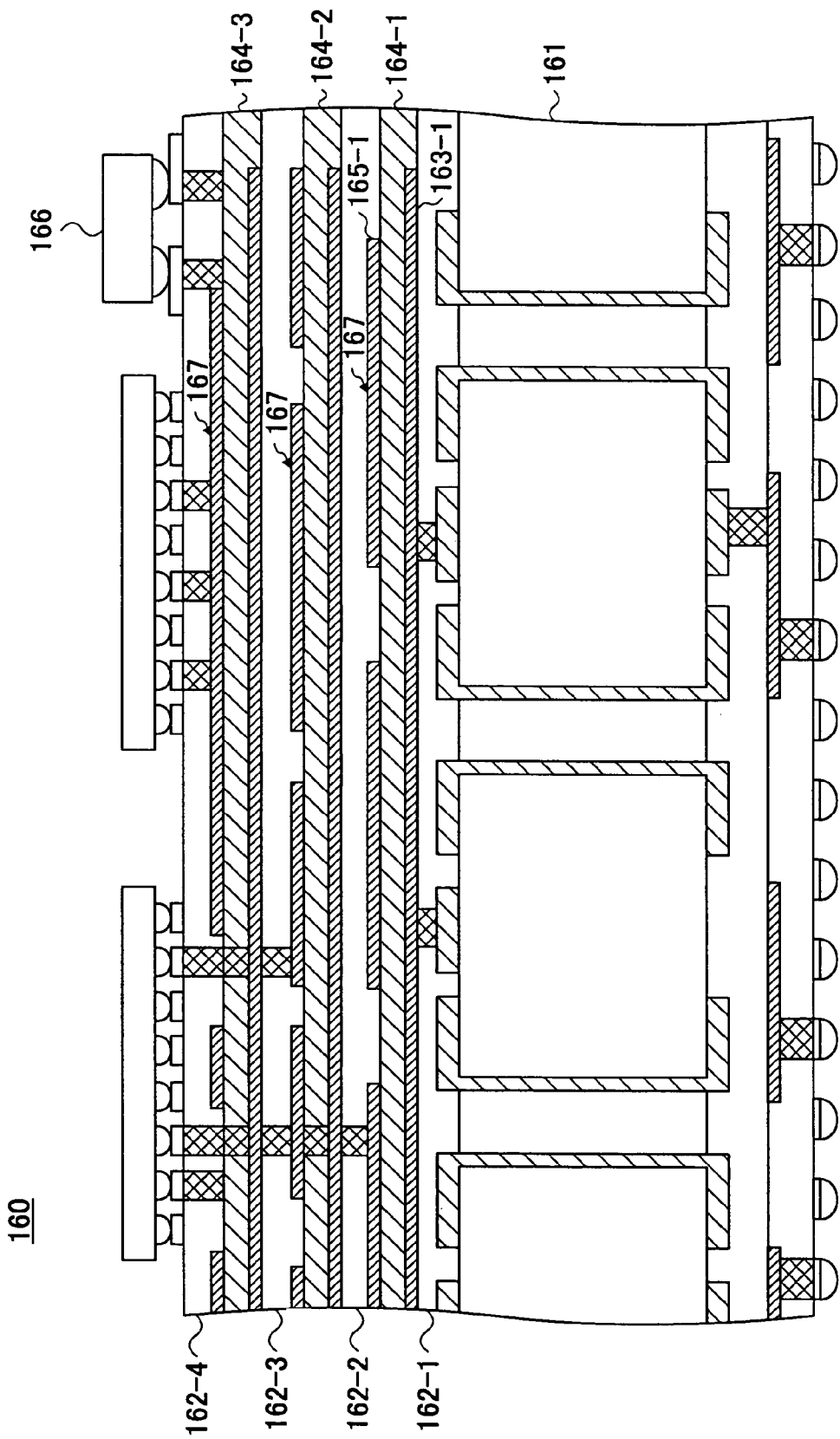
FIG. 15 is a cross-sectional diagram showing an electron device having a circuit substrate according to Comparative Example 2.

FIG. 15 is a cross-sectional diagram showing a general construction of the electron device having a circuit substrate according to Comparative Example 2.

Referring to FIG. 15, the circuit substrate 160A of Comparative Example 2 is similar to the circuit substrate of Example 1 except for the point that the dielectric films 164-1-164-3 of the capacitors 167 provided between the insulation layers 162-1-162-4 is formed of a mixture of an oxide ceramic and an epoxy resin and that the chip capacitor 166 is provided on the surface of the circuit substrate 160A.

More specifically, in Comparative Example 2, the dielectric films 164-1-164-3 are formed by applying a liquid formed of a $BaTiO_3$ fine particle material having an average diameter of 0.1 μm (provided by SAKAI CHEMICAL INDUSTRY) and an epoxy resin, followed by curing process at about 100° C.

For the circuit substrate 160A of Comparative Example 2, a FR-4 substrate carrying copper coils at both sides thereof is used as the base substrate 161, while an epoxy resin sheet having a thickness 50 μm (ABF-SH-9K provided by Ajinomoto Co., Inc.) is used for the insulation layers 164-1-164-4.

In such a construction, the heat treatment temperature has to be limited below 350° C. in view of the heat resistance of the base substrate 161 and also the heat resistance of the insulation layers 164-1-164-4, and it has been difficult to obtain a sufficient dielectric characteristic, even when an oxide ceramic paste, or the like, is used for the dielectric film.

Evaluation of Dielectric Film

FIG. 16 is a diagram showing the characteristics of the dielectric film formed on the circuit substrate according to various Examples and Comparative Examples noted before.

Referring to FIG. 16, the dielectric films of the circuit substrates of Examples 2, 5, 6, 9 and 10 have a specific dielectric constant of 1500-3000, and thus, it can be seen that, in the foregoing Examples of the present invention, a dielectric film having a specific dielectric constant of more or less equal to that of a bulk material is obtained.

In the case of the circuit substrates of Examples 1, 3, 4, 7 and 8, it is noted that the dielectric films have a low specific dielectric constant. On the other hand, because such Examples allow formation of multiple dielectric films, it becomes possible to realize a circuit substrate having a larger specific dielectric constant as compared with the Comparative Examples in viewpoint of electrostatic capacitance density.

With regard to the circuit substrates of Comparative Examples 1 and 2, on the other hand, it can be seen that the specific dielectric constant of the dielectric film is reduced due to the limitation imposed on the heat treatment temperature (post annealing processing temperature) after the film formation.

Comparing Example 1 and Example 6, it can be seen that Example 6 that forms the capacitor on the base substrate, provides a larger electrostatic capacitance density because of the increased number of the capacitors.

Further, with regard to the Al2O3 film used for the dielectric film in the circuit substrate of Example 3, it is noted that the specific dielectric constant is small. However, the dielectric loss at high frequency region is small with this dielectric film although not shown in FIG. 16, and thus, the circuit substrate of Example 3 is well suited for use in high frequency applications.

In FIG. 16, it should be noted that the specific dielectric constant is measured by forming a capacitor by using similar conditions to the Examples and Comparative Examples and by applying a high frequency voltage of 1 GHz frequency to the capacitor thus formed.

Further, it should be noted that the electrostatic capacitance density is obtained in each of the Examples and Comparative Examples noted before by obtaining a total of the electrostatic capacitance of the capacitors formed in layers and by dividing the same by the area of the circuit substrate. Thus, the electrostatic capacitance density represents the electrostatic capacitance of the circuit substrate per unit area.

Evaluation of Resistance Film

FIG. 17 is a diagram showing the characteristic of the resistance film formed with the circuit substrates of various Examples and Comparative Examples noted before.

Referring to FIG. 17, it can be seen that resistance elements having various different resistance values can be formed, judging from the values of the specific resistance of the resistance films of Examples 1-12-5.

In the case of the AD process, in particular, the shape or size of the resistance film forming the resistance element can be chosen as desired by using a mask. Further, because the AD process does not use a high temperature process, the resist pattern can be formed with high precision. In FIG. 17, it should be noted that the specific resistance was measured by using a four-terminal process.

Packing Evaluation of Passive Components

FIG. 18 is a diagram comparing the area of the circuit substrates for various Examples and Comparative Examples noted before, as well as the packaging number representing the number of the passive components to be mounted on the circuit substrate. It should be noted that FIG. 18 represents the relative values with reference to the Comparative Example 2 by defining that the number of the passive components on the surface of the circuit substrate of Comparative Example 2 is 20 and that the area of the circuit substrate of Comparative Example 2 is 1.

Referring to FIG. 18, it should be noted that the number of the passive components needed on the substrate surface is 3-10 in the case of the circuit substrates of Examples 1, 5, 6, 8 and 11, while in case of the circuit substrates of Comparative Examples 1 and 2, 15-20 passive components are needed on the circuit substrate, reflecting the effect that the dielectric films in the present invention have a large specific dielectric constant and that the capacitors are formed inside the circuit substrates in the present invention, leading to decrease of the number of the capacitors on the substrate surface.

It should be noted that the substrate area in FIG. 18 represents the area needed for a circuit substrate for mounting a predetermined number of active elements such as LSIs, in terms of ratio to the area of the circuit substrate of Comparative Example 2.

Referring to FIG. 18, it can be seen that the area for the circuit substrates of Examples 1, 5, 6, 8 and 11 is smaller than the area for Comparative Example 1 and Comparative Example 2.

This means that the circuit substrate of the present invention can reduce the number of the passive elements mounted on the circuit substrate, while this enables decrease of the area of the circuit substrate. With this, the size of the electron devices can be reduced and the separation between adjacent active elements can be reduced. This in turn provides improvement of operational speed of the electron devices.

Further, it should be noted that the present invention is not limited to particular embodiments and examples explained before, but various variations and modification are possible.

For example, the foregoing embodiments can be combined. Further, it is possible to form different dielectric films on a single circuit substrate by using different fine particle materials.

Further, it is possible to provide the active element inside the circuit substrate to the extent that there is caused no problem of temperature rise caused by heat generation, in addition to the construction explained before in which the LSI is mounted on the surface of the circuit substrate.

Further, it should be noted that the present invention is applicable not only to the circuit substrate but also to discrete passive components such as laminated ceramic chip capacitors, chip resistors, laminated chip ceramic coils, and the like. In these cases, a structural body is formed similarly to the circuit substrate of the present invention according to the process mentioned before, followed by dicing or scribing to the desired shape or size and adding electrodes further thereon.

As will be apparent from the explanation heretofore, the present invention can form passive devices of excellent characteristics within a circuit substrate or on the surface of the circuit substrate by forming a dielectric film, a resistance film and a conductor film at ordinary temperature by using an AD process while using a fine particle source material, and a compact circuit substrate suitable for high density integration is realized. Because the process is conducted at ordinary temperature, the circuit substrate of desired characteristics is fabricated easily with low cost.

FOURTH EMBODIMENT

The inventor of the present invention has discovered, in the experimental investigation of aerosol deposition (AD) technology, that various thick films can be formed stably from various fine particle source materials by providing a surface treatment to the fine particle source materials with an aluminum compound or lead compound, or by forming a thin film of the aluminum compound or lead compound on the surface of the fine particles of the source material, or alternatively by admixing the aluminum compound or lead compound to the fine particle source material.

Figure 19:
FIG. 19 is a SEM photograph showing the fracture surface of a $TiO_2$ film according to a fourth embodiment of the present invention.

FIG. 19 is a SEM photograph showing the fracture surface of a $TiO_2$ film formed by an AD process according to the present invention that uses a $TiO_2$ fine particle material applied with the surface treatment process noted before, as the source material.

More specifically, this $TiO_2$ film is formed by applying a surface treatment to the particles of the $TiO_2$ fine particle source material by using aluminum isopropoxide, which is a kind of aluminum alkoxide, as a surface treatment agent acting as a binder for the fine particles, and by spraying the $TiO_2$ fine particles thus processed in the form of aerosol, to form a thick film having a thickness of several ten microns.

Figure 20:
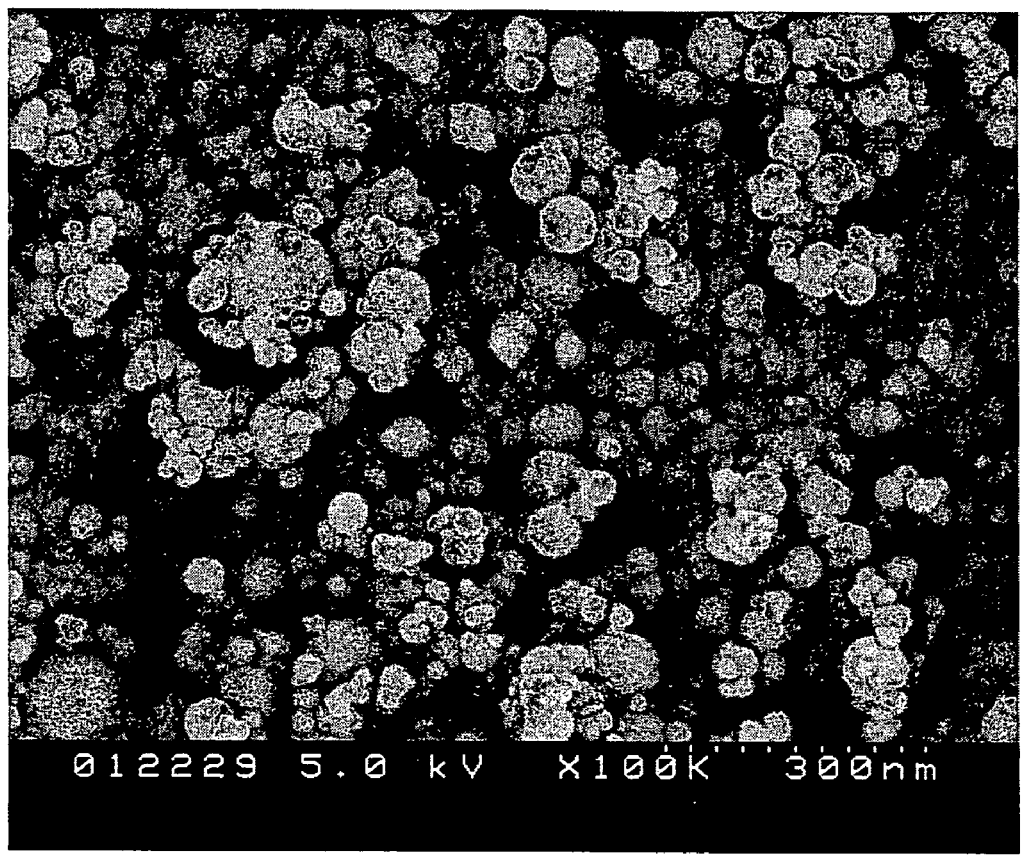
FIG. 20 is a SEM photograph showing the fracture surface of a $TiO_2$ film according to a comparative experiment.

FIG. 20, on the other hand, is a SEM photograph showing the fracture surface of a $TiO_2$ film deposited by the same condition to FIG. 19 with the film thickness of 10 μm while using the $TiO_2$ fine particle material not applied with the foregoing surface treatment.

Referring to FIG. 19, it can be seen that the $TiO_2$ film forming the film-like body of the present invention has a texture in which the boundary of the fine particles has vanished more or less and the fine particles are fused with each other. The texture of FIG. 19 indicates that the fine particles are bonded with each other firmly in the $TiO_2$ film of the present invention by fusing with each other, while it is believed that the texture of FIG. 19 is caused as a result of the action of the binder added to the fine particles by way of the processing noted before.

From the result of FIG. 19, it is believed that the binder thus added to the fine particles provides the function of: (1) causing fusion and resulting mutual bonding of the fine particles; and (2) activating the surface of the fine particles by way of causing a catalytic action.

The film-like body thus formed by the present invention is dense and has the feature of having excellent adherence to the substrate.

Referring now to FIG. 20, it will be noted that the $TiO_2$ film formed by the fine particle material not processed with the surface treatment of the present invention shows a fracture surface in which individual fine particles are clearly recognizable. It is confirmed that the film of FIG. 20 is fragile and easily scratched. Further, in the AD process of FIG. 20, it was not possible to reach the film thickness of 30 μm by way of simple increase of the deposition time.

Thus, the structure including the film-like body of the present invention comprises a base body, and a film-like body formed on the base body with dense and strong film quality, the film-like body having excellent adherence to the structural body, wherein the film-like body comprises fine particles and a binder and formed by an AD process.

For the base body constituting the structure of the present invention, it is possible to use a material such as glass, metal, ceramics, half metal, and a resin material having a generally lower softening temperature than the melting point of these materials.

When an AD process is used, the fine particle material cause bonding to only the outermost surface of the base body, and thus, there is caused no damaging such as deformation to the base body, even in the case the base body is formed of a resin material.

For the fine particle material used in the present invention, it is possible to use an oxide, such as titanium oxide, zinc oxide, tin oxide, iron oxide, zirconium oxide, yttrium oxide, chromium oxide, hafnium oxide, beryllium oxide, magnesium oxide, silicon oxide, iridium oxide, ruthenium oxide, rhenium oxide, and the like or an oxide containing these, or a carbide such as diamond, boron carbide, silicon carbide, titanium carbide, zirconium carbide, vanadium carbide, niobium carbide, chromium carbide, tungsten carbide, molybdenum carbide, tantalum carbide, and the like.

Further, the fine particle material usable in the present invention includes a nitride such as boron nitride, titanium nitride, aluminum nitride, silicon nitride, niobium nitride, tantalum nitride, and the like, or a boride such as boron, aluminum boride, silicon boride, titanium boride, zirconium boride, vanadium boride, niobium boride, tantalum boride, chromium boride, molybdenum boride, tungsten boride, and the like.

Further, the fine particle material usable in the present invention includes a metal such as Cu, Ag, Au, Pt, Pd, Al or an alloy of these elements, a half metal such silicon or germanium including those added with various doping elements such as phosphorus, a semiconductor compound such as the gallium arsenide, indium arsenide, cadmium sulfide, and the like.

Further, the fine particle material usable in the present invention includes oxide ceramics having a perovskite structure such as $PbTiO_3$, $PbZrO_3$, a PLZT represented by the general formula of $(Pb_{1-y}La_y)(Zr_{1-x}Ti_x)O_3$ ($0 \leq x$, $y \leq 1$), $Pb(Mg_{1/3}Nb_{2/3})O_3$, $Pb(Ni_{1/3}Nb_{2/3})O_3$, $Pb(Zn_{1/3}Nb_{2/3})O3$, $BaTiO_3$, $BaTi_4O_9$, $Ba_2Ti_9O_{20}$, $Ba(Zn_{1/3}Ta_{2/3})O_3$, $Ba(Zn_{1/3}Nb_{2/3})O_3$, $Ba(Mg_{1/3}Ta_{2/3})O_3$, $Ba(Mg_{1/3}Ta_{2/3})O_3$, $Ba(CO_{1/3}Ta_{2/3})O_3$, $Ba(CO_{1/3}Nb_{2/3})O_3$, $Ba(Ni_{1/3}Ta_{2/3})O_3$, $(Ba_{1-x}Sr_x)TiO_3$, $ZrSnTiO_4$, $CaTiO_3$, $MgTiO_3$, $SrTiO_3$, $SrVO_3$, $CaVO_3$, $LaTiO_3$, $SrMoO_3$, $CaMoO_3$, $SrCrO_3$, $CaCrO_3$, $LaVO_3$, $GdVO_3$, $SrMnO_3$, $CaMnO_3$, $NiCrO_3$, $BiCrO_3$, $LaCrO_3$, $LnCrO_3$, $SrRuO_3$, $CaRuO_3$, $SrFeO_3$, $BaRuO_3$, $LaMnO_3$, $LnMnO_3$, $LaFeO_3$, $LnFeO_3$, $LaCoO_3$, $LaRhO_3$, $LaNiO_3$, $PbRuO_3$, $Bi_2Ru_2O_7$, $LaTaO_3$, $BiRuO_3$, and the like, high-fracture toughness ceramics such as SiAlON, cermet, and the like, and biological ceramics such as hydroxyapatite, calcium phosphate, and the like.

These fine particle materials may be used individually or in the form of mixture of two or more different materials. The average diameter of the fine particles is set to the range of 10 nm-1 μm. When the diameter is smaller than 10 nm, the adherence to the substrate becomes poor, while when the diameter is larger than the 1 μm, formation of continuous film becomes difficult and the film becomes fragile.

With regard to the binder of the particles used in the present invention, various investigations of the inventor of the present invention has lead to the conclusion that aluminum compound or lead compound can be used for this purpose. Such aluminum compound includes $Al_2O_3$, $LiAlO_2$, $MgAl_2O_4$, $CaAl_2O_4$, $SrAl_2O_4$, $BaAl_2O_4$, $Y_3Al_5O_{12}$, AlN, $Al_2O_3 \cdot nH_2O$, aluminum hydroxides $(Al(OH)_3)$, aluminum alkoxide (Al $(OR)_3$ (R: alkyl group)), $3Al_2O_3 \cdot 2SiO_2$), spinel $(MgO \cdot Al_2O_3)$, cordierite $(2Al_2O_3 \cdot 2MgO \cdot 5SiO_2)$, anorthite $(CaO \cdot Al_2O_3 \cdot 2SiO_2)$ gehlenite $(2CaO \cdot Al_2O_3 \cdot SiO_2)$, and the like. Among these aluminum compounds, it is preferable to use $Al_2O_3$, aluminum hydroxides $(Al(OH)_3)$, aluminum alkoxide $(Al(OR)_3$ (R: alkyl group)).

For the aluminum alkoxide, it is possible to use aluminum trimethoxide, aluminum triethoxide, aluminum tri-n-propoxide, aluminum tri isopropoxide, aluminum tri-n-butoxide, aluminum tri-sec-butoxide, aluminum tri-tert-butoxide, mono sec butoxy aluminum diisopropylatei aluminum tri ethoxy ethoxy ethoxide, aluminum phenoxide, and the like.

Further, for the lead compound, it is possible to use $Pb_2FeNbO_6$, $Pb_2FeTaO_6$, $Pb_2YbNbO_6$, $Pb_2YbTO_6$, $Pb_2LuNbO_6$, $Pb_2LuTaO$, $Pb_3MgNb_2O_9$, $Pb_3NiNb_2O_9$, $Pb_3NiTa_2O_9$, $Pb_3ZnNb_2O_9$, $Pb_3Fe_2WO_9$, $Pb_2CdWO_6$, $PbTiO_3$, $PbZrO_3$, $PbSnO_3$, $PbHfO_3$, $Pb(Zr_{1-x}Ti_x)O_3$, and the like.

The binder of the fine particles is used in the form of surface treatment agent of the fine particles, a surface coating agent or additive of particulate form as will be explained later in the embodiments. Further, the binder is sprayed simultaneously to the fine particle material or alternately to the fine particle material.

Preferably, the proportion of the binder is set to the range of 0.1-50% in terms of mass with reference to the total weight (100 mass %) of the binder and the fine particle material. When the proportion is smaller than 0.1 mass %, there occurs no formation of thick films or only fragile film is obtained. When the proportion exceeds 50 mass %, although a dense and strong thick film is formed, the characteristic of the binder becomes conspicuousness as compared with the characteristic of the fine particle material.

Thus, it is most preferable to set the proportion to the range of 0.1-20 mass %.

Surface Treatment of Fine Particle Material

Next, the method of surface treatment of the fine particle material by an aluminum alkoxide binder will be explained.

As noted before, the present embodiment applies a surface treatment to the fine particle material by contacting and mixing the fine particles of the fine particle material with aluminum alkoxide.

In this surface treatment process, a suspension containing the fine particle material is prepared beforehand and the aluminum alkoxide is mixed to this suspension.

For the preparation of the suspension of the fine particle material, an organic solvent is preferably used, wherein the organic solvent includes alcohols, ketones, carbonic acid esters of aromatic group and aliphatic group, ethers, ether esters, hydrocarbons of aliphatic group and aromatic group, halogenated hydrocarbons, and the like, and also mineral oils, plant oils, wax oils, silicone oils, and the like.

The solvent desirable from the point of compatibility is the one selected from one or more of alcohols, aliphatic and aromatic hydrocarbons, halogenated hydrocarbons, aromatic aliphatic carbonic acid esters, ketones, (cyclic) ethers, ether esters, and water having a boiling point at ordinary pressure of 40-250° C. The solvent may be a mixed solvent containing two or more of the above.

More specifically, the solvent may be any of methanol, ethanol, n-propanol, isopropyl alcohol, n-butanol, ethylene glycol, propylene glycol, ethylene glycol mono methyl ether, ethylene glycol monoethyl ether, ethylene glycol monobutyl ether, diethylene glycol monoethyl ether, diethylene glycol monobutyl ether, ethylene glycol methyl ether acetate, ethylene glycol ethyl ether acetate, ethylene glycol butyl ether acetate, propylene glycol mono methyl ether, propylene glycol monoethyl ether, diprolylene glycol mono methyl ether, tri propylene glycol mono methyl ether, propylene glycol methyl ether acetate, propylene glycol ethyl ether acetate, 3-methyl-3-methoxy butanol, 3-methyl-3-methoxy butyl acetate, toluene, xylene, benzene, cyclohexane, n-hexane, ethyl acetate, propyl acetate, butyl acetate, isobutyl acetate, methyl ethyl ketone, methyl isobutyl ketone, cyclohexane, tetrahydrofuran, and the like. The solvents noted above may be used individually or in the form of a mixture containing two or more of such solvents.

In the case of using aluminum alkoxide, an organic solvent capable of dissolving the aluminum alkoxide is used such that the aluminum alkoxide is diluted to about 5-50 mass % with reference to the total weight (100 mass %) of the organic solvent and the aluminum alkoxide.

Preferably, the mixing of the suspension of the fine particle material and aluminum alkoxide is conducted under stirring at the temperature of 50° C. or more. Further, it is more desirable conduct heating at the temperature of 100° C. or more for more than 10 minutes.

After the mixing, the solvent is removed from the suspension by a dry solidification process or centrifugal separation process, followed by a dry heating process, and the fine particle material is obtained in the form of a powder. Thereby, it is possible to pulverize the material by using a jet mill, and the like.

With this, a fine particle material treated by the surface treatment processing by aluminum alkoxide is obtained.

Further, it is possible to convert the aluminum alkoxide at the surface of the fine particle material into an $Al_2O_3$ film by conducting a baking process. In the case of conducting the baking process in the atmosphere, the temperature is sets to 900-1200° C. and the baking is conducted for the duration of 5-120 minutes. With this, the fine particle material coated with the $Al_2O_3$ film is obtained.

Coating of Fine Particle Material by CVD

Next, the method of forming an $Al_2O_3$ film on the surface of the fine particles of the fine particle material by a CVD process will be explained.

First, a pressure-resistant vessel is evacuated and an $AlCl_3$ gas (designated as $AlCl_3/H_2$ gas) which is a sublimated gas of $AlCl_3$ formed using an $H_2$ gas as a carrier gas, is introduced as a process gas together with a $H_2$ gas and a $CO_2$ gas.

Further, aerosol of the fine particle material is formed by using a carrier gas for the fine particle material, and the aerosol thus formed is caused injected into the vessel.

During this process, the interior of the vessel is heated to the temperature of 700-1250° C., and an $Al_2O_3$ film is formed on the surface of the fine particles as a result of decomposition of the binder. In this process, the flow rates of the $AlCl_3/H_2$ process gas, $H_2$ gas and the $CO_2$ gas are set to 200-800 mL/minute, 100-500 mL/minute, and 100-300 mL/minute, respectively. The fine particle material thus covered with the $Al_2O_3$ film accumulating in the vessel is then collected.

Also, it is possible to form an $Al_2O_3$ film on the surface of the fine particles by causing a pyrolitic decomposition of other process gas such as an $Al(i-OC_3H_7)_3$ gas sublimated by using a $N_2$ carrier gas (designated as $Al(i-OC_3H_7)_3/N_2$ gas) together with an $N_2$ gas, by heating the interior of the vessel to 300-600° C. With this process, the heating temperature can be set lower than the case of using the $AlCl_3$ gas. In the case of using this approach, the flow rates of the $Al(i-OC_3H_7)_3/N_2$ gas and the $N_2$ gas are set to 200-400 mL/minute and 100-300 mL/minute, respectively.

With this, it becomes possible to obtain the fine particle material covered with the $Al_2O_3$ film.

About the deposition apparatus using for forming the film-like body constituting the structure of the present embodiment, explanation is made already with reference to FIG. 2.

Referring to FIG. 2 again, a gas cylinder 23 and a mass flow controller 24 are connected to the aerosol generator 21 via a gas line. The mass flow controller 24 is used for controlling the high pressure carrier gas of argon, and the like, filled in the gas cylinder 23, and with this, formation of the fine particles in the vessel 26 or ejection of the aerosol of the fine particles thus formed into the growth chamber 22 of the aerosol generator 20 is controlled.

Here, it is possible to use other inert gases such as helium, neon, nitrogen, and the like, for the carrier gas in addition to the argon gas.

In the case of using oxide ceramics having a perovskite structure for the fine particle material, it should be noted that an oxidizing gas such as oxygen or air may be used for the carrier gas. With this, oxygen defects in the oxide ceramics can be compensated for at the time of film formation process.

Also, it should be noted that, in the aerosol generator 21, the vibrator 28 is used for forming the fine particles in the form of primary particles by applying supersonic vibration or electromagnetic vibration, mechanical vibrations, and the like. By using the primary particles of the fine particles, the desired dense and uniform AD film is obtained.

As noted before, the growth chamber 22 is provided with the nozzle 30 connected to the aerosol generator 21 via the line 29 and the stage 31 holding the substrate 11 is provided so as to face the nozzle 30. Further, the XYZ stage 22 is connected to the stage 31 for controlling the position of the substrate 11. Further, the mechanical booster 24 and the rotary pump 25 are connected to the growth chamber 22 for reducing the pressure therein.

In operation, fine particles having an average diameter of 10 nm-1 μm is filled in the aerosol generator 21 as the source material of the film-like body, and an argon gas is supplied from the gas cylinder 13 to the growth chamber 12 with the pressure of 19.6-49 Pa (2-5 kg/cm$^2$) as a carrier gas. Further, by applying vibration from the vibrator 18, the fine particles are converted to aerosol. The fine particles thus forming the aerosol are transported to the growth chamber 22 of which pressure is set lower than the pressure inside the vessel 26 of aerosol generator 21 via the line 29 together with the carrier gas.

In the growth chamber 22, the aerosol of the fine particles is ejected injected from the nozzle 30 together with the carrier gas in the form of a jet stream, the fine particles are deposited on the substrate 11. Here, it should be noted that the injection velocity can be controlled by the shape of the nozzle 30, the pressure of the carrier gas thus introduced, and the pressure difference between the aerosol generator 21 and the interior of the growth chamber 22 and is set to the range of 3-400 m/second, preferably 200-400 m/second. By setting up the ejection velocity to this range, a high film-like body having strong adherence can be formed on the substrate 17.

With the AD process of the present embodiment, the fine particles collided upon the substrate 11 removes any contamination or moisture therefrom upon collision and the surface of the substrate 17 is activated. Further, the surface of the fine particles is activated similarly as a result of the mutual collision of the fine particles.

As a result, the fine particles adhere to the surface of the substrate 11. Further, the fine particles cause bonding with each other, and a dense film-like body having strong adherence is obtained. It should be noted that when the ejection velocity exceeds 400 m/second, there arises possibility that the substrate 17 is damaged, while when the ejection velocity is smaller than 3 m/second, no sufficient adherence is achieved.

Here, it should be noted that the measurement of the velocity of the fine particles can be achieved by the method similar to the one disclosed in the Japanese Laid-Open Patent Application 2002-348677 official gazette, in which a rotating slit is disposed between the nozzle ejecting the fine particles and the substrate on which the fine particles cause deposition and the velocity of the fine particles is obtained by the position of the fine particles that have passed the slit and reached the substrate.

Hereinafter, Example 13 of the present embodiment will be explained.

EXAMPLE 13-1

In Example 13-1, a suspension of a $TiO_2$ fine particle material having an average diameter of 0.25 μm (product name JR provided by Tayca Corporation) is prepared by adding the $TiO_2$ fine particle material to an isopropyl alcohol, followed by agitating. Further, aluminum isopropoxide is mixed to this suspension and agitated for one hour at 60° C.

Next, the solvent is removed by a centrifugal separator. Further, by conducting heating and drying process, a powder material is obtained. By conducting a baking processing for 2 hours with this power material at 1000° C., the $TiO_2$ fine particle material covered with $Al_2O_3$ is obtained. Here, it should be noted that the ratio of the $TiO_2$ fine particle material and the $Al_2O_3$ film is set to 95:5 in terms of mass.

Next, a film formation process is conducted according to the AD process by using the deposition apparatus shown in FIG. 2.

More specifically, the $TiO_2$ fine particle material in which each $TiO_2$ fine particle is covered with an $Al_2O_3$ coating is filled into the vessel 26, and aerosol of the $TiO_2$ fine particle material is formed by supplying a high purity nitrogen gas (99.9% purity) to the vessel 26 with the pressure of 19.6 Pa (2 kg/cm$^2$) as a carrier gas while setting up the flow rate to 4 L/minutes.

Further, the pressure of the growth chamber is set to 5-10 Pa, and the aerosol of the $TiO_2$ fine particle covered with the $Al_2O_3$ coating is ejected for 30 minutes while setting up the flow rate of the aerosol to 30 g/hour. With this, a $TiO_2$ film containing $Al_2O_3$ is formed on a glass substrate with the thickness of 100 μm.

EXAMPLES 13-2-13-15

In Examples 13-2-13-15, the fine particle materials shown in Examples 13-2-13-15 of FIG. 21 are used for the fine particle material, with the proportion of the aluminum isopropoxide coating changed to 0.10 mass %. Otherwise, the surface treatment and film deposition are conducted similarly to Example 13-1.

COMPARATIVE EXAMPLE 3

In Comparative Example 3, the proportion of the aluminum propoxide coating is changed to 0.08 mass % as shown in FIG. 21. Otherwise, the surface treatment and film formation are conducted similarly to Example 13-1.

EXAMPLE 13-16

In Example 13-16, the surface treatment and film formation are conducted similarly to Example 13-1 except that the baking process at 1000° C. is omitted.

EXAMPLE 13-17

In Example 13-17, the film formation is conducted similarly to Example 13-1 except that used a $TiO_2$ fine particle material having an average diameter of 0.35 μm (product name JR600A provided by Tayca Corporation) is used for the AD process with a boehmite (γ-AlOOH) surface coating of 2 mass %.

EXAMPLE 14-1

In Example 14-1, an $Al_2O_3$ film is formed on the surface of the $TiO_2$ fine particle material having an average diameter of 0.25 μm (product name JR provided by Tayca Corporation) by using a CVD process.

More specifically, an $AlCl_3$ gas (designated as $AlCl_3/H_2$ gas), which is an $AlCl_3$ gas sublimated by using a $H_2$ carrier gas, is introduced into a vessel 26 together with an $H_2$ gas an a $CO_2$ gas, and the fine particle material is injected into the vessel while using the $CO_2$ gas as a carrier gas.

Thereby, the temperature inside the vessel is set up to 850° C., and an $Al_2O_3$ coating is formed on the surface of the fine particles by causing a pyrolitic decomposition of the process gas. Here, the process gas is introduced by setting the flow rates of the $AlCl_3/H_2$ gas, the $H_2$ gas and the $CO_2$ gas to 500 mL/minute, 300 mL/minute and 200 mL/minute, respectively. The $TiO_2$ fine particle material used for the AD process is then obtained by collecting the $TiO_2$ fine particle material covered by the $Al_2O_3$ coating and thus accumulated in the vessel. In the present Example 14-1, the ratio of the $TiO_2$ fine particle material and the $Al_2O_3$ coating is set to 95:5 in terms of mass %.

Next, according to the condition similar to Example 13-1, the $TiO_2$ fine particle material thus covered from the $Al_2O_3$ coating is deposited on an oxygen-free copper plate by an AD process, and a $TiO_2$ film containing $Al_2O_3$ is formed with the thickness 100 μm.

EXAMPLES 14-2-14-3

In Examples 14-2-14-3, film formation is made similarly to Example 14-1 except that the fine particle material is changed to the one shown in FIG. 22.

EXAMPLE 15-1

In Example 15-1, 90 parts in mass of the $TiO_2$ fine particle material of average diameter of 0.25 μm (product name JR provided by Tayca Corporation) and 10 parts in mass of the $Al_2O_3$ particles having an average diameter of 0.10 μm (provided by Kojundo Chemical Laboratory Co., Ltd.) and used as a binder are thrown into a homogenizer (product of Nara Machine Production) and stirred at 500 RPM for 30 minutes. Thereafter, a mixing processing is conducted for one hour by using a V-blender (product of TACMINA CORPORATION) and a mixture of the $TiO_2$ fine particle material and the $Al_2O_3$ particles is obtained.

In Example 15-1, the film deposition made on an oxygen-free copper plate while using this mixture as the source material under the condition similar to Example 13-1, and a $TiO_2$ film containing $Al_2O_3$ is obtained with the thickness of about 120 μm.

EXAMPLE 15-2

In Example 15-2, 95 parts in mass of the AlN fine particle material having an average diameter of 0.80 μm (grade F of Tokuyama) and 5 parts in mass of PZT binder particles having an average diameter of 0.50 μm are mixed in processing for 10 hours in a ball mill, and a mixture of the AlN fine particle material and the PZT particles is obtained.

Further, film formation is conducted on a glass substrate by using this mixture as a source material under the condition similar to Example 15-1, and an AlN film containing PZT is obtained with the thickness of about 100 μm.

EXAMPLE 16

Figure 24:
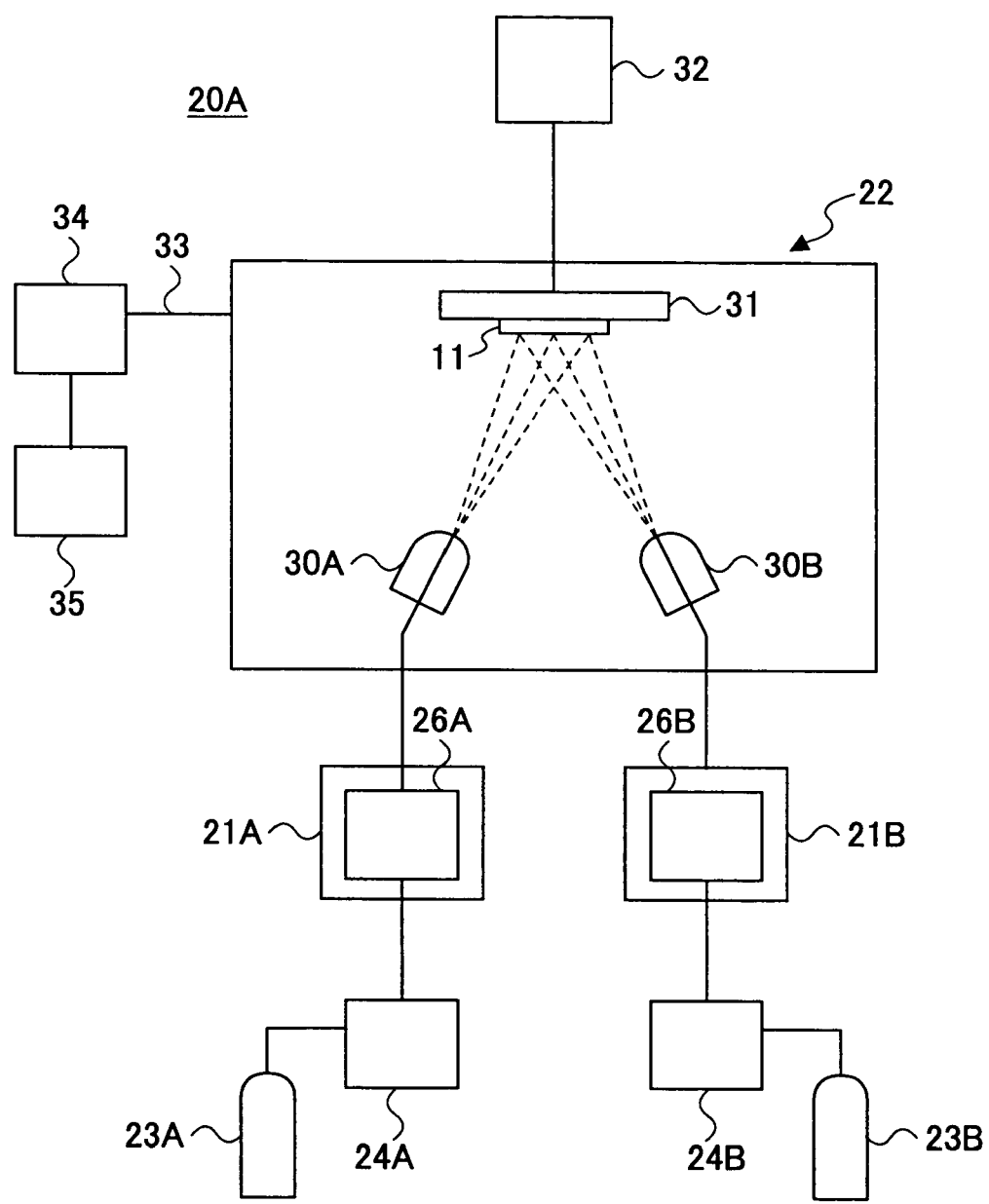
FIG. 24 is a diagram showing another construction of deposition apparatus for an AD process.

In Example 16, film formation is conducted by spraying both of a TiO2 fine particle material having an average diameter of 0.25 μm (product name JR provided by Tayca Corporation) and $Al_2O_3$ particles having an average diameter of 0.10 μm (provided by Kojundo Chemical Laboratory Co., Ltd.) simultaneously. In this experiment, a deposition apparatus 20A equipped with two systems of fine particle injection means shown in FIG. 24 is used. In FIG. 24, those parts corresponding to the parts explained previously are designated by the same reference numerals and explanation thereof will be omitted.

Referring to FIG. 24, the deposition apparatus 20A includes gas cylinders 23A and 23B supplying respective carrier gases, mass flow controllers 24A and 24B respectively corresponding to the gas cylinders 23A and 23B, aerosol generators 21A and 21B respectively corresponding to the mass flow controllers 24A and 24B, and there are provided two nozzles 30A and 30B forming two, independent systems in the growth chamber 22 respectively in correspondence to the aerosol generators 21A and 21B. With this, it is possible in the deposition apparatus 20A to spray respective fine particle materials from the nozzles 30A and 30B simultaneously or alternately.

By using this deposition apparatus 20A, film formation is conducted while using a TiO2 fine particle material as a source material.

More specifically, the $TiO_2$ fine particle material and $Al_2O_3$ particles are filled in the vessels 26A and 26B of the respective aerosol generators 21A and 21B, and a $TiO_2$ film containing $Al_2O_3$ is formed on a Si substrate with a film thickness of 100 μm by spraying the $TiO_2$ fine particle material and the $Al_2O_3$ particles with the flow rates of 20 g/hour for 30 minutes, while setting the pressure of the high purity nitrogen gas (99.9% purity) used for the carrier gas to 19.6 Pa (2 kg/cm$^2$), the carriers gas flow rate to 4 L/minute, and the pressure of the growth chamber to 5-10 Pa.

EXAMPLE 17

In Example 17, the same material and deposition apparatus to Example 16 are used and spraying of the $TiO_2$ fine particle material and the $Al_2O_3$ particles are conducted 3 times alternately, each for 5 minutes, such that film deposition is conducted in total of 30 minutes. With this, an $Al_2O_3/TiO_2$ laminated film is formed on the Si substrate with the film thickness of 100 μm.

Evaluation of Film Water Absorption

Further, the percentage of water absorption of the film is obtained for the film thus formed, by immersing the substrate carrying the film into water for one hour, and by dividing the difference of the mass before and after the water immersion by the mass of the film. Thereby, the film having the percentage of water absorption of 0.5% or less is defined as a good film.

The percentage of water absorption of the films thus formed is summarized in FIGS. 21-23.

Referring to FIGS. 21-23, it can be seen that the film of Comparative Example 1 has the percentage of water absorption of 3% or more, while the films of the Examples of the present embodiment all showed the percentage of water absorption of 0.1% or less. From this, it is concluded that the films of the Examples of the present embodiment are free from pores that absorb water and have a dense film quality.

Evaluation of Film Adherence Strength

Further, the adherence strength of the film thus formed to the substrate is evaluated by using a Sebastian method.

In the Sebastian method, the substrate formed with the film-like body thereon is fixed and a test head is attached to the surface of the film-like body by an adhesive. Further, the test head is pulled up and the pulling force (kg/mm$^2$) at the moment the film-like body has been detached from the substrate is used as the index of the adherence strength. Larger the pulling force, larger the adhesion.

The result of the Sebastian test is summarized in FIGS. 21-23 for various Examples and Comparative Examples of the present embodiment.

Referring to the drawings, it can be seen that the adherence is 1.5 kg/mm$^2$ or less in Comparative Example 1, while in the case of the Examples of the present embodiment, the adherence of 4.0-5.0 kg/mm$^2$ or more is achieved.

From this, it is clear that that the adhesion between the film and the substrate is improved substantially as compared with the Comparative Example in the present embodiment. In other words, with the Examples noted above, it was confirmed that a thick film having a dense and strong film quality and high adhesion strength with regard to the substrate is obtained by applying a surface treatment to the fine particle material used for the AD process by using an aluminum compound or a lead compound.

Thus, as described heretofore, the present embodiment provides a structure including a film-forming body having a dense and strong film quality and excellent adhesion to the base body, by applying a surface treatment process to the fine particle material used for the source of the AD process by a binder material of the fine particles.

FIFTH EMBODIMENT

Figure 25:
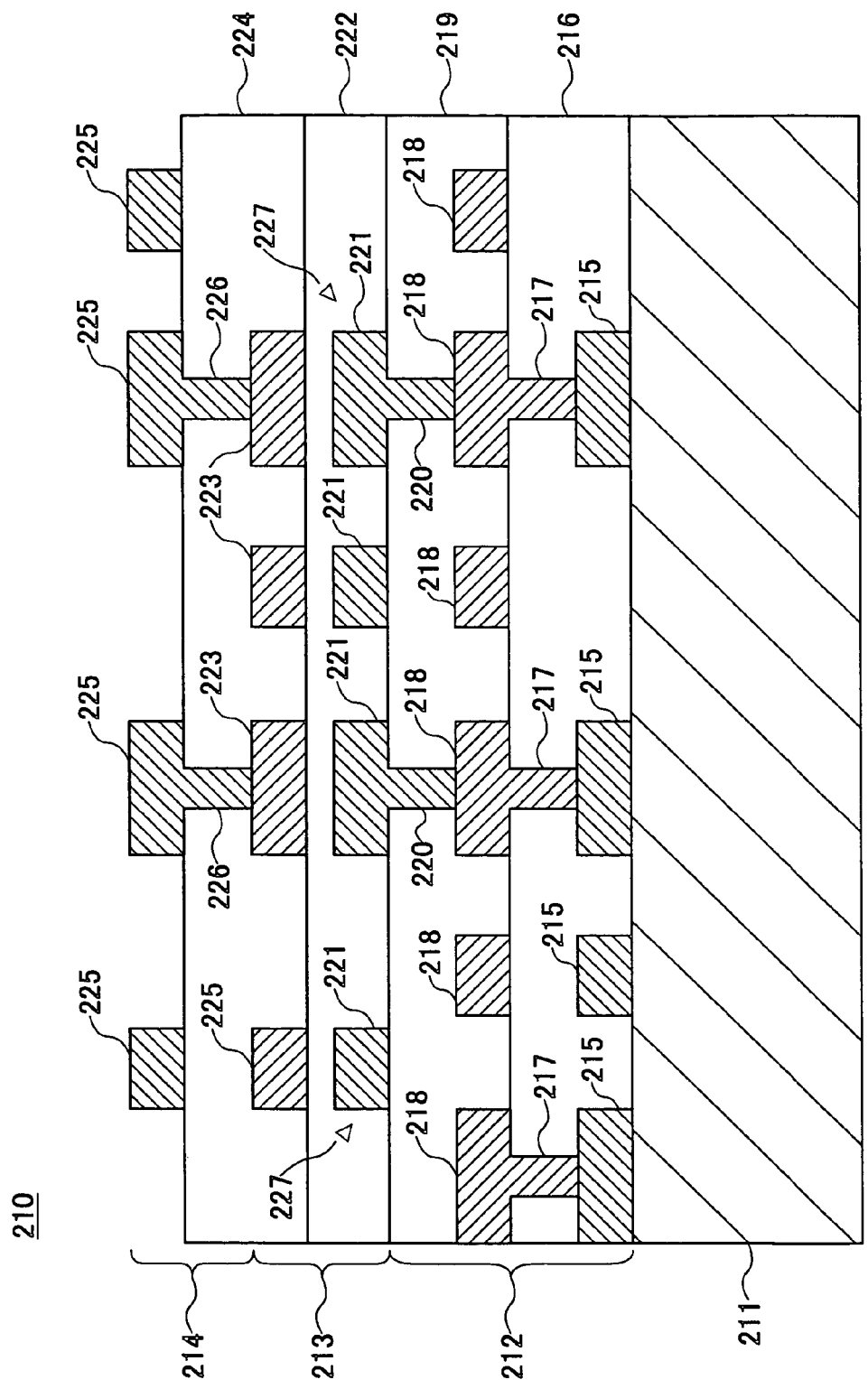
FIG. 25 is a cross-sectional diagram showing a circuit substrate according to a fifth embodiment of the present invention.

FIG. 25 is a cross-sectional diagram showing a circuit substrate 210 according to a fifth embodiment of the present invention.

Referring to FIG. 25, the circuit substrate 210 of the present embodiment is constructed on a base substrate 211, and includes a lower interconnection layer 212, a capacitor layer 213, and an upper interconnection layer 214 laminated consecutively on the base substrate 211.

More specifically, the lower interconnection layer 212 is formed of a first conductor layer 215 formed on the surface of the base substrate 211 selectively, a first interlayer insulation film 216 covering the base substrate 211 and the first conductor layer 215, a second conductor layer 218 formed selectively on the first interlayer insulation film 216, a second interlayer insulation film 219 covering the first interlayer insulation film 213 and also the second conductor layer 214, via-plugs 217 connecting the first conductor layer 215 and the second conductor layer 218 electrically, and the like.

The capacitor layer 213 is formed of a first electrode layer 221 formed on the second interlayer insulation film 219, a dielectric layer 222 covering the second interlayer insulation film 219 and the first electrode layer 221, a second electrode layer 223 formed on the dielectric layer 222 so as to oppose the 1st electrode layer 221, and the like.

Further, the upper part interconnection layer 214 is formed of a second electrode layer 223 of the capacitor layer 213, a third interlayer insulation film 224 covering the dielectric layer 222 and the second electrode layer 223, a 3rd conductor layer 225 formed on the third interlayer insulation film 224, via-plugs 226, and the like, connecting the second electrode layer 223 and the third conductor layer 225, and the like.

One feature of the circuit substrate of the present embodiment is that the first through third interlayer insulation films 216, 219 and 224 and also the dielectric layer 222 are formed by an AD process. Further, because the film formation is possible at room temperature with the AD process, the present embodiment does not require heat treatment process (baking process) at high temperature such as 900-1000° C. as in the case of the LTCC process.

Thus, with the present embodiment, the first and second conductor layers 215 and 218 can be formed as a continuous film of metal or alloy by using the electrolytic or non-electrolytic plating process, vacuum evaporation deposition process, sputtering process, CVD process, and the like, and thus, the present embodiment has another feature in that the specific resistance of the conductor layer such as the first and second conductor layers 215 and 218 can be reduced as compared with the LTCC process.

Here, it should be noted that the first through third interlayer insulation films 216, 219 and 224 are formed by spraying the aerosol of the fine particle material of ceramics by an AD process with the thickness of 50 μm, for example.

For the ceramics used for the first through third interlayer insulation films 216, 219 and 224, any of $Al_2O_3$, MgO, $SiO_2$, CaO, $3Al_2O_3.2SiO_2$, $MgO.Al_2O_3$, $2MgO.SiO_2$, $2Al_2O_3.2MgO.5SiO_2$, $CaO.Al_2O_3.2SiO_2$, and the like, or a mixture of two or more of these, may be used. By using these ceramics, it becomes possible to form the first through third interlayer insulation films 216, 219 and 224 such that the dielectric loss is low in the high frequency range of especially 2 GHz.

Thus, according to the present embodiment, it is possible to realize a circuit substrate of reduced loss suitable for use in the high frequency circuits.

Further, because no baking process is necessary with the AD process even in the case the circuit substrate is formed to have a multilayer structure, there exists no factor that may cause decrease of yield by thermal shrinkage or dimension change contrary to the case of a LTCC substrate, and the present invention provide an advantageous feature in that decrease of yield is not likely to be caused.

Further, the first through third conductor layers 216, 219 and 224 and the first and the second electrodes layers 221 and 223 are formed of a metal or alloy, while it should be noted that these materials can be formed by a plating process, sputtering process, vacuum evaporation deposition processes, CVD process, and the like. While not particularly limited, it is preferable to use a low-resistance metal such as Cu, Ag, Au, Al or an alloy of these for the metallic material.

In the case of the LTCC process, on the other hand, the conductor is formed by baking the conductor paste containing Ag powder (thick film process), and it is not possible to reduce the specific resistance of the conductor layer to the specific resistance of Ag itself.

Contrary to this, the conductor layer of the present embodiment is formed as a continuous film, and thus, it becomes possible to reduce the resistance of the conductor layer to the specific resistance of the material itself, and the loss in the high frequency region can be reduced effectively.

In FIG. 25, it should be noted that the dielectric layer 222 is the layer formed by spraying the aerosol of the fine particle material on a base layer by an AD process with the thickness of 50 μm, for example.

For the dielectric layer 222, ceramics such as $TiO_2$, MgO, $SiO_2$, AlN, $Al_2O_3$, and the like, or a mixture thereof can be used. Further, oxide ceramics having a perovskite structure such as PZT represented by the general formula of $PbTiO_3$, $PbZrO_3$ or $Pb(Zr_{1-x}Ti_x)O_3$ ($0 \leq x \leq 1$), PLZT represented by the general formula of $(Pb_{1-y}La_y)(Zr_{1-x}Ti_x)O_3$ ($0 \leq x, y \leq 1$) $Pb(Mg_{1/3}Nb_{2/3})O_3$, $Pb(Ni_{1/3}Nb_{2/3})O_3$, $Pb(Zn_{1/3}Nb_{2/3})O_3$, $BaTiO_3$, $BaTi_4O_9$, $Ba_2Ti_9O_{20}$, $Ba(Zn_{1/3}Ta_{2/3})O_3$, $Ba(Zn_{1/3}Nb_{2/3})O_3$, $Ba(Mg_{1/3}Ta_{2/3})O_3$, $Ba(Mg_{1/3}Ta_{2/3})O_3$, $Ba(Co_{1/3}Ta_{2/3})O_3$, $Ba(Co_{1/3}Nb_{2/3})O_3$, $Ba(Ni_{1/3}Ta_{2/3})O_3$, $(Ba_{1-x}Sr_x)TiO_3$, $Ba(Ti_{1-x}Zr_x)O_3$, $ZrSnTiO_4$, $CaTiO_3$, $MgTiO_3$, $SrTiO_3$, and the like, can be used for the dielectric layer 222.

Especially, for the ceramics used for the in dielectric layer 222 of the capacitor, it is preferable to use, from the viewpoint of high dielectric constant and low loss at high frequency region, any of $TiO_2$, $BaTiO_3$, $BaSrTiO_3$, $BaTiZrO_3$, $BaTi_4O_9$, $Ba_2Ti_9O_{20}$, $Ba(Mg_{1/3}Ta_{2/3})O_3$, $Ba(Zn_{1/3}Ta_{2/3})O_3$, $Ba(Zn_{1/3}Nb_{2/3})O_3$, $ZrSnTiO_4$, $PbZrTiO_3$, $Pb(Mg_{1/3}Nb_{2/3})O_3$ and also $Pb(Ni_{1/3}Nb_{2/3})O_3$ or a mixture of two or more of these.

Further, it is possible to use the fine particle material of the ceramics, when forming the interlayer insulation film or the dielectric layer by the AD process, with a surface treatment or surface coating by the aluminum compound or lead compound as noted before with reference to the previous embodiment.

According to the investigation of the inventor of the present invention, such a surface treatment provides a more dense film as compared with the AD film formed solely by the fine particle source material when the film is formed with increased thickness of 5 μm-1 mm. Here, the amount of the coating of the aluminum compound or lead compound is preferably set to 0.1-50 mass % (more preferably 0.1-20 mass %) with respect to the total weight of the dielectric material and the coating (100 parts in mass).

For the aluminum compound, it is possible to use $Al_2O_3$, $LiAlO_2$, $MgAl_2O_4$, $CaAl_2O_4$, $SrAl_2O_4$, $BaAl_2O_4$, $Y_3Al_5O_{12}$, AlN, $Al_2O_3.nH_2O$, aluminum hydroxides ($Al.(OH)_3$), aluminum alkoxide ($Al(OR)_3$ (R: alkyl group)), mullite ($3Al_2O_3.2SiO_2$), spinel ($MgO.Al_2O_3$), cordierite ($2Al_2O_3.2MgO.5SiO_2$), anorthite ($CaO.Al_2O_3.2SiO_2$), gehlenite ($2CaO.Al_2O_3.SiO_2$), and the like. Among these aluminum compounds, it is particularly preferable to use $Al_2O_3$, aluminum hydroxide ($Al(OH)_3$) or aluminum alkoxide ($Al(OR)_3$ (R: alkyl group)).

Fir the lead compound, it is possible to use $Pb_2FeNbO_6$, $Pb_2FeTaO_6$, $Pb_2YbNbO_6$, $Pb_2YbTO_6$, $Pb_2LuNbO_6$, $Pb_2LuTaO$, $Pb_3NiNb_2O_9$, $Pb_3NiTa_2O_9$, $Pb_3ZnNb_2O_9$, $Pb_3Fe_2WO_9$, $Pb_2CdWO_6$, $PbTiO_3$, $PbZrO_3$, $PbSnO_3$, $PbHfO_3$, and the like.

Further, it is possible to provide a resistance film to the circuit substrate of the present embodiment by way of an AD process.

For the fine particle material used for forming the resistance film 243 by an AD process, it is possible to use any of oxide ceramics such as ruthenium oxide ($RuO_2$), rhenium oxide ($ReO_2$), iridium oxide ($IrO_2$), oxide ceramics having a perovskite structure such as $SrVO_3$, $CaVO_3$, $LaTiO_3$, $SrMoO_3$, $CaMoO_3$, $SrCrO_3$, $CaCrO_3$, $LaVO_3$, $GdVO3$, $SrMnO_3$, $CaMnO_3$, $NiCrO_3$, $BiCrO_3$, $LaCrO_3$, $LnCrO_3$, $SrRuO_3$, $CaRuO_3$, $SrFeO_3$, $BaRuO_3$, $LaMnO_3$, $LnMnO_3$, $LaFeO_3$, $LnFeO_3$, $LaCoO_3$, $LaRhO_3$, $LaNiO_3$, $PbRuO_3$, $Bi_2Ru_2O_7$, $LaTaO_3$, $BiRuO_3$, and further $LaB_6$.

Further, it is also possible to use the fine particle material of these with surface treatment of the aluminum compound or lead compound as explained with reference to the previous embodiment. Thereby, it becomes possible to obtain a dense resistance film particularly in the case of forming the same with the film thickness film of 5 μm-1 mm.

With regard to the deposition apparatus used for the AD process in the present embodiment, explanation has already been made with reference to FIG. 2, and further explanation will be omitted.

Next, the fabrication process of the circuit substrate according to the present embodiment will be described, wherein FIGS. 26A-26D show the fabrication process of the circuit substrate of the present embodiment.

Figure 26A:
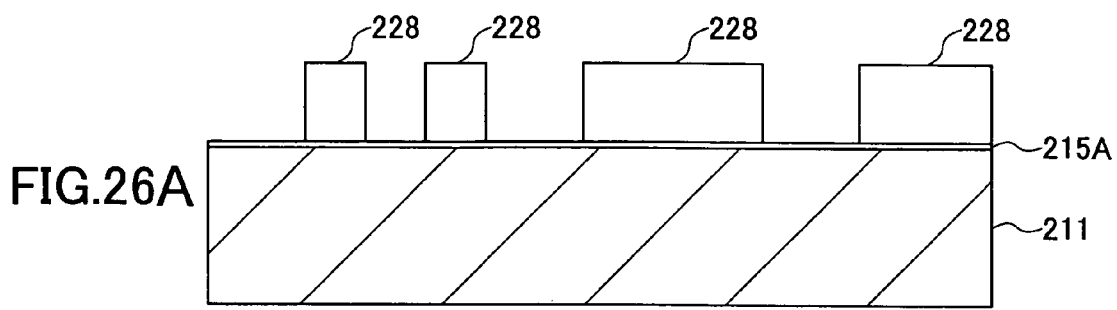
FIGS. 26A-26D and FIGS. 27A-27C are diagrams showing a fabrication process of the circuit substrate regarding the fifth embodiment.

In the step of FIG. 26A, a Cu seed layer 215A is formed so as to cover the surface of a glass substrate 211 by any of non-electrolytic plating process, vacuum evaporation deposition process, sputtering process, CVD process, and the like, and a dry film resist having a thickness of 40 μm is laminated on the surface of the seed layer 215A as a resist film 228 with the press roll temperature of 105° C. and line pressure of 4 kg/cm.

Next, an interconnection pattern is exposed by using a parallel ultraviolet beam of all the wavelengths, followed by a developing process conducted by a spraying process while using an aqueous solution of 1 wt % sodium carbonate, and a resist pattern 228 patterned according to the interconnection pattern is obtained.

Figure 26B:
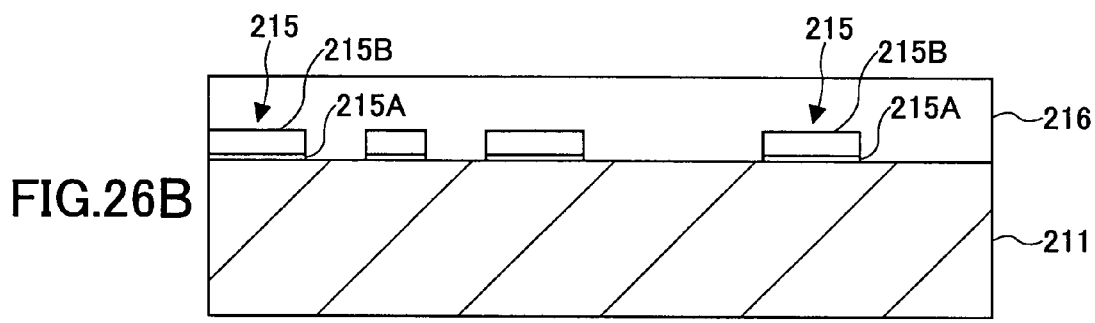

Next, in the step of FIG. 26B, a plating layer 215B of Cu is formed on the seed layer 215A with the thickness 5 μm by an electrolytic plating process while using the seed layer 215A for the electrode, and the first conductor layer 215 is formed as a result. Hereinafter, the lamination of the seed layer 215A and the plating layer 215B will be referred to as the first conductor layer 215.

Next, the resist film 228 is removed, and a part of the seed layer 215A other than the first conductor layer 215 is removed by a panel etching process. Thereby, a mixture of hydrogen peroxide water and sulfuric acid is used for the etchant. It should be noted that the first conductor layer 215 may be formed by a non-electrolytic plating process, vacuum evaporation deposition process, sputtering process, or CVD process after forming the interconnection pattern in the resist film 228 without forming the seed layer 215A of the plating process.

In the step of FIG. 26B, the first interlayer insulation film 216 is formed further by spraying the fine particle material by an AD process while by using the AD deposition apparatus shown in FIG. 2. For the source material of the AD process, a fine particle material of MgO having an average diameter of 0.3 μm is used, wherein the fine particles of the MgO are covered with an $Al_2O_3$ coating by conducting a surface treatment processing of aluminum isopropoxide, which is a kind of aluminum alkoxide, followed further by a baking conducted at 1000° C. in the atmosphere.

Here, the film formation by the AD process is conducted for 30 minutes, and as a result, the first interlayer insulation film 216 of MgO containing $Al_2O_3$ is formed with the thickness of 50 μm. Thereby, the ratio of the MgO fine particle material to the $Al_2O_3$ coating is set to 2:8-8:2.

For the fine particle material used for forming the interlayer insulation films such as the first interlayer insulation film 216, it is possible to use, in addition to MgO, the materials selected from any of $Al_2O_3$, $SiO_2$, CaO, $3Al_2O_3.2SiO_2$, $MgO.Al_2O_3$, $2MgO.SiO_2$, $2Al_2O_3.2MgO.5SiO_2$, $CaO.Al_2O_3.2SiO_2$ or a mixture of two or more of these.

Further, it is possible to use these fine particle materials with the surface treatment process or surface coating process by using the aluminum compound or lead compound explained before.

Further, according to the needs, it is possible to apply a planarization process to the surface of the first interlayer insulation film 216 by conducting a mechanical polishing process or chemical mechanical polishing (CMP) process.

Figure 26C:
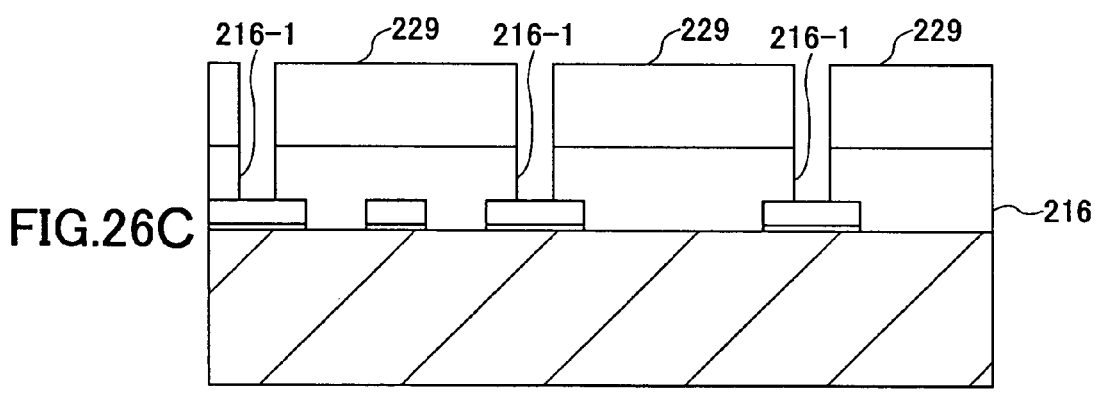

Next, in the step of FIG. 26C, a resist film 229 is formed on the structure of the FIG. 26B, followed by patterning the resist film 229. Further, by applying an etching process to the first interlayer insulation film 216 while using hydrofluoric acid, and the like for the etchant, a via-hole 216-1 is formed so as to expose the first conductor layer 215. Thereby, the depth of the via-hole is controlled by the duration of immersion to the hydrofluoric acid.

After this, the resist film 229 is removed.

Figure 26D:
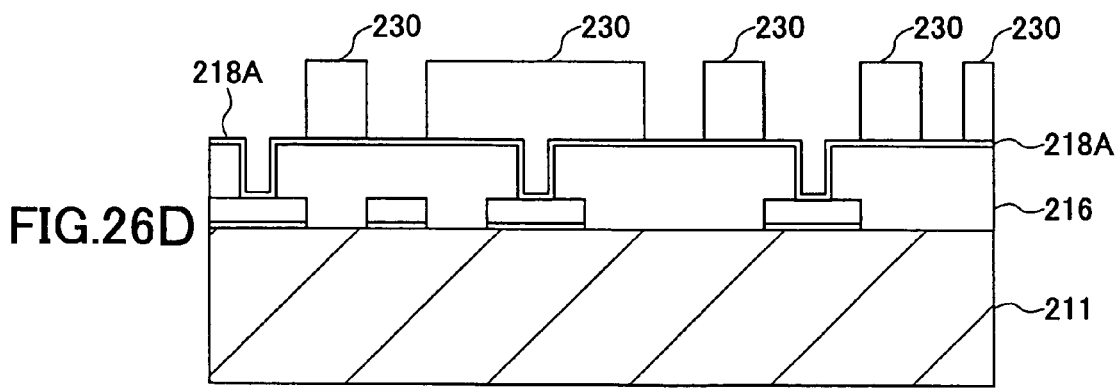

Next, in the step of FIG. 26D, a seed layer 218A for a plating process is formed by laminating a Cr film and a Cu film consecutively on the surface of the structure of FIG. 26C by a sputtering process, and a resist film 230 is laminated on the surface of the seed layer 218A by using a dry film resist having a thickness of 40 μm, for example.

Next, the resist film 230 is exposed with an interconnection pattern by using a parallel ultraviolet beam of all the wavelengths, followed by a developing process conducted by a spraying process that uses an aqueous solution of sodium carbonate of 1 wt %. With this, a resist film 230 patterned according to a desired interconnection pattern is obtained.

Figure 27A:
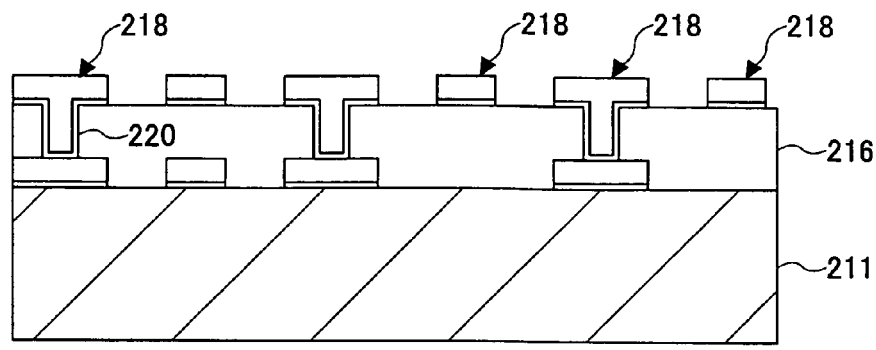

Next, in the step of FIG. 27A, a Cu layer 218B is formed on the seed layer 218A with the thickness of 5 μm by an electrolytic plating process while using the seed layer 218A as an electrode, and with this, the second conductor layer 218 and the via-plugs 217 are formed. Here, the lamination of the seed layer 218A and Cu plating layer 218B will be referred to as the second conductor layer 218.

Next, the resist film 230 is removed and a part of the seed layer 218A other than the second conductor layer 218 is removed by a panel etching process.

Figure 27B:
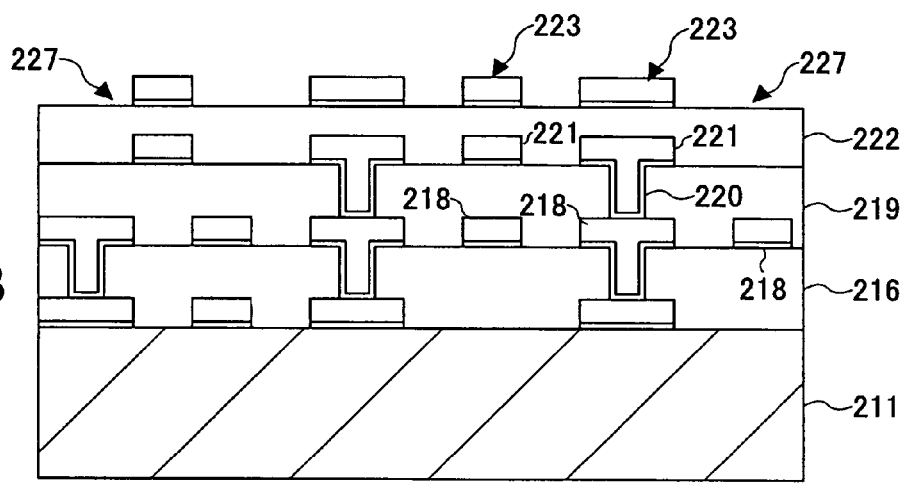

Next, in the step of FIG. 26B, a second interlayer insulation film 219 is formed on the structure of FIG. 27A similarly to the process of FIG. 27B.

In the step of FIG. 27B, a first electrode layer 221 and a via-plug 220 are formed on the second interlayer insulation film 219 similarly to the steps of FIG. 26C-FIG. 27A such that the via-plug 220 connects the first electrode layer 221 and the second conductor layer 218.

In the step of FIG. 27B, the dielectric layer 222 is formed by spraying a fine particle material by using the AD deposition apparatus shown in FIG. 2 such that the dielectric layer 22 covers the second interlayer insulation film 219 and the first electrode layer 221.

For the fine particle material of the dielectric layer 222, a $BaTiO_3$ fine particle material having an average diameter of 0.3 μm is used with a surface treatment by aluminum isopropoxide, which is a kind of aluminum alkoxide, followed by a baking process at 1000° C. in the atmosphere such that the fine particles of BaTiO$_3$ are covered with an Al$_2$O$_3$ coating.

In the step of FIG. 27B, the AD process of the dielectric film 222 is continued for 3 minutes and a BaTiO$_3$ film containing the Al$_2$O$_3$ is obtained for the dielectric layer 222 with the thickness of 5 µm. Here, the ratio of the BaTiO$_3$ fine particle material and the Al$_2$O$_3$ film is set to 95:5 in terms of mass.

It is noted that the dielectric layer 222 is formed of a material different from the material constituting the underlying second interlayer insulation film 219. Even in such a case, an interface of high adherence strength is realized in the present embodiment as a result of the use of the AD process, in which the fine particle material of the dielectric layer 222 removes the contamination from the outermost surface of the material constituting the second interlayer insulation film 219 and further causes activation of such a surface.

In the step of FIG. 27B, the second electrode layer 223 is formed further on the dielectric layer 222 by forming the seed layer 223A and the plating film 223B, and with this, the capacitor 227 is formed such that the dielectric layer 222 is sandwiched between the first electrode layer 221 and the second electrode layer 223.

Figure 27C:
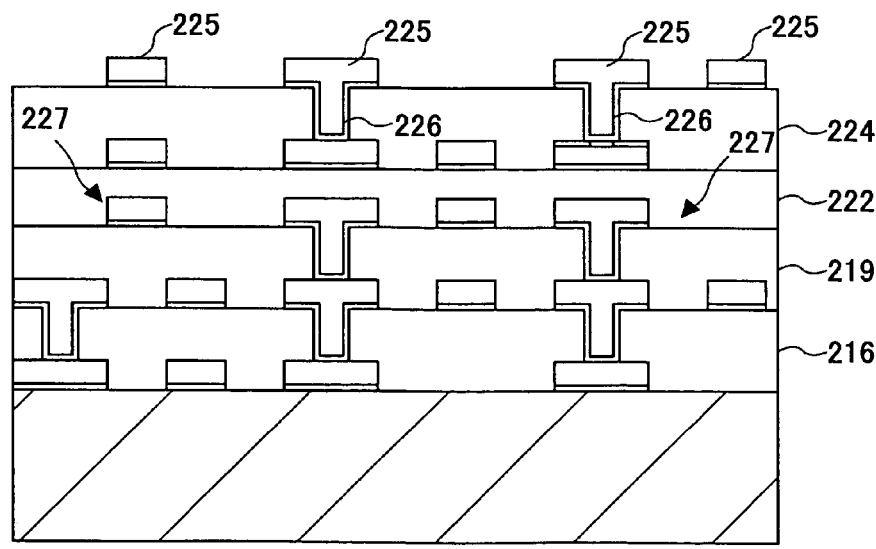

In the step of FIG. 27C, the third interlayer insulation film 224 is formed further on the structure of FIG. 27B, and the third conductor layer 225 is formed selectively on the third interlayer insulation film 224. With this, the circuit substrate shown in FIG. 27C is obtained.

On the circuit substrate 210, it is possible to form a filter by forming a microstrip line between any of the interlayer insulation films 216, 219 and 224 and the dielectric layer 222 by patterning similarly to the conductor layers 215, 218, and 225, or by forming an inductor by forming a spiral inductor or meander inductor.

Further, by using the method similar to the one described above, it is possible to form passive components such as laminated ceramic capacitors, thin film coils, laminated coils, or a filter that uses these, or a filter that uses a strip line.

More specifically, such a passive component can be formed by forming a laminated body by laminating the dielectric layers and conductor patterns by the method mentioned before, scribing or cutting the laminated body thus formed into the predetermined shape or size, and then providing electrodes thereon by a sputtering process or plating process.

Hereinafter, Examples and Comparative Examples of the present embodiment will be described with reference to the drawings.

EXAMPLE 18

Figure 28:
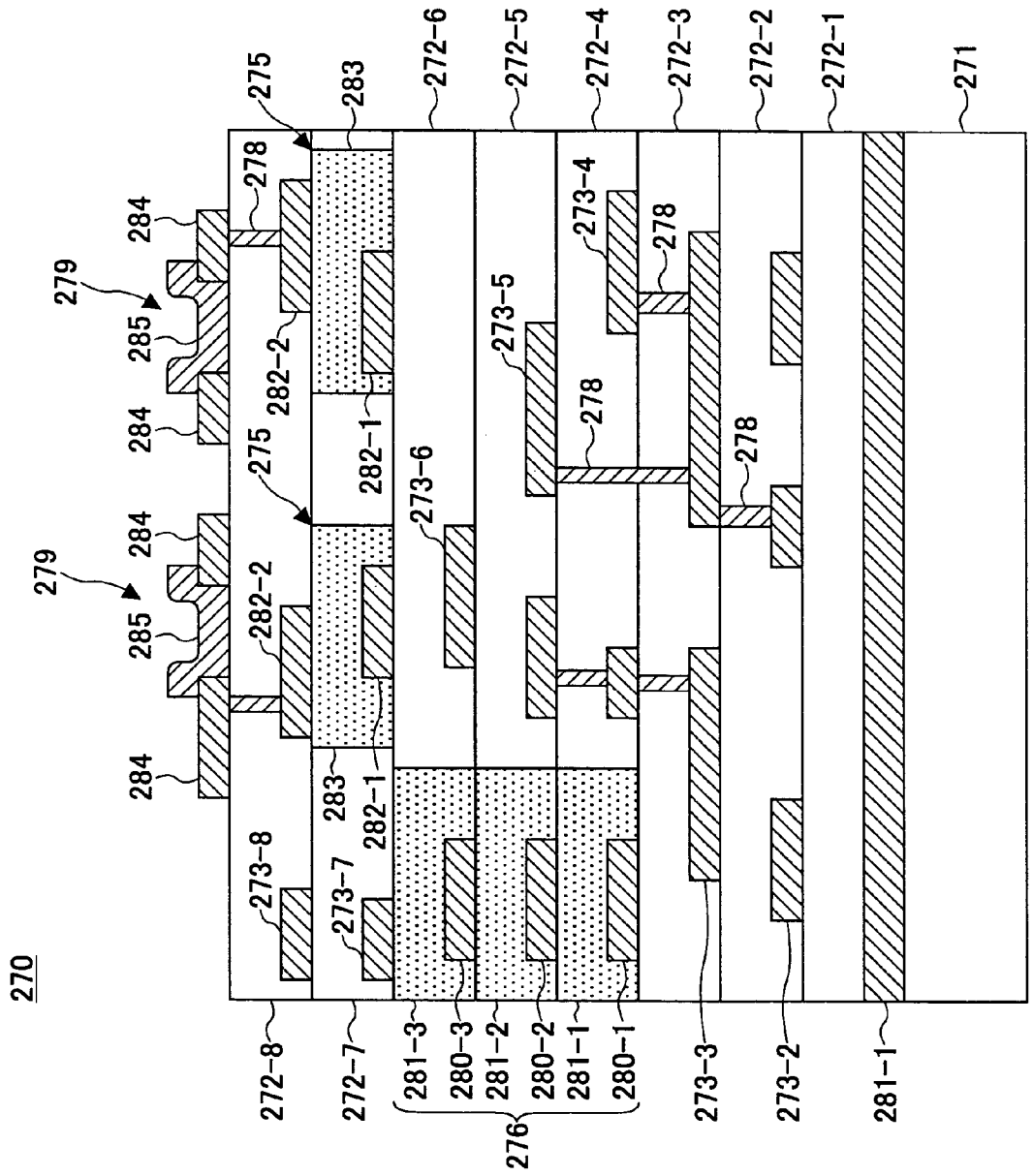
FIG. 28 is a cross-sectional diagram showing the general construction of a circuit substrate according to an example of the fifth embodiment.

FIG. 28 is a cross-sectional diagram showing the general construction of a circuit substrate 270 according to Example 18 the present invention.

Referring to FIG. 28, the circuit substrate 270 of Example 18 is formed of a glass substrate 271, an interconnection layer formed on the glass substrate 271 as an alternate lamination of an interlayer insulation film 272 and conductor layer 273, a capacitor 275 and a filter 276 formed selectively in the interlayer insulation film 272, a via-plug 278 connecting the conductor layers, and a resistance element 279 formed on a surface of the circuit substrate 270.

First, a seed layer of a Cr film and a Cu film are formed on the entire surface of the glass substrate by a sputtering process with respective thicknesses of 0.1 µm and 0.5 µm, and a Cu film is formed by an electrolytic plating process with a thickness 5 µm while using the seed layer as an electrode. With this, a conductor layer 273-1 as a laminated body of the seed layer and the Cu plated film.

Next, by using the deposition apparatus for the AD process shown in FIG. 2, an interlayer insulation film 272-1 is formed on the conductor layer 273-1 of with the thickness 100 µm while using an MgO fine particle material coated with Al$_2$O$_3$.

In this AD process, a high purity nitrogen gas (99.9% purity) having a pressure of 19.6 Pa (2 kg/cm$^2$) is used for the carrier gas, and the aerosol of the fine particle material is formed by setting the flow rate of the carrier gas to 4 L/minute.

During the deposition process, the pressure of the growth chamber is set to 5 Pa-10 Pa and the deposition is conducted for 30 minutes while setting the flow rate of the aerosol of the MgO fine particle material covered with the Al$_2$O$_3$ coating, to 30 g/hour.

In Example 18, Furthermore, the MgO fine particle material thus covered with the Al$_2$O$_3$ coating is prepared as follows.

First a suspension of the MgO fine particle material is prepared by adding a MgO fine particle material having an average diameter of 0.25 µm (product of Kojundo Chemical Laboratory Co., Ltd.) to an isopropyl alcohol while stirring, and aluminum isopropoxide is mixed to this suspension.

After stirring at 60° C. for one hour, the solvent is removed by using a centrifugal separator, and a dry powder body is obtained after heating and drying. Thereafter, a baking process is conducted at 1000° C. for 2 hours, and with this, the MgO fine particle material having the Al$_2$O$_3$ coating is obtained. Here, the ratio of the MgO fine particle material and the Al$_2$O$_3$ coating is set to 95:5 in terms of mass.

Next, the seed layer of plating process is formed on interlayer insulation film 172-1 by sputtering of a Cr film and a Cu film with respective thicknesses of 0.1 µm and 0.5 µm, and a dry film resist (NIT215 provided by Nichigo Morton Co. Ltd.) having a film thickness of 40 µm is laminated on the surface of the seed layer as a resist film with the press roll temperature of 105° C. and line pressure of 4 kg/cm.

Next, an interconnection pattern is exposed upon the resist film by using a parallel ultraviolet beam of all the wavelengths.

Further, by conducting a spray developing process while using an aqueous solution of 1 wt % sodium carbonate, a resist film (not shown) patterned according to the interconnection pattern is obtained.

Next, a plating film of Cu is formed on the seed layer by an electrolytic plating process, and a conductor layer 73-2 formed of the seed layer and the Cu plating film is obtained.

Next, after removing the resist film, the part of the seed layer other than the conductor layer 273-2 is removed by a panel etching process while using a mixed liquid of hydrogen peroxide water and sulfuric acid for the etchant.

Further, the interlayer insulation films 272-2-272-8 and the conductor layers 273-3-273-8 are formed repeatedly according to the process explained above.

Further, the filter 276 is formed by laminating strip lines 280-1-280-3 of Cu formed by a sputtering process and dielectric layers 281-1-281-3 while masking the insulation films 272-4-272-6 by a resist film (not shown).

Here, the dielectric layer is formed by an AD process while using a Ba(Mg$_{1/3}$Ta$_{2/3}$)O$_3$ fine particle material covered with an Al$_2$O$_3$ coating, wherein the Ba(Mg$_{1/3}$Ta$_{2/3}$)O$_3$ fine particle material having the Al$_2$O$_3$ coating is prepared as follows.

First, a suspension of Ba(Mg$_{1/3}$Ta$_{2/3}$)O$_3$ fine particles is prepared by adding the Ba(Mg$_{1/3}$Ta$_{2/3}$)O$_3$ fine particle material having an average diameter of 0.8 µm (product of Kojundo Chemical Laboratory Co., Ltd.) is added to an isopropyl alcohol under stirring, and aluminum isopropoxide is mixed to this suspension.

Thereafter, the suspension is heated to 60° C. and stirred further for one hour. Further, the solvent is removed by using a centrifugal separator, and a powder body is obtained after heating and drying.

The powder body thus formed is then baked for 2 hours at 1000° C., and with this, the $Ba(Mg_{1/3}Ta_{2/3})O_3$ fine particle material having the $Al_2O_3$ coating formed by the surface treatment of aluminum isopropoxide is obtained. Here, the ratio between the $Ba(Mg_{1/3}Ta_{2/3})O_3$ fine particle material and the $Al_2O_3$ coating is set to 95:5 in terms of mass.

Further, a lower electrode layer 282-1 of the capacitor is formed similarly to the process of patterning the conductor layer 273-2, and a dielectric layer 283 is formed by an AD process with the thickness of 10 μm was while using a $BaTiO_3$ fine particle material formed with the $Al_2O_3$ coating, such that the dielectric layer 283 covers the lower electrode layer 282-1. Here, it should be noted that the $BaTiO_3$ fine particle material having the $Al_2O_3$ coating is obtained from a $BaTiO_3$ fine particle material having an average diameter of 0.5 μm, (product of SAKAI CHEMICAL INDUSTRY CO., LTD.) similarly to the case of the MgO fine particle material. Here, the ratio of the $BaTiO_3$ fine particle material to the $Al_2O_3$ coating is set to 95:5 in terms of mass.

Further, an electrode layer 284 is formed on the surface of the circuit substrate 270, and after laminating a dry film resist (not shown) as a resist film, a resistance pattern is exposed to the resist film thus formed.

After developing the resist film, a Ta film is deposited by an AD process for 30 minutes while using a Ta powder having an average diameter of 0.01 μm (product of Kojundo Chemical Laboratory Co., Ltd.) and a resistance film 285 of Ta is formed between the electrodes 84 with the thickness of 50 μm.

Thereafter, the resist film is removed, and with this, a resistance element 279 is formed on the circuit substrate 270.

EXAMPLE 19

In Example 19, a silicon wafer is used for the substrate 271, and the interlayer insulation films 272-1-272-8 of Example 18 are formed by an AD process while using a mullite ($3Al_2O_3.2SiO_2$) fine particle material processed with the surface treatment by aluminum isopropoxide. Further, the dielectric layers 281-1-281-3 of the filter is formed by a $BaTi_4O_9$ fine particle material having an $Al_2O_3$ coating, while the dielectric layer 283 of the capacitor is formed by a $BaSrTiO_3$ fine particle material having the $Al_2O_3$ coating. Otherwise, Example 19 is identical to Example 18.

Here, the mullite fine particle material processed with the surface treatment by aluminum isopropoxide is prepared as follows.

First, a mullite fine particle material having an average diameter of 0.8 μm (product of Kojundo Chemical Laboratory Co., Ltd.) is added to an isopropyl alcohol under stirring, to form a suspension in addition. Further, aluminum isopropoxide is mixed to this suspension and heated to 60° C. while stirring for one hour.

Thereafter, the solvent is removed by a centrifugal separator and a powder body is obtained after heating and drying. With this, the mullite fine particle material processed with the surface treatment of aluminum isopropoxide is obtained. Thereby, the ratio of the mullite fine particle material and the $Al_2O_3$-equivalent mass of aluminum isopropoxide is set to 95:5.

Further, the $BaTi_4O_9$ fine particle material having the $Al_2O_3$ coating and the $BaSrTiO_3$ fine particle material having the Al2O3 coating are obtained by forming $Al_2O_3$ film similarly to the MgO fine particle material of Example 18 having the $Al_2O_3$ coating, wherein the ratio of the $BaTi_4O_9$ fine particle material to the $Al_2O_3$ coating is set to 98:2 in terms of mass, and the ratio of the $BaSrTiO_3$ fine particle to the $Al_2O_3$ coating is set to 98:2 in terms of mass.

EXAMPLE 20

In Example 20, a silicon wafer is used as the substrate 271 and the interlayer insulation films 272-1-272-8 of Example 18 are formed by an AD process by using a $Ba(Mg_{1/3}Ta_{2/3})O_3$ fine particle material processed with the surface treatment of aluminum isopropoxide. Further, the resistance film 285 of the resistance element 279 is formed by an AD process by using a $RuO_2$ fine particle material. Thus, Example 20 is similar to Example 18 except that the capacitor is not formed.

Here, it should be noted that the $Ba(Mg_{1/3}Ta_{2/3})O_3$ fine particle material processed with the surface treatment of aluminum isopropoxide is prepared as follows.

First, a suspension the $Ba(Mg_{1/3}Ta_{2/3})O_3$ fine particle material is prepared by adding the $Ba(Mg_{1/3}Ta_{2/3})O_3$ fine particle material having an average diameter of 0.8 μm (product of Kojundo Chemical Laboratory Co., Ltd.) to an isopropyl alcohol under stirring.

Next, aluminum isopropoxide is mixed to this suspension and agitated for one hour after heating to 60° C.

After removing the solvent by a centrifugal separator, followed by heating and drying process, the $Ba(Mg_{1/3}Ta_{2/3})O_3$ fine particle material processed with the surface treatment by aluminum isopropoxide is obtained in the form of a powder body. Here, the ratio of the mass of $Ba(Mg_{1/3}Ta_{2/3})O_3$ fine particle material to the equivalent mass of $Al_2O_3$ in the aluminum isopropoxide is set to 95:5. In the formation of the resistance film 285, the $RuO_2$ fine particle material having an average diameter of 0.05 μm (Kojundo Chemical Laboratory Co., Ltd. company production) is used.

EXAMPLE 21

Example 21 is identical to Example 20 except that the interlayer insulation film is formed by an aluminum nitride (AlN) fine particle material processed with the surface treatment by aluminum isopropoxide.

COMPARATIVE EXAMPLE 4

Figure 29:
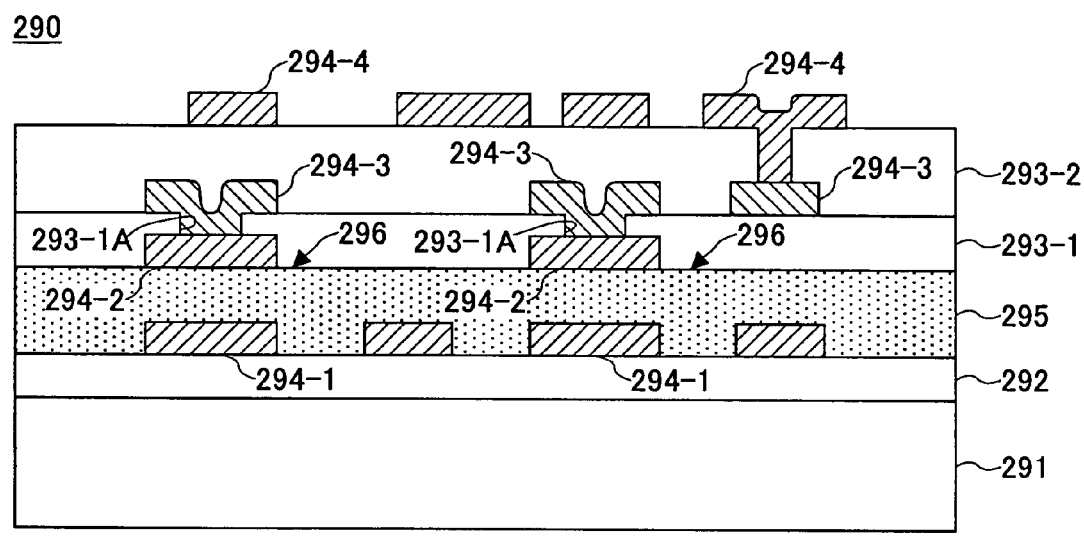
FIG. 29 is a cross-sectional diagram showing the general construction of a circuit substrate according to a comparative example to the example of FIG. 28.

FIG. 29 is a cross-sectional diagram showing the general construction of a circuit substrate 290 according to Comparative Example 4 not forming a part of the present invention.

Referring to FIG. 29, the circuit substrate 290 of Comparative Example 4 uses an insulating photosensitive polyimide for the interlayer insulation film 293, a Cu film formed by a sputtering process for the conductor layer 294, and a $BaSrTiO_3$ film formed by a sputtering process for the dielectric layer 295.

More specifically, a silicon wafer formed with a thermal oxidation layer 292 is used as a substrate 291, and a conductor layer 294-1 is formed on the thermal oxidation layer 292 by a sputtering process.

Next, a resist film having a thickness of about 10 μm (not shown) is applied to the surface of conductor layer 294-1, and exposure is made by a mercury lamp with the exposure dose of 400 MmJ/cm$^2$ while providing a glass mask thereon, and the exposed part is removed by dissolving to an alkaline developer. Further, patterning of the conductor layer 294-1 is conducted, and with this, the interconnection pattern is formed.

Next, a dielectric layer 295 of a BaSrTiO3 is formed with the thickness 50 μm by a sputtering process so as to cover the thermal oxide layer 292 and the conductor layer 294-1. Further, a conductor layer 294-2 is formed on the dielectric layer 294 selectively by a sputtering process, and with this, a capacitor 296 having the dielectric layer 295 between the conductor layers 294-1 and 294-2 is formed.

Next, an insulative photosensitive polyimide is applied by a spin coating process with the thickness of about 30 μm so as to cover the dielectric layer 295 and the conductor layer 294-2. Further, after conducting a drying process at 80° C. for 30 minutes, an interlayer insulation film 293-1 is formed.

Next, via-holes 293-1A are formed as a result of exposure and development process of the interlayer insulation film 293-1 so that the conductor layer 294-2 is exposed. Further, heating is conducted at 350° C. for 30 minutes such that the insulative photosensitive polyimide constituting the interlayer insulation film 293-1 is cured.

Next, a conductor layer 294-3 is formed on the surface of the interlayer insulation film 293-1 with the thickness of about 5 μm so as to fill the via-holes 293-1A by a sputtering process, and an interlayer insulation film 293-2 is formed by using the insulating photosensitive polyimide according to the method mentioned above so as to cover interlayer the insulation film 293-1 and the conductor layer 294-3. Further, a conductor layer 294-4 is formed.

COMPARATIVE EXAMPLE 5

Figure 30:
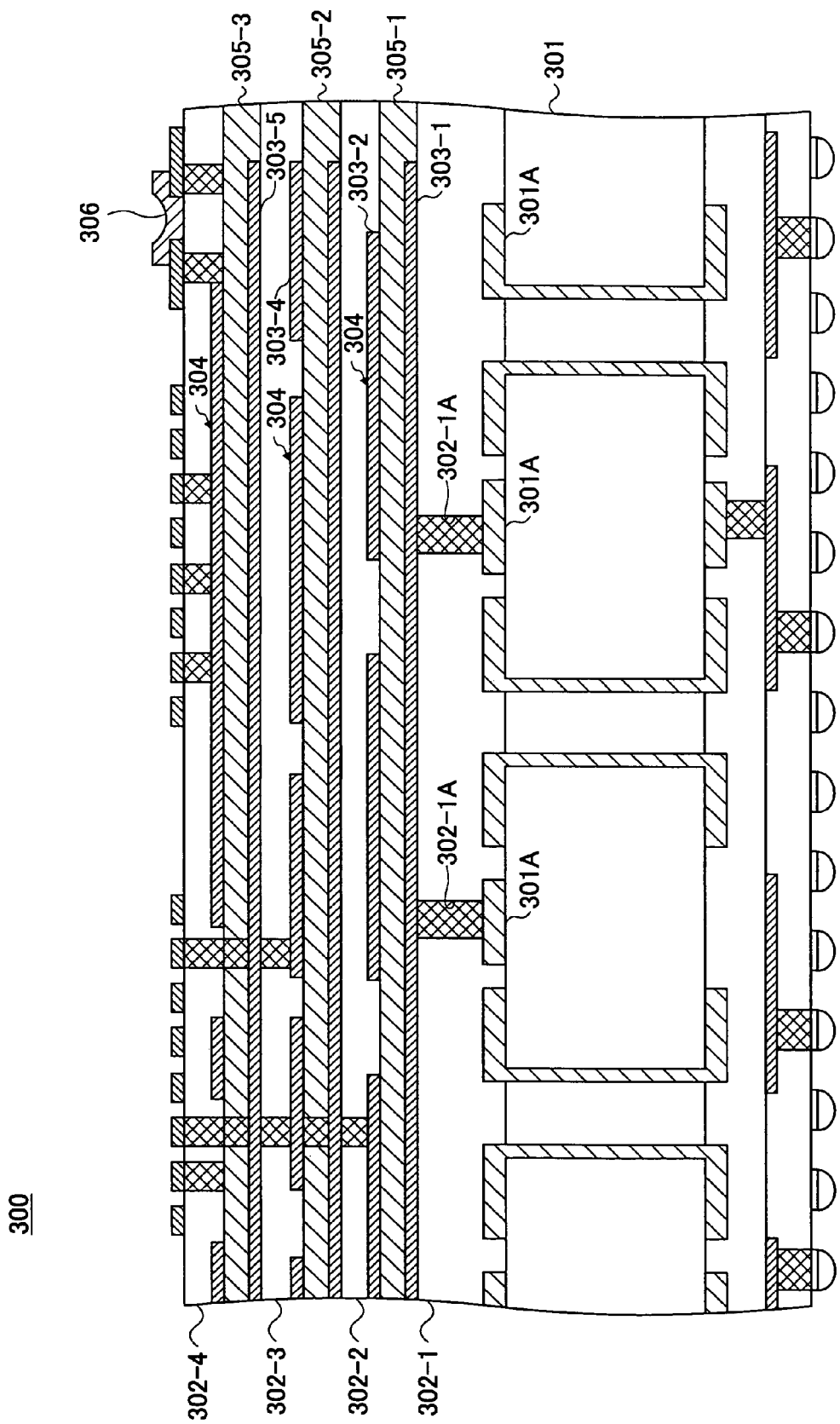
FIG. 30 is a cross-sectional diagram showing the general construction of a circuit substrate according to a different comparative example.

FIG. 30 is a cross-sectional view showing a general construction of a circuit substrate 300 according to Comparative Example 5 not forming a part of the present invention.

Referring to FIG. 30, the circuit substrate 300 of Comparative Example 5 includes a substrate 301, an interlayer insulation film 302 of an epoxy resin sheet formed on the substrate 301, a conductor layer 303 of Cu formed by a plating process, a dielectric layer 305 of a mixture of an oxide ceramics and epoxy resin constituting a capacitor 304 provided between the interlayer insulation films 302, and the like.

First, by using a FR-4 substrate carrying copper films on both sides thereof as a substrate 301, an epoxy resin sheet having a thickness of 50 μm (product name ABF-SH-9K of Ajinomoto Co., Inc.) is deposited on a Cu film 301A of the substrate 301 as an interlayer insulation film 302-1.

Next, by laminating a desmear protection film of 40 μm thickness (NIT215 provided by Nichigo Morton Co. Ltd.) on the surface of the interlayer insulation film 302-1 with a press roll temperature of 105° C. and a line pressure of 4 kg/cm, a desmear protection film (not shown) is formed so as to cover the entire surface of the interlayer insulation film 302-1.

Next, a laser beam of a UV-YAG laser is irradiated with the energy of 3 mW to the surface of the interlayer insulation film 302-1 via the desmear protection film, and via-holes 302-1A of about 50 μm diameter are drilled therein. Further, the surface of the substrate 301 is treated in an oxygen plasma apparatus, and the desmear protection film is removed thereafter. Further, the substrate is washed and dried.

Next, the surface of the interlayer insulation film 302-1 thus formed with the via-holes 302-1A is covered by a seed layer 303-1A of Cu by forming the seed layer 303-1A thereon by a non-electrolytic plating process, and a Cu plating layer 303-1B is formed thereon by an electrolytic plating process while using the Cu seed layer 303-1A as an electrode. With this, a conductor layer 303-1 is obtained by the Cu seed layer 303-1A and the Cu plating layer 303-1B.

Next, a dielectric layer is formed by a printing process with the thickness of 50 μm on the conductor layer 303-1 while using a composite paint formed of BaTiO3 particles having an average diameter of 0.5 μm and an epoxy resin, and the surface thereof is polished and planarized by a CMP process until to the thickness of 10 μm.

Next, a seed layer 303-2A of Cu is formed by a non-electrolytic plating process so as to cover the surface of the dielectric layer, and a dry film resist having a film thickness of 40 μm (NIT215 of Nichigo Morton Co. Ltd.) is laminated to the surface of the seed layer 303-2A with a press roll temperature of 105° C. and line pressure of 4 kg/cm.

Next, the dry resist film is exposed according to the interconnection pattern to be formed by using a parallel ultraviolet beam of all the wavelengths. Further by developing the exposed resist film by a spraying process while using the 1 wt % aqueous solution of sodium carbonate, a resist film (not shown) patterned according to the desired interconnection pattern is obtained.

Next, while using the seed layer 303-2A as an electrode, a Cu plating layer 303-2B is formed by an electrolysis plating process, and with this, a conductor layer 303-2 formed of the seed layer 303-2A and the Cu plating layer 303-2B is obtained. Thereafter, the resist film is removed.

By repeating the formation of the interconnection layer including therein the interlayer insulation film and the conductor layer and the dielectric layer, there are formed capacitors 304 formed of the conductor layers 303-1-303-6 and the dielectric layers 305-1-305-3. For example, there is formed a capacitor 304 having the dielectric layer 305-1 between the conductor layers 303-1 and 303-2.

Further, a dry film resist (not shown) is laminated on the surface of circuit substrate 300, and after patterning the same by an exposure and developing process, a Ta film is deposited by conducting a sputtering process for 15 minutes to form a resistance film 306 having a thickness of 50 μm. Thereafter, the dry film resist is removed.

Finally, the entire structure is unified by bonding the same with each other by using a vacuum lamination press under the pressure of 60 Torr or less at the temperature of 180° C. for 70 minutes while applying a line pressure of 30 kg/cm. Further, a surface coating layer is formed by using a screen printing process and a photolithographic process.

COMPARATIVE EXAMPLE 6

Figure 31:
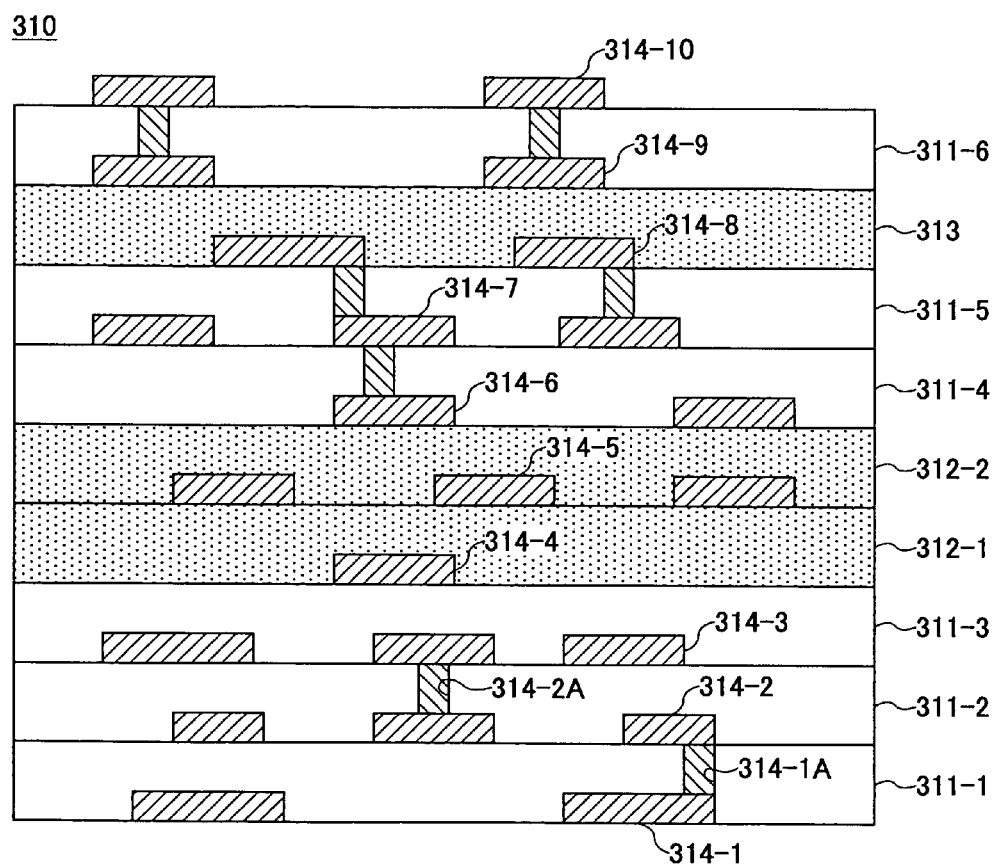
FIG. 31 is a cross-sectional view showing the general construction of a circuit substrate according to another comparative example.

FIG. 31 is a cross-sectional diagram showing a general construction of a circuit substrate 310 according to Comparative Example 6 not constituting a part of the present invention.

Referring to FIG. 31, the circuit substrate 310 of Comparative Example 6 includes an interlayer insulation film 311 formed of a low-temperature baking ceramics, a dielectric layer 312 used for a capacitor, a dielectric layer 313 used for a filter, a conductor layer 314 formed by the baking a conductor paste (thick film process), and the like.

First, a green sheet of glass alumina forming the interlayer insulation films 311-1-311-6 is prepared.

More specifically, an $Al_2O_3$ powder having an average diameter of 5 μm and a borosilicate glass powder having an average diameter of 3 μm are mixed with respective proportions of 20 vol % and 80 vol %, and a PVB (polyvinyl butyral) resin and dibutyl phthalate used for a plasticizer are added thereto respectively with a proportion of 8% in mass and 3% in mass respectively with respect to the total amount (100% in mass) of the foregoing powders. Further, the mixture thus formed is kneaded in a ball mill for 20 hours while using acetone as a solvent.

Next, a slurry thus kneaded is shaped by using a doctor blade to form the green sheet with the thickness of 200 μm. This green sheet is subsequently cut and punched according to the desired form.

Next, via-holes 114-1A, and the like, are formed in the green sheet thus obtained with a diameter of 80 μm by conducting a punching process, and the via-holes 114-1A thus formed are filled with an Ag conductor paste.

After this, drying is conducted at 80° C. for 30 minutes by using a thermostatic oven, and a circuit pattern is formed on the surface of the green sheet thus dried by a screen printing process while using an Ag conductor paste as a conductor material.

Next, a green sheet of BMT ($Ba(Mg_{1/3}Ta_{2/3})O_3$) glass used for the dielectric layers 312-1-312-2 of a filter is prepared.

Thus, 50 vol % of $Ba(Mg_{1/3}Ta_{2/3})O_3$ powder having an average diameter of 3 μm and 50 vol % of borosilicate glass powder having an average diameter of 5 μm are mixed to form a mixture, and a PVB resin and dibutyl phthalate, which is used for a plasticizer, are further added to 100 mass % of the powder mixture with respective proportions of 8% and 3% in mass. Further, similarly to the process of the interlayer insulation film, a green sheet having a thickness of 200 μm is produced, and formation of via-holes are formed by conducting a patterning process thereto.

Next, a green sheet for the dielectric layer 313 of the capacitor is prepared.

More specifically, a 30 vol % of $CaZrO_3$ powder having an average diameter of 3 μm and a 70 vol % of borosilicate glass powder having an average diameter of the 5 μm are mixed to form a mixture, and 8% in mass of a PVB resin and 3% in mass of dibutyl phthalate, which is used as a plasticizer, is added to 100% in mass of the mixture, followed by formation of a green sheet with the thickness of 200 μm according to a process similar to the case of forming the interlayer insulation film. Further, via-holes are formed by conducting a patterning process to the green sheet.

The green sheets thus prepared are aligned and laminated, and an integral laminated body is obtained the by applying heating and also pressure at 80° C. for 30 minutes by using a press machine. The integral laminated body thus formed is then baked in an atmosphere environment at 900° C. for 2 hours, and with this, the substrate of Comparative Example 6 is obtained.

Evaluation of Interlayer Insulation Film and Conductor Film

FIG. 32 is a diagram showing the characteristics of the interlayer insulation film and the conductor film formed on the various circuit substrates of Embodiments 18-21 and Comparative Examples 4-6.

Referring to FIG. 32, it will be noted that the interlayer insulation films of Comparative Examples 4-6 have a dielectric loss of 0.001 or more at 2 GHz, while the interlayer insulation films of Examples 18-21 have a substantially smaller dielectric loss in 2 GHz of 0.00025-0.0005.

Further, it can be seen that the conductor layers of Comparative Examples 4 and 6 have a specific resistance of 5-8 μΩcm, while the conductor layers of Examples 18-21 have a considerably lower specific resistance of 2 μΩcm.

Further, while the conductor layer of Comparative Example 5 has a specific resistance of 2, Ωcm, it is noted that the dielectric loss of the interlayer insulation film of this case has a larger value of 0.0125 as compared with Examples 18-21.

In this way, it was confirmed that the high frequency loss for Comparative Examples 4-6 takes the value of 0.8-1 times as large as the case of Comparative Example 2, while in the case of Examples 18-21, the high frequency loss is reduced considerably to 0.6-0.7 times as large as in the case of Comparative Example 2 as represented in FIG. 32.

Here, it should be noted that the dielectric loss of the interlayer insulation film is measured by a perturbation method while using a network analyzer. Further, the specific resistance of the conductor layer is measured by using a quadrupole method.

Evaluation of Dielectric Layer For Filters

FIG. 33 is a diagram showing the characteristics of the dielectric layers formed on the various circuit substrates of Examples 18 and 19 and Comparative Example 6 as a part of the filter.

Referring to FIG. 33, it can be seen that the dielectric layer for the filter of Comparative Example 6, has a specific dielectric constant of 15 at 2 GHz, while the dielectric layer for the filter of Examples 18 and 19 has a larger specific dielectric constant of 20 at 2 GHz.

Further, it can be seen that the dielectric layer of the filter of Comparative Example 6 has the dielectric loss 0.00125 at 2 GHz, while the dielectric layer for the filter of Examples 18 and 19 has a considerably smaller dielectric loss of 0.00025-0.0003 at 2 GHz.

Thus, by combining the results of specific resistance for the conductor layers of FIG. 32, it is concluded that the dielectric layers for the filters of Examples 18 and 19 have a considerably smaller loss and larger specific dielectric constant at high frequencies as compared with Comparative Example 6.

Here, it should be noted that the specific dielectric constant and dielectric loss of the dielectric layers for the filters are measured by a perturbation method while using a network analyzer Evaluation of Dielectric Layer for Capacitor FIG. 34 is a diagram showing the characteristics of the dielectric layer for a capacitor formed according to the circuit substrates of Examples 18 and 19 and Comparative Examples 14-16.

Referring to FIG. 34, it can be seen that the dielectric layers for the capacitor of Comparative Examples 4-6 have a specific dielectric constant of 50-300 at 2 GHz, while the dielectric layers for the capacitor of Examples 18 and 19 have a larger specific dielectric constant of 800-2000 at 2 GHz.

From this, it is concluded that the dielectric layer for the capacitor of Examples 18 and 19 have a considerably larger specific dielectric constant as compared with Comparative Examples 4-6.

As a result, the electrostatic capacitance density of the capacitor of Comparative Examples 4 and 6 has the relative value of 5-10 with respect to the electrostatic capacitance density of Comparative Example 2 as shown in FIG. 34, while the electrostatic capacitance density of Examples 18 and 19 has a considerably large relative value of 10-20.

Here, it should be noted that the electrostatic capacitance density is obtained in each of Examples and Comparative Examples by obtaining a sum of the electrostatic capacitance of the laminated capacitors formed and by dividing the same with the area of the circuit substrate. In other words, the electrostatic density represents the electrostatic capacitance per unit area of the circuit substrate.

Thus, in the circuit substrate of Examples 18 and 19, it is possible to provide a capacitor of large electrostatic capacitance inside the circuit substrate, while this also means that the size of the circuit substrate of Examples 18 and 19 can be reduced as compared with the circuit substrate of Comparative Examples. For example, in the case the substrate size of Example 5 is defined as one as shown in FIG. 34, the circuit substrate of Comparative Example 4 or 6 has a size of 0.6 or 0.8, while the circuit substrates of Examples 18 and 19 have a relative size of 0.3.

Here, it should be noted that the specific dielectric constant and dielectric loss of the dielectric layer forming the capacitor is measured similarly to the case of the dielectric layer for the filter explained before.

SIXTH EMBODIMENT

Figure 35:
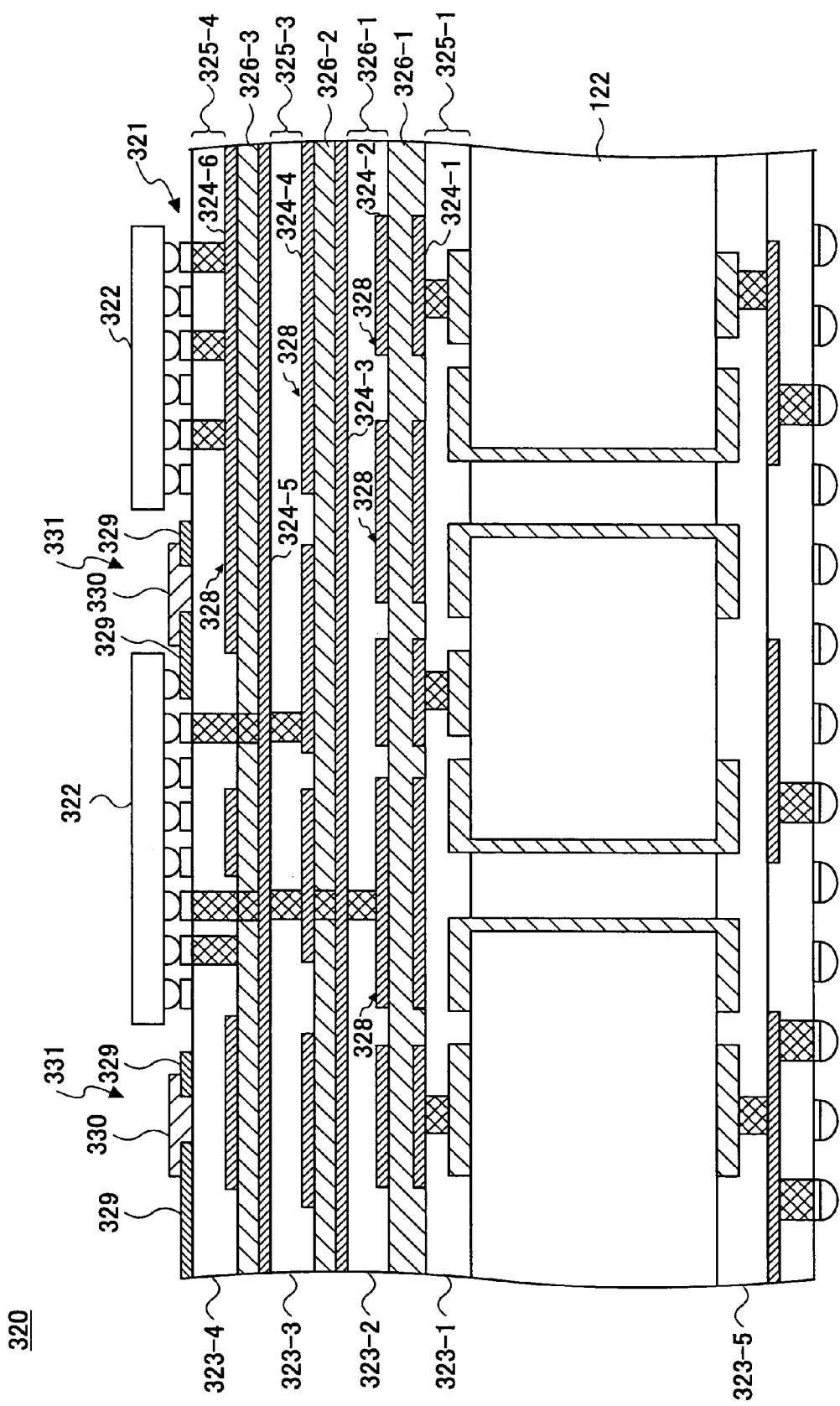
FIG. 35 is a cross-sectional view showing an electron device according to a sixth embodiment of the present invention.

FIG. 35 is a cross-sectional diagram showing the general construction of an electron device 320 according to a sixth embodiment of the present invention.

Referring to FIG. 35, the electron device 320 of the present embodiment includes a circuit substrate 321, an LSI 322 provided on the surface of the circuit substrate 321, and the like.

Referring to FIG. 35, the circuit substrate 321 includes a base substrate 322, an interconnection layer 325 provided on the base substrate 322 and formed of an interlayer insulation film 323 and a conductor layer 324, a capacitor 328 formed of a dielectric layer 326 sandwiched by the conductor layers 324, a resistance element 331 formed of a resistance film 330 formed between electrode layers 329 on the surface of the circuit substrate 321, and the like.

It should be noted that the circuit substrate 321 is the one described in any of the first embodiment or Examples 18-21, and thus, has a preferable feature of reduced loss at high frequencies and increased capacitance for the capacitor. With this, it is possible to reduce the number of the passive components mounted on the surface of the circuit substrate 321 and the circuit substrate 321 can be miniaturized.

Associated with this, it becomes possible to dispose the active components such as LSI 322 with reduced separation, and the time needed for transmission of signals is reduced. Thereby, signal delay at high frequencies is suppressed effectively, and further high-speed operation becomes possible for the electron device 320.

As it will become clear from the foregoing explanation, the present invention can form interlayer insulation film of excellent characteristics by forming the same by an AD process at the ordinary temperature and can reduce the specific resistance of a conductor layer by forming the same by a plating process, sputtering process, and the like.

Thus, the present invention provides the a circuit substrate, passive component, electron device and a fabrication process of the circuit substrate wherein the specific resistance is reduced and simultaneously the dielectric loss is reduced at a high frequency region.

Further, the present invention is not limited to the embodiments described heretofore, but various variations and modifications may be made without departing form the-scope of the invention.

What is claimed is:

1. A method of fabricating a circuit substrate, said circuit substrate having any of a passive element and an interconnection pattern, said passive element comprising at least one of a dielectric film, a resistance film and a conductor film, said method comprising a film forming step, said film forming step forming at least one of said dielectric film, said resistance film and said conductor film by generating and ejecting dry aerosol consisting essentially of a fine solid particle material together with a carrier gas, said dry aerosol being ejected into a reduced pressure environment of a pressure lower than a pressure in an aerosol generator generating said dry aerosol, with a speed of 200-400 m/second such that said fine solid particle material causes impact activation upon impact upon said circuit substrate, said film forming step for forming at least one of said dielectric film, said resistance film and said conductor film being conducted by generating and ejecting dry aerosol of a fine and brittle solid particle material together with said carrier gas, said fine and brittle solid particle material being selected from one or more of the group consisting of: $TiO_2$, MgO, $SiO_2$, AlN, $Al_2O_3$, $PbTiO_3$, $PbZrO_3$, $Pb(Zr_{1-x}Ti_x)O_3$ ($0 \leq x \leq 1$), $(Pb_{1-y}La_y)(Zr_{1-x}Ti_x)O_3$ ($0 \leq x$, $y \leq 1$), $Pb(Mg_{1/3}Nb_{2/3})O_3$, $Pb(Ni_{1/3}Nb_{2/3})O_3$, $Pb(Zn_{1/3}Nb_{2/3})O_3$, $BaTiO_3$, $BaTi_4O_9$, $Ba_2Ti_9O_{20}$, $Ba(Zn_{1/3}Ta_{2/3})O_3$, $Ba(Zn_{1/3}Nb_{2/3})O_3$, $Ba(Mg_{1/3}Ta_{2/3})O_3$, $Ba(Mg_{1/3}Ta_{2/3})O_3$, $Ba(Co_{1/3}Ta_{2/3})O_3$, $Ba(Co_{1/3}Nb_{2/3})O_3$, $Ba(Ni_{1/3}Ta_{2/3})O_3$, $Ba(Zr_{1-x}Ti_x)O_3$, and $(Ba_{1-x}Sr_x)TiO_3$, said step of generating said dry aerosol of said fine solid particle material including a step of heating a powder of said fine solid particle material.

2. The method as claimed in claim 1, wherein said circuit substrate includes a base substrate and an insulation layer laminated on said base substrate, at least one of said base substrate and said insulation layer comprises a resin material.

3. The method as claimed in claim 1, wherein said carrier gas comprises at least one of a helium gas, a neon gas, an argon gas and a nitrogen gas.

4. The method as claimed in claim 1, wherein said fine particle material comprises fine particles having an average diameter of 10 nm-1 μm.

5. The method as claimed in claim 1, wherein said resin material comprises at least one of an epoxy resin, a polyimide resin, a polyester resin, a fluorocarbon copolymer, and a fiber glass.

6. The method as claimed in claim 1, further comprising a planarizing step for planarizing a surface of any of said dielectric film, resistance film and conductor film after said film forming step.

7. A fabrication method of a circuit substrate in which an interlayer insulation film and a conductor layer are laminated, comprising the steps of:

forming said interlayer insulation film by generating and spraying dry aerosol consisting essentially of a fine and brittle solid particle material together with a carrier gas, said dry aerosol being ejected into a reduced pressure environment of a pressure lower than a pressure in an aerosol generator generating said dry aerosol, with a speed of 200-400 m/second such that said fine solid particle material causes impact activation upon impact upon said circuit substrate; and forming said conductor layer while depositing a metal or an alloy thereon, said fine and brittle solid particle material being selected from one or more of the group consisting of: $TiO_2$, MgO, $SiO_2$, AlN, $Al_2O_3$, $PbTiO_3$, $PbZrO_3$, $Pb(Zr_{1-x}Ti_x)O_3$ ($0 \leq x \leq 1$), $(Pb_{1-y}La_y)(Zr_{1-x}Ti_x)O_3$ ($0 \leq x$, $y \leq 1$), $Pb(Mg_{1/3}Nb_{2/3})O_3$, $Pb(Ni_{1/3}Nb_{2/3})O_3$, $Pb(Zn_{1/3}Nb_{2/3})$ $O_3$, $BaTiO_3$, $BaTi_4O_9$, $Ba_2Ti_9O_{20}$, $Ba(Zn_{1/3}Ta_{2/3})O_3$, $Ba(Zn_{1/3}Nb_{2/3})O_3$, $Ba(Mg_{1/3}Ta_{2/3})O_3$, $Ba(Mg_{1/3}Ta_{2/3})O_3$, $Ba(Co_{1/3}Ta_{2/3})O_3$, $Ba(Co_{1/3}Nb_{2/3}O_3$, $Ba(Ni_{1/3}Ta_{2/3})O_3$, $Ba(Zr_{1-x}Ti_x)O_3$, and $(Ba_{1-x}Sr_x)TiO_3$, said step of generating said dry aerosol of said fine solid particle material including a step of heating a powder of said fine solid particle material.

8. The method as claimed in claim 7, wherein said step of forming said conductor layer is conducted by using any of a non-electrolytic plating process, an electrolytic plating process, a sputtering process, a vacuum evaporation deposition process and a CVD process.

9. The method as claimed in claim 7, further comprising the step of forming an connection hole in said interlayer insulation film by using a hydrofluoric acid while masking said interlayer insulation film.

10. A method of fabricating a circuit substrate, said circuit substrate having any of a passive element and an interconnection pattern, said passive element comprising at least one of a dielectric film, a resistance film and a conductor film, said method comprising a film forming step, said film forming step forming at least one of said dielectric film, said resistance film and said conductor film by forming a resist pattern on said circuit substrate and spraying dry aerosol while using said resist pattern as a mask, wherein said step of spraying dry aerosol comprises generating and ejecting dry aerosol consisting essentially of a fine solid particle material together with a carrier gas, said dry aerosol being ejected into a reduced pressure environment of a pressure lower than a pressure in an aerosol generator generating said dry aerosol, with a speed of 200-400 m/second such that said fine solid particle material causes impact activation upon impact upon said circuit substrate, said step of generating said dry aerosol of said fine solid particle material including a step of heating a powder of said fine solid particle material.

11. A method for fabricating a circuit substrate having at least a capacitor, said method comprising the steps of:

forming, on a resin insulation film, a lower electrode pattern;

forming a dielectric film on said lower electrode pattern; and forming an upper electrode pattern on said dielectric film, said step of forming said dielectric film comprising generating and ejecting dry aerosol of fine ceramic particles together with a carrier gas, said dry aerosol being ejected into a reduced pressure environment of a pressure lower than a pressure in an aerosol generator generating said dry aerosol, with a speed of 200-400 m/second such that said fine ceramic particles cause impact activation upon impact to said lower electrode, said method further comprising the step of forming a resist pattern on said lower electrode pattern so as to expose a part of said lower electrode pattern, and wherein said step of ejecting said dry aerosol is conducted while using said resist pattern as a mask, said step of generating said dry aerosol of said fine solid particle material including a step of heating a powder of said fine solid particle material.

* * * * *

UNITED STATES PATENT AND TRADEMARK OFFICE
CERTIFICATE OF CORRECTION

PATENT NO. : 7,579,251 B2 Page 1 of 1
APPLICATION NO. : 10/820114
DATED : August 25, 2009
INVENTOR(S) : Imanaka et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 171 days.

Signed and Sealed this

Fourteenth Day of December, 2010

David J. Kappos
*Director of the United States Patent and Trademark Office*